(12) United States Patent
Harada et al.

(10) Patent No.: US 7,537,880 B2
(45) Date of Patent: *May 26, 2009

(54) POLYMER, RESIST COMPOSITION, AND PATTERNING PROCESS

(75) Inventors: Yuji Harada, Joetsu (JP); Jun Hatakeyama, Joetsu (JP); Takao Yoshihara, Joetsu (JP); Wataru Kusaki, Joetsu (JP); Tomohiro Kobayashi, Joetsu (JP); Koji Hasegawa, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/905,763

(22) Filed: Oct. 3, 2007

(65) Prior Publication Data

US 2008/0118860 A1  May 22, 2008

(30) Foreign Application Priority Data

Oct. 4, 2006  (JP) .............................. 2006-272681

(51) Int. Cl.
*G03F 7/004* (2006.01)
*G03F 7/30* (2006.01)
*C08F 24/00* (2006.01)

(52) U.S. Cl. .................... 430/270.1; 430/326; 430/330; 430/905; 430/907; 430/910; 526/284

(58) Field of Classification Search .............. 430/270.1, 430/326, 330, 905, 910, 907; 52/284; 526/284
See application file for complete search history.

(56) References Cited

U.S. PATENT DOCUMENTS 6,004,724 A    12/1999  Yamato et al.
6,261,738 B1   7/2001   Asakura et al.
6,517,994 B2 * 2/2003   Watanabe ................. 430/270.1
6,916,591 B2   7/2005   Ohsawa et al.
2006/0008736 A1 1/2006  Kanda et al.
2006/0210922 A1 * 9/2006 Nishiyama ............... 430/270.1
2007/0160929 A1 * 7/2007 Hasegawa et al. ........ 430/270.1

FOREIGN PATENT DOCUMENTS

| JP | 9-095479 A   | 4/1997  |
|----|--------------|---------|
| JP | 9-230588 A   | 9/1997  |
| JP | 9-301948 A   | 11/1997 |
| JP | 2906999 B2   | 4/1999  |
| JP | 2000-314956 A| 11/2000 |
| JP | 2002-99090 A | 4/2002  |
| JP | 2005-264131 A| 9/2005  |
| JP | 2006-48029 A | 2/2006  |

OTHER PUBLICATIONS

Proc. SPIE, vol. 4690, xxix, 2002, B. J. Lin, Semiconductor Foundry, Lithography, and Partners.
Proc. SPIE vol. 5040, p724, 2003, Owa et al., Immersion lithography; its potential performance and issues.
2nd Immersion Workshop, Jul. 11, 2003, Resist and cover material investigation for immersion lithography, Taku Hirayama, Tokyo Ohka Kogyo Co., Ltd.
J. Photopolymer SCI. and Tech., 8, No. 1, 43-44, 45-46 (1995), The Technical Association of Photopolymers, Japan.
J Photopolymer SCI. and Tech., 9, No. 1, 29-30 (1996), The Technical Association of Photopolymers, Japan.

* cited by examiner

*Primary Examiner*—John S Chu
(74) *Attorney, Agent, or Firm*—Birch, Stewart, Kolasch & Birch, LLP

(57) ABSTRACT

To a resist composition, an alkali-soluble polymer having fluorinated ester-containing lactone units incorporated therein is included as an additive. The resist composition forms a resist film having a reduced contact angle after development. The resist film prevents water penetration during immersion lithography.

10 Claims, No Drawings

POLYMER, RESIST COMPOSITION, AND PATTERNING PROCESS

CROSS-REFERENCE TO RELATED APPLICATION

This non-provisional application claims priority under 35 U.S.C. §119(a) on Patent Application No. 2006-272681 filed in Japan on Oct. 4, 2006, the entire contents of which are hereby incorporated by reference.

TECHNICAL FIELD

This invention generally relates to resist compositions, specifically chemically amplified positive resist compositions for use in the lithography technology for the microfabrication of semiconductor devices or the like, especially the immersion photolithography utilizing an ArF excimer laser of wavelength 193 nm as the light source and interposing water between a projection lens and a wafer. It also relates to polymers useful as the base polymer in such resist compositions, and a patterning process.

BACKGROUND ART

In the recent drive for higher integration and operating speeds in LSI devices, the pattern rule is made drastically finer. The background supporting such a rapid advance is a reduced wavelength of the light source for exposure. The change-over from i-line (365 nm) of a mercury lamp to shorter wavelength KrF excimer laser (248 nm) enabled mass-scale production of dynamic random access memories (DRAM) with an integration degree of 64 MB (processing feature size $\leq 0.25$ μm). To establish the micropatterning technology necessary for the fabrication of DRAM with an integration degree of 256 MB and 1 GB or more, the lithography using ArF excimer laser (193 nm) is under active investigation. The ArF excimer laser lithography, combined with a high NA lens (NA$\geq$0.9), is considered to comply with 65-nm node devices. For the fabrication of next 45-nm node devices, the $F_2$ lithography of 157 nm wavelength became a candidate. However, because of many problems including a cost and a shortage of resist performance, the employment of $F_2$ lithography was postponed. ArF immersion lithography was proposed as a substitute for the $F_2$ lithography. Efforts have been made for the early introduction of ArF immersion lithography (see Proc. SPIE, Vol. 4690, xxix, 2002).

In the ArF immersion lithography, the space between the projection lens and the wafer is filled with water and ArF excimer laser is irradiated through the water. Since water has a refractive index of 1.44 at 193 nm, pattern formation is possible even using a lens with NA of 1.0 or greater. Theoretically, it is possible to increase the NA to 1.44. The resolution is improved by an increment of NA. A combination of a lens having NA of at least 1.2 with ultra-high resolution technology suggests a way to the 45-nm node (see Proc. SPIE, Vol. 5040, p 724, 2003).

Several problems arise when a resist film is exposed in the presence of water. For example, profile changes occur because the acid once generated from a photoacid generator and the basic compound added to the resist can be partially dissolved in water. The pattern collapses due to swelling. It is also pointed out that water droplets remaining on the resist film, though in a minute volume, can penetrate into the resist film to generate defects. To overcome these drawbacks of the ArF immersion lithography, it was proposed to provide a protective coating between the resist film and water using a fluorinated material (see the 2nd Immersion Workshop, Resist and Cover Material Investigation for Immersion Lithography, 2003).

Among fluorinated protective coating materials, protective coatings made of perfluoroalkyl compounds use fluorocarbons as the solvent for controlling a coating thickness and for stripping the protective film after exposure. As is well known, the use of fluorocarbons is a consideration in view of environmental protection. In addition, special units must be added for the coating and stripping of protective film. Fluorocarbons raise serious problems on practical use.

One means proposed for mitigating practical drawbacks of the above-mentioned protective film is a protective coating of the type which is soluble in alkaline developer (JP-A 2005-264131). The alkali-soluble protective film is epoch-making in that it eliminates a need for a special stripping unit because it can be stripped off at the same time as the development of a photoresist film. However, the solvent necessary for coating of protective film material leaves a room for improvement on a practical level because those solvents in which the photoresist layer is dissolved should be avoided, and a special unit for coating of a protective film is needed.

For preventing water from penetrating into the resist film, it is proposed in JP-A 2006-48029 to add an alkali-soluble, hydrophobic compound to the resist material. This method is advantageous over the use of a resist protective film because steps of forming and stripping the protective film are unnecessary. However, when a hydrophobic compound is added to the resist material, the resulting resist film on its surface has an increased contact angle, especially after development, tending to produce defects known as "blob defects." It is thus desired to have an additive to a resist material which can reduce the contact angle on the resist surface after development while maintaining a high water-barrier property.

When EB lithography is carried out for mask image writing or the like, the resist changes its sensitivity due to evaporation of the acid generated during image writing, evaporation of vinyl ether produced by deprotection of acetal protective groups, or the like, as discussed in JP-A 2002-99090. It is thus desired to have an additive for suppressing such resist sensitivity variation.

DISCLOSURE OF THE INVENTION

An object of the invention is to provide an alkali-soluble polymer comprising lactone units, a resist composition comprising the polymer, and a patterning process using the resist composition. The resist composition has improved process adaptability in that the profile change between dry lithography and immersion lithography is minimized.

The inventors have found that where an alkali-soluble polymer having lactone units incorporated therein is added to a resist composition, the resulting resist film on its surface has a reduced contact angle after development while maintaining a large receding contact angle. Then the alkali-soluble polymer having lactone units is useful as the additive to immersion lithography photoresist compositions.

Accordingly, the present invention provides a polymer, a resist composition, and a patterning process, as defined below.

In one aspect, the invention provides a polymer comprising recurring units having the general formulae (1a), (1b), and (1c) and having a weight average molecular weight of 1,000 to 500,000.

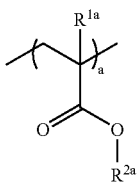
(1a)

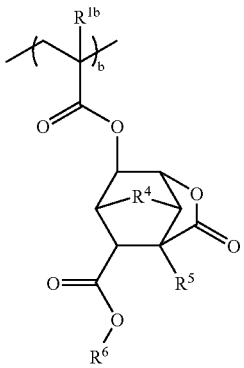
(1b)

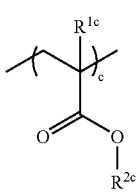
(1c)

Herein $R^{1a}$, $R^{1b}$ and $R^{1c}$ are each independently hydrogen, fluorine or a straight or branched $C_1$-$C_4$ alkyl or fluoroalkyl group, $R^{2a}$ is hydrogen, —$R^3$—$CO_2R^7$, or —$R^3$—$OR^7$, $R^{2c}$ is a straight, branched or cyclic $C_2$-$C_{20}$ fluoroalkyl group, $R^3$ is a divalent organic group which may contain fluorine, $R^4$ is a methylene group or oxygen atom, $R^5$ is hydrogen, methyl or trifluoromethyl, $R^6$ is a straight, branched or cyclic $C_2$-$C_{20}$ fluoroalkyl group, $R^7$ is hydrogen, a straight, branched or cyclic $C_1$-$C_{20}$ alkyl or fluoroalkyl group, acid labile group or adhesive group, the subscripts "a," "b" and "c" are numbers satisfying $0 \leq a < 1$, $0 < b < 1$, $0 \leq c < 1$, and $0 < a+b+c \leq 1$. In a preferred embodiment, $R^7$ is hydrogen.

In another aspect, the invention provides a resist composition comprising the polymer defined above as an additive. Preferably the resist composition is a chemically amplified positive resist composition comprising in addition to the additive polymer, (A) a polymer which becomes soluble in an alkaline developer under the action of an acid, (B) a compound which generates an acid upon exposure to high-energy radiation, (C) an organic solvent, and optionally, (D) a basic compound and/or (E) a dissolution inhibitor.

In a further aspect, the invention provides a pattern forming process comprising the steps of (1) applying the resist composition defined above onto a substrate to form a coating, (2) heat treating the coating and exposing it to high-energy radiation through a photomask, and (3) developing the exposed coating with a developer;

a pattern forming process comprising the steps of (1) applying the resist composition defined above onto a substrate to form a photoresist film, (2) forming a protective coating on the photoresist film, (3) heat treating the coated substrate, and exposing it to high-energy radiation, typically high-energy radiation having a wavelength of 180 to 250 nm, through a photomask while keeping water between a projection lens and the coated substrate, and (4) stripping the protective coating and developing the resist film simultaneously using a developer; or a pattern forming process comprising the steps of (1) applying the resist composition defined above onto a mask blank substrate to form a coating, (2) heat treating the coating and irradiating it in vacuum with an electron beam, and (3) developing the coating with a developer.

BENEFITS OF THE INVENTION

Since an alkali-soluble polymer having fluorinated ester-containing lactone units incorporated therein is included as an additive, the resist composition of the invention forms a resist film which on its surface has a reduced contact angle after development. The invention is effective for preventing water from penetrating into the resist film during immersion exposure. The immersion lithography can be carried out with best results.

DESCRIPTION OF THE PREFERRED EMBODIMENTS

The terms "a" and "an" herein do not denote a limitation of quantity, but rather denote the presence of at least one of the referenced item.

As used herein, the notation ($C_n$—$C_m$) means a group containing from n to m carbon atoms per group.

Polymer

The polymer or high molecular weight compound of the invention comprises recurring units having the general formulae (1a), (1b), and (1c) in combination.

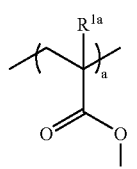
(1a)

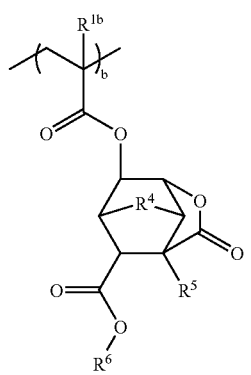
(1b)

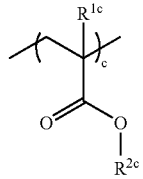
(1c)

Herein $R^{1a}$, $R^{1b}$ and $R^{1c}$ are each independently a hydrogen atom, a fluorine atom or a straight or branched $C_1$-$C_4$ alkyl or fluoroalkyl group. $R^{2a}$ is a hydrogen atom, —$R^3$—$CO_2R^7$, or —$R^3$—$OR^7$. $R^{2c}$ is a straight, branched or cyclic $C_2$-$C_{20}$ fluoroalkyl group. $R^3$ is a divalent organic group which may contain fluorine. $R^4$ is a methylene group or an oxygen atom. $R^5$ is a hydrogen atom, methyl group or trifluoromethyl group. $R^6$ is a straight, branched or cyclic $C_2$-$C_{20}$ fluoroalkyl group. $R^7$ is a hydrogen atom, a straight, branched or cyclic $C_1$-$C_{20}$ alkyl or fluoroalkyl group, an acid labile group, or an adhesive group. The subscripts "a," "b" and "c" are numbers satisfying $0 \leq a<1$, $0<b<1$, $0 \leq c<1$, and $0<a+b+c \leq 1$.

In formulae (1a), (1b), and (1c), suitable straight or branched $C_1$-$C_4$ alkyl and fluoroalkyl groups represented by $R^{1a}$, $R^{1b}$ and $R^{1c}$ include, but are not limited to, methyl, ethyl, n-propyl, isopropyl, n-butyl, sec-butyl, tert-butyl, trifluoromethyl, 2,2,2-trifluoroethyl, 3,3,3-trifluoropropyl, and 1,1,2,2,3,3,3-heptafluoropropyl.

In formula (1c), examples of straight, branched or cyclic $C_2$-$C_{20}$, preferably $C_2$-$C_{15}$, fluoroalkyl groups represented by $R^{2c}$ include, but are not limited to, 2,2,2-trifluoroethyl, 3,3,3-trifluoropropyl, 1H,1H,3H-tetrafluoropropyl, 1,1,1,3,3,3-hexafluoroisopropyl, 1H,1H,5H-octafluoropentyl, 1H,1H,7H-dodecafluoroheptyl, 2-(perfluorobutyl)ethyl, 2-(perfluorohexyl)ethyl, 2-(perfluorooctyl)ethyl, and 2-(perfluorodecyl)ethyl.

In formula (1a), $R^3$ in $R^{2a}$ is a divalent organic group which may contain fluorine. The organic group is preferably a straight, branched or cyclic $C_1$-$C_{20}$, preferably $C_1$-$C_{15}$, alkylene group which may contain an oxygen atom.

In formula (1a), $R^7$ in $R^{2a}$ is a hydrogen atom, a straight, branched or cyclic $C_1$-$C_{20}$, preferably $C_1$-$C_{15}$, alkyl or fluoroalkyl group, an acid labile group, or an adhesive group. Examples of the straight, branched or cyclic $C_1$-$C_{20}$ alkyl group represented by $R^7$ include, but are not limited to, methyl, ethyl, propyl, isopropyl, n-butyl, sec-butyl, tert-butyl, tert-amyl, n-pentyl, n-hexyl, cyclopentyl, cyclohexyl, and bicyclo[2.2.1]heptyl. Examples of the fluoroalkyl group include, but are not limited to, 2,2,2-trifluoroethyl, 3,3,3-trifluoropropyl, 1H,1H,3H-tetrafluoropropyl, 1,1,1,3,3,3-hexafluoroisopropyl, 1H,1H,5H-octafluoropentyl, 1H,1H,7H-dodecafluoroheptyl, 2-(perfluorobutyl)ethyl, 2-(perfluorohexyl)ethyl, 2-(perfluorooctyl)ethyl, and 2-(perfluorodecyl)ethyl.

The acid labile groups represented by $R^7$ may be selected from a variety of such groups. Examples of the acid labile group are groups of the following general formulae (L1) to (L4), tertiary alkyl groups of 4 to 20 carbon atoms, preferably 4 to 15 carbon atoms, trialkylsilyl groups in which each alkyl moiety has 1 to 6 carbon atoms, and oxoalkyl groups of 4 to 20 carbon atoms.

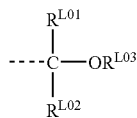
(L1)

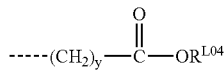
(L2)

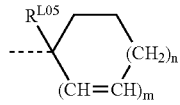
(L3)

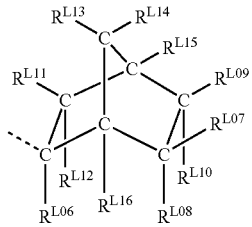
(L4)

The broken line indicates a valence bond.

In formula (L1), $R^{L01}$ and $R^{L02}$ are hydrogen or straight, branched or cyclic alkyl groups of 1 to 18 carbon atoms, preferably 1 to 10 carbon atoms. Examples include hydrogen, methyl, ethyl, propyl, isopropyl, n-butyl, sec-butyl, tert-butyl, cyclopentyl, cyclohexyl, 2-ethylhexyl, n-octyl, and adamantyl. $R^{L03}$ is a monovalent hydrocarbon group of 1 to 18 carbon atoms, preferably 1 to 10 carbon atoms, which may contain a hetero atom such as oxygen, examples of which include unsubstituted straight, branched or cyclic alkyl groups and straight, branched or cyclic alkyl groups in which some hydrogen atoms are replaced by hydroxyl, alkoxy, oxo, amino, alkylamino or the like. Examples of the straight, branched or cyclic alkyl groups are as exemplified above for $R^{L01}$ and $R^{L02}$, and examples of the substituted alkyl groups are shown below.

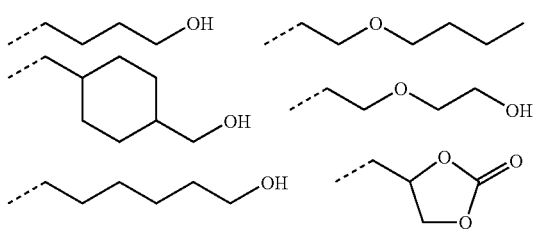

A pair of $R^{L01}$ and $R^{L02}$, $R^{L01}$ and $R^{L03}$ or $R^{L02}$ and $R^{L03}$ may bond together to form a ring with the carbon and oxygen atoms to which they are attached. Each of $R^{L01}$, $R^{L02}$ and $R^{L03}$ is a straight or branched alkylene group of 1 to 18 carbon atoms, preferably 1 to 10 carbon atoms when they form a ring.

In formula (L2), $R^{L04}$ is a tertiary alkyl group of 4 to 20 carbon atoms, preferably 4 to 15 carbon atoms, a trialkylsilyl group in which each alkyl moiety has 1 to 6 carbon atoms, an oxoalkyl group of 4 to 20 carbon atoms, or a group of formula (L1). Exemplary tertiary alkyl groups are tert-butyl, tert-amyl, 1,1-diethylpropyl, 2-cyclopentylpropan-2-yl, 2-cyclohexylpropan-2-yl, 2-(bicyclo[2.2.1]heptan-2-yl)propan-2-yl, 2-(adamantan-1-yl)propan-2-yl, 1-ethylcyclopentyl, 1-butylcyclopentyl, 1-ethylcyclohexyl, 1-butylcyclohexyl, 1-ethyl-2-cyclopentenyl, 1-ethyl-2-cyclohexenyl, 2-methyl-2-adamantyl, and 2-ethyl-2-adamantyl. Exemplary trialkylsilyl groups are trimethylsilyl, triethylsilyl, and dimethyl-tert-butylsilyl. Exemplary oxoalkyl groups are 3-oxocyclohexyl, 4-methyl-2-oxooxan-4-yl, and 5-methyl-2-oxooxolan-5-yl. In formula (L2), y is an integer of 0 to 6.

In formula (L3), $R^{L05}$ is a substituted or unsubstituted, $C_1$-$C_{10}$ straight, branched or cyclic alkyl group or a substituted or unsubstituted $C_6$-$C_{20}$ aryl group. Examples of the substituted or unsubstituted alkyl groups include straight, branched or cyclic ones such as methyl, ethyl, propyl, isopropyl, n-butyl, sec-butyl, tert-butyl, tert-amyl, n-pentyl, n-hexyl, cyclopentyl, cyclohexyl and bicyclo[2.2.1]heptyl; substituted forms of the foregoing in which some hydrogen atoms are replaced by hydroxyl, alkoxy, carboxy, alkoxycarbonyl, oxo, amino, alkylamino, cyano, mercapto, alkylthio, sulfo or other groups; and substituted forms of the foregoing in which some of the methylene groups are replaced by oxygen or sulfur atoms. Exemplary substituted or unsubstituted aryl groups are phenyl, methylphenyl, naphthyl, anthryl, phenanthryl, and pyrenyl. In formula (L3), m is 0 or 1, n is 0, 1, 2 or 3, and 2m+n is equal to 2 or 3.

In formula (L4), $R^{L06}$ is a substituted or unsubstituted, $C_1$-$C_{10}$ straight, branched or cyclic alkyl group or a substituted or unsubstituted $C_6$-$C_{20}$ aryl group. Examples of these groups are the same as exemplified for $R^{L05}$. $R^{L07}$ to $R^{L16}$ independently represent hydrogen or monovalent $C_1$-$C_{15}$ hydrocarbon groups. Exemplary hydrocarbon groups are straight, branched or cyclic alkyl groups such as methyl, ethyl, propyl, isopropyl, n-butyl, sec-butyl, tert-butyl, tert-amyl, n-pentyl, n-hexyl, n-octyl, n-nonyl, n-decyl, cyclopentyl, cyclohexyl, cyclopentylmethyl, cyclopentylethyl, cyclopentylbutyl, cyclohexylmethyl, cyclohexylethyl and cyclohexylbutyl, and substituted forms of the foregoing in which some hydrogen atoms are replaced by hydroxyl, alkoxy, carboxy, alkoxycarbonyl, oxo, amino, alkylamino, cyano, mercapto, alkylthio, sulfo or other groups. Alternatively, $R^{L07}$ to $R^{L16}$ may bond together to form a ring (for example, a pair of $R^{L07}$ and $R^{L08}$, $R^{L07}$ and $R^{L09}$, $R^{L08}$ and $R^{L10}$, $R^{L09}$ and $R^{L10}$, $R^{L11}$ and $R^{L12}$, $R^{L13}$ and $R^{L14}$, or a similar pair form a ring). Each of $R^{L07}$ to $R^{L16}$ represents a divalent $C_1$-$C_{15}$ hydrocarbon group when they form a ring, examples of which are the ones exemplified above for the monovalent hydrocarbon groups, with one hydrogen atom being eliminated. Two of $R^{L07}$ to $R^{L16}$ which are attached to vicinal carbon atoms (for example, a pair of $R^{L07}$ and $R^{L09}$, $R^{L09}$ and $R^{L15}$, $R^{L13}$ and $R^{L15}$, or a similar pair) may bond together directly to form a double bond.

Of the acid labile groups of formula (L1), the straight and branched ones are exemplified by the following groups.

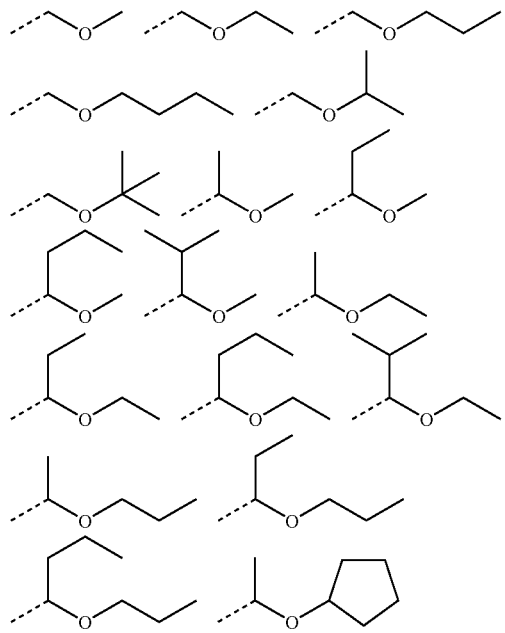

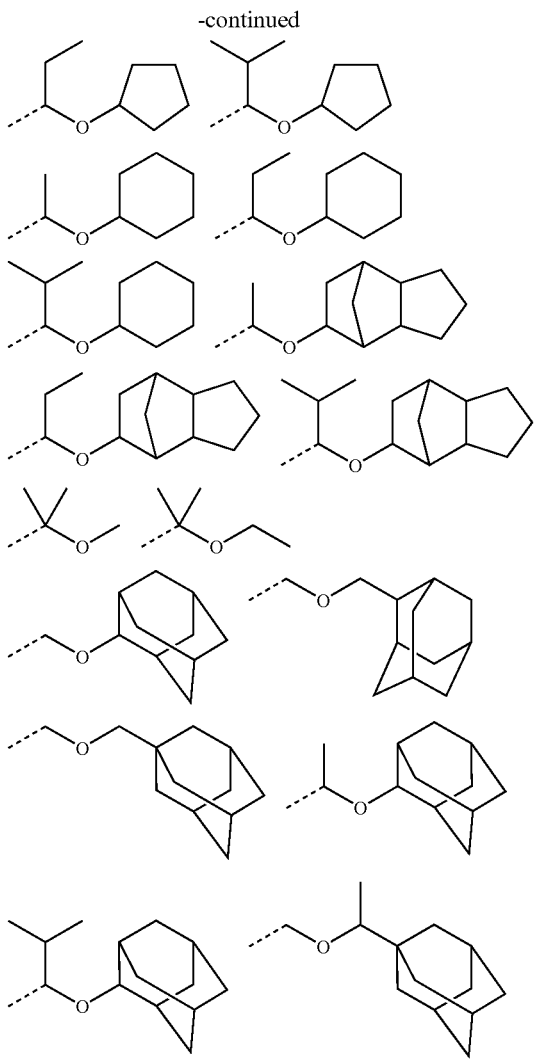

Of the acid labile groups of formula (L1), the cyclic ones are, for example, tetrahydrofuran-2-yl, 2-methyltetrahydrofuran-2-yl, tetrahydropyran-2-yl, and 2-methyltetrahydropyran-2-yl.

Examples of the acid labile groups of formula (L2) include tert-butoxycarbonyl, tert-butoxycarbonylmethyl, tert-amyloxycarbonyl, tert-amyloxycarbonylmethyl, 1,1-diethylpropyloxycarbonyl, 1,1-diethylpropyloxycarbonylmethyl, 1-ethylcyclopentyloxycarbonyl, 1-ethylcyclopentyloxycarbonylmethyl, 1-ethyl-2-cyclopentenyloxycarbonyl, 1-ethyl-2-cyclopentenyloxycarbonylmethyl, 1-ethoxyethoxycarbonylmethyl, 2-tetrahydropyranyloxycarbonylmethyl, and 2-tetrahydrofuranyloxycarbonylmethyl groups.

Examples of the acid labile groups of formula (L3) include 1-methylcyclopentyl, 1-ethylcyclopentyl, 1-n-propylcyclopentyl, 1-isopropylcyclopentyl, 1-n-butylcyclopentyl, 1-sec-butylcyclopentyl, 1-cyclohexylcyclopentyl, 1-(4-methoxy-n-butyl)cyclopentyl, 1-(bicyclo[2.2.1]heptan-2-yl)cyclopentyl, 1-(7-oxabicyclo[2.2.1]heptan-2-yl)cyclopentyl, 1-methylcyclohexyl, 1-ethylcyclohexyl, 3-methyl-1-cyclopenten-3-yl, 3-ethyl-1-cyclopenten-3-yl, 3-methyl-1-cyclohexen-3-yl, and 3-ethyl-1-cyclohexen-3-yl groups.

The acid labile groups of formula (L4) are preferably groups of the following formulae (L4-1) to (L4-4).

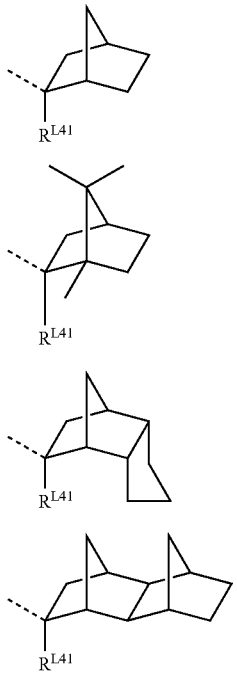

(L4-1)

(L4-2)

(L4-3)

(L4-4)

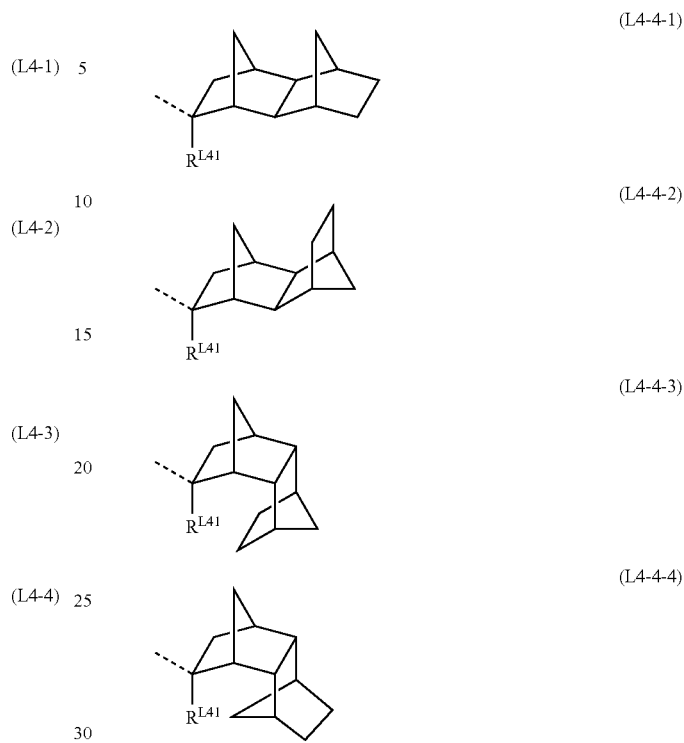

(L4-4-1)

(L4-4-2)

(L4-4-3)

(L4-4-4)

In formulae (L4-1) to (L4-4), the broken line indicates a bonding site and direction. $R^{L41}$ is each independently selected from monovalent hydrocarbon groups, typically straight, branched or cyclic $C_1$-$C_{10}$ alkyl groups, for example, methyl, ethyl, propyl, isopropyl, n-butyl, sec-butyl, tert-butyl, tert-amyl, n-pentyl, n-hexyl, cyclopentyl, and cyclohexyl.

For formulas (L4-1) to (L4-4), there can exist enantiomers and diastereomers. Each of formulae (L4-1) to (L4-4) collectively represents all such stereoisomers. Such stereoisomers may be used alone or in admixture.

For example, the general formula (L4-3) represents one or a mixture of two selected from groups having the following general formulas (L4-3-1) and (L4-3-2).

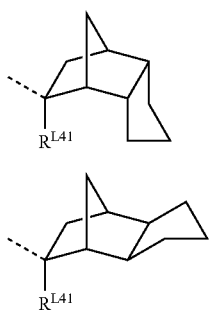

(L4-3-1)

(L4-3-2)

Herein $R^{L41}$ is as defined above.

Similarly, the general formula (L4-4) represents one or a mixture of two or more selected from groups having the following general formulas (L4-4-1) to (L4-4-4).

Herein $R^{L41}$ is as defined above.

Each of formulas (L4-1) to (L4-4), (L4-3-1) and (L4-3-2), and (L4-4-1) to (L4-4-4) collectively represents an enantiomer thereof and a mixture of enantiomers.

It is noted that in the above formulas (L4-1) to (L4-4), (L4-3-1) and (L4-3-2), and (L4-4-1) to (L4-4-4), the bond direction is on the exo side relative to the bicyclo[2.2.1] heptane ring, which ensures high reactivity for acid catalyzed elimination reaction (see JP-A 2000-336121). In preparing these monomers having a tertiary exo-alkyl group of bicyclo [2.2.1]heptane skeleton as a substituent group, there may be contained monomers substituted with an endo-alkyl group as represented by the following formulas (L4-1-endo) to (L4-4-endo). For good reactivity, an exo proportion of at least 50 mol % is preferred, with an exo proportion of at least 80 mol % being more preferred.

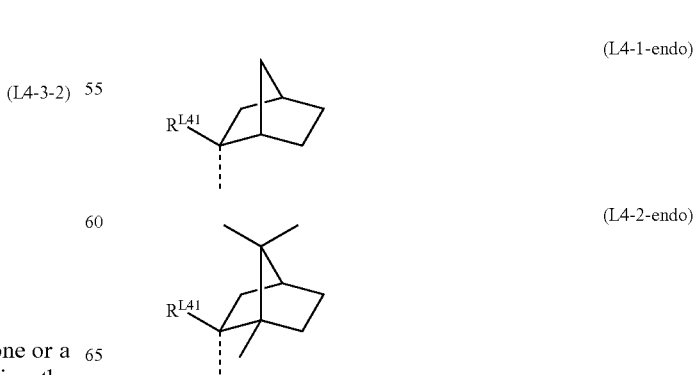

(L4-1-endo)

(L4-2-endo)

-continued (L4-3-endo)
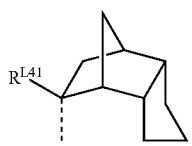

(L4-4-endo)
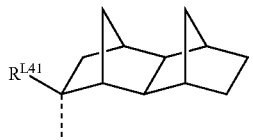

Herein $R^{L41}$ is as defined above.

Illustrative examples of the acid labile group of formula (L4) are given below

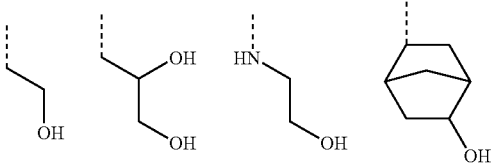

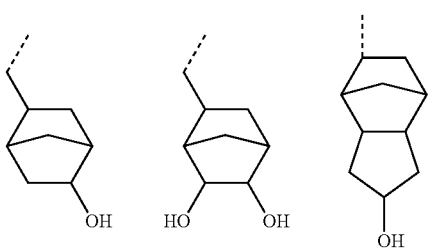

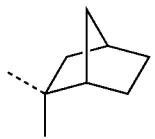 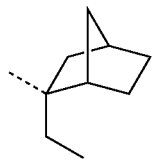 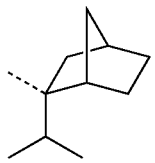

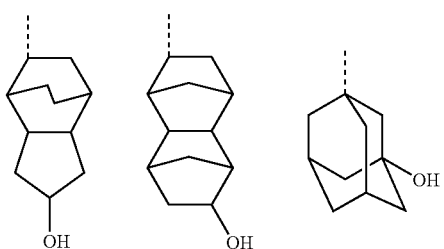

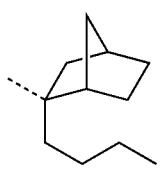 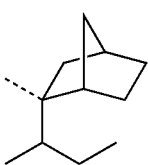 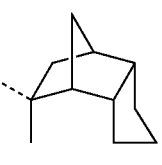

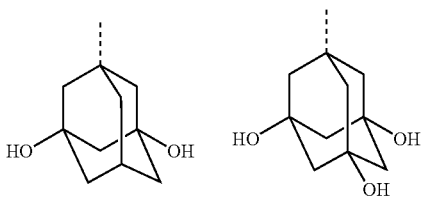

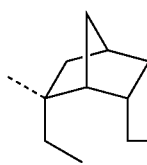 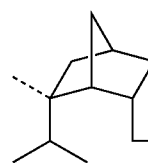 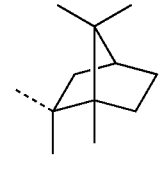

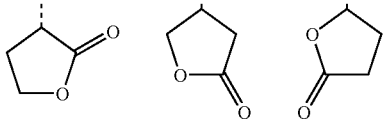

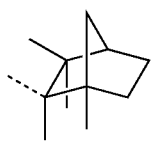 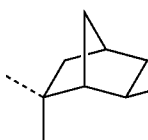 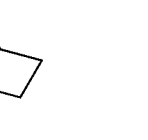

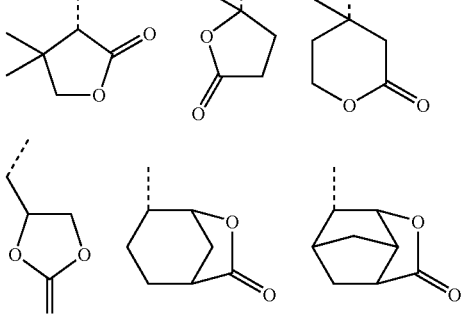

Examples of the tertiary $C_4$-$C_{20}$ alkyl, tri($C_1$-$C_6$-alkyl)silyl and $C_4$-$C_{20}$ oxoalkyl groups included in the acid labile groups represented by $R^7$ are as exemplified above for $R^{L04}$.

The adhesive group represented by $R^7$ may be selected from a variety of such groups and preferably, from the groups illustrated below.

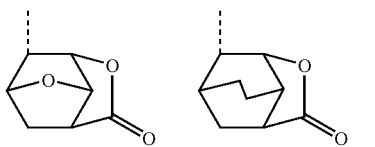

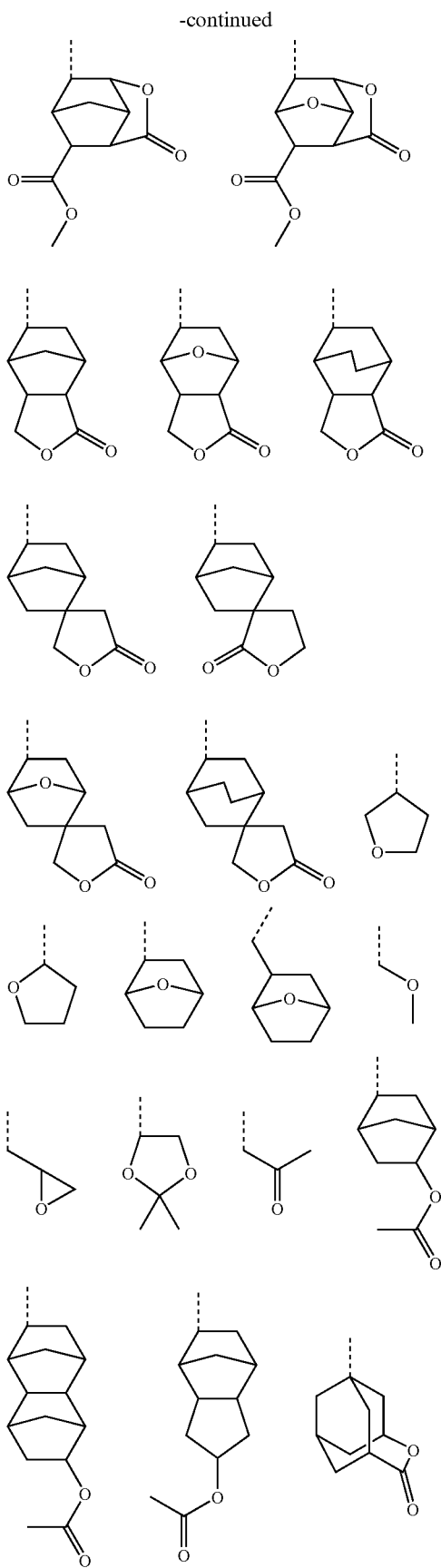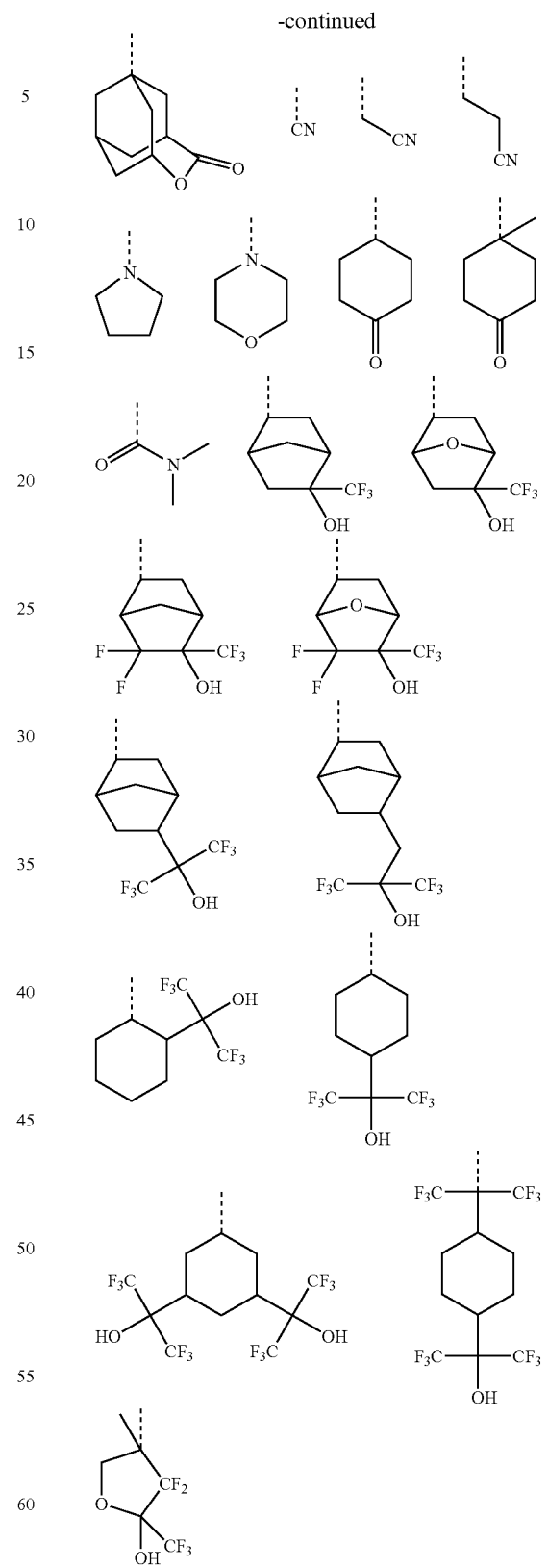
Herein, the broken line denotes a valence bond.
In formula (1a), examples of $R^{2a}$ other than hydrogen include those illustrated below, but are not limited thereto.

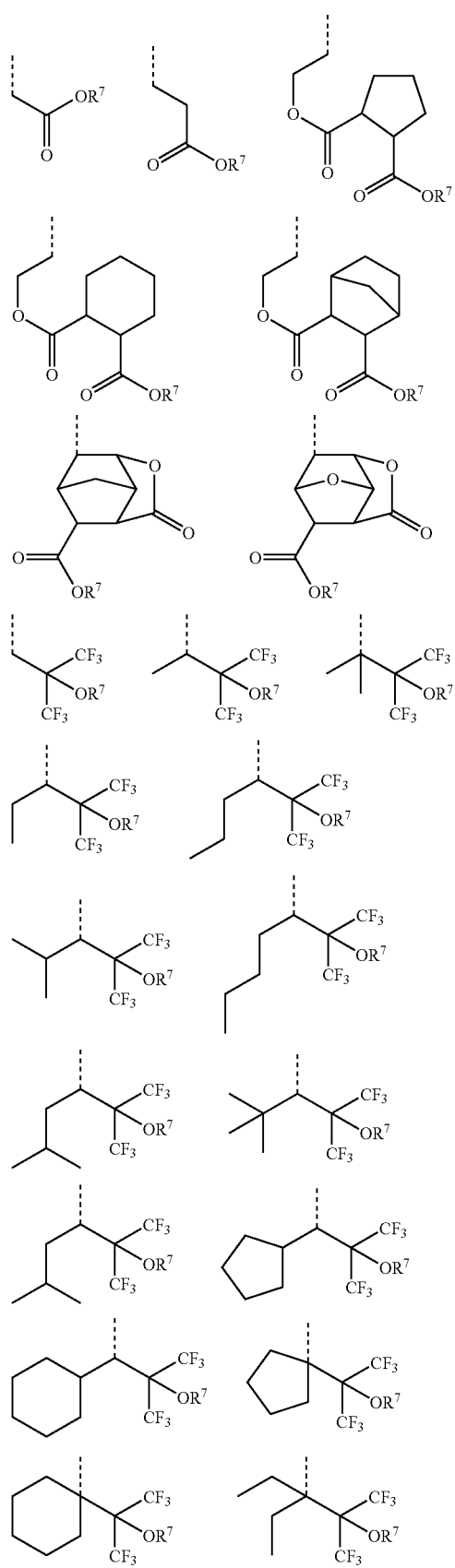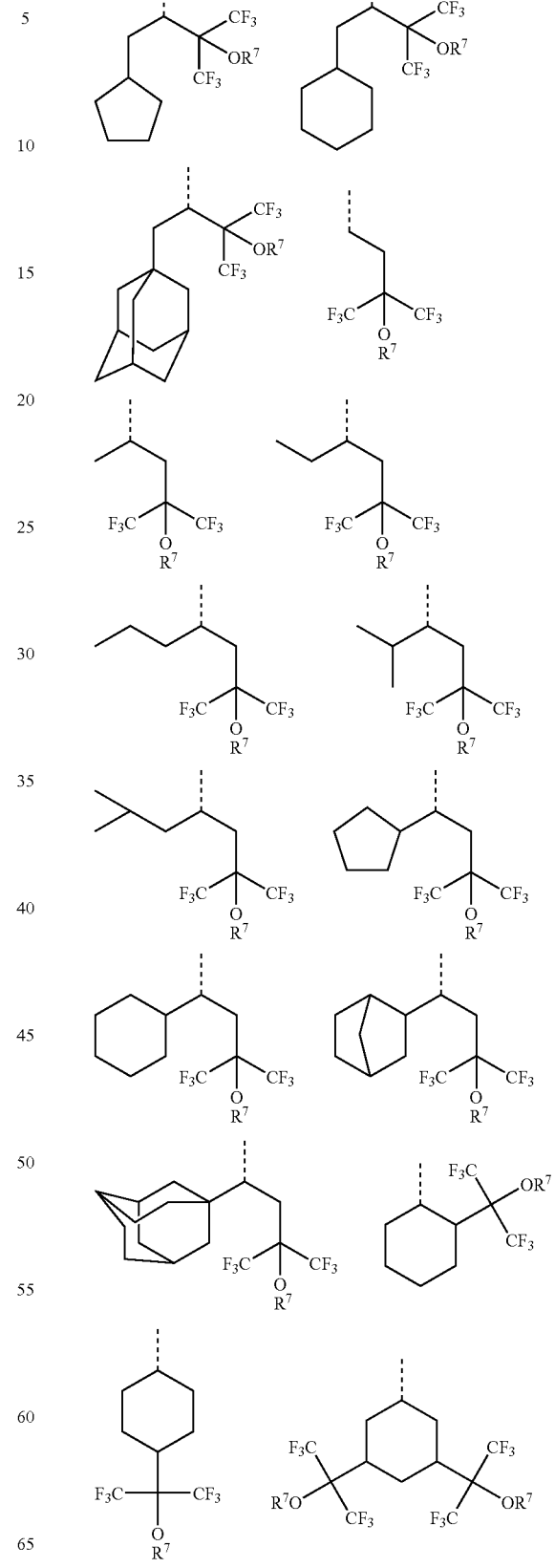

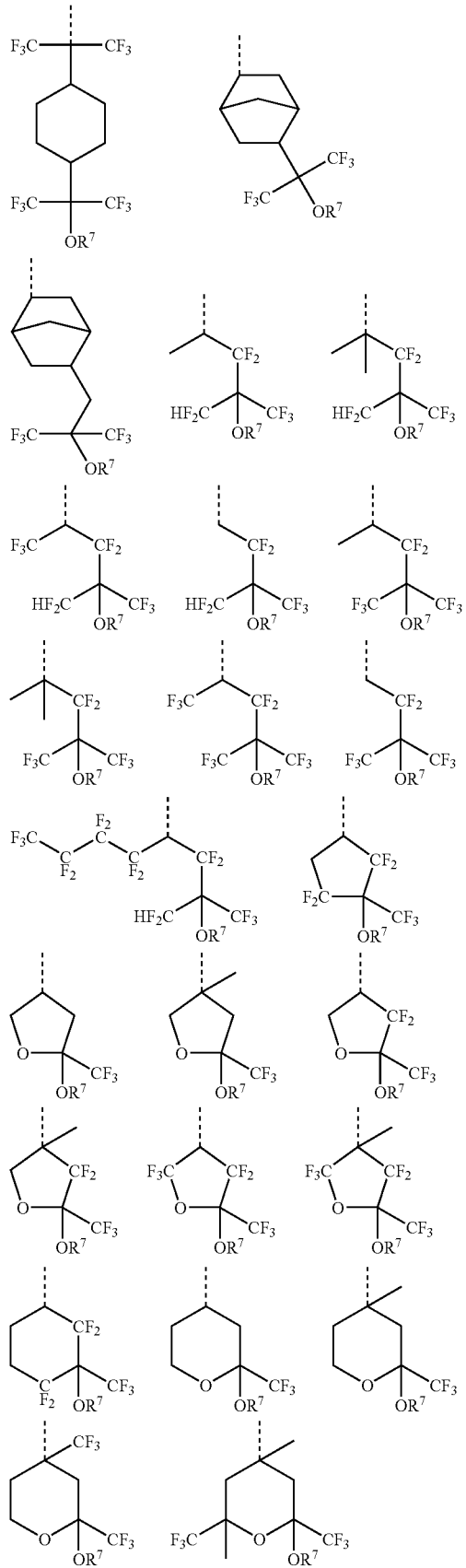
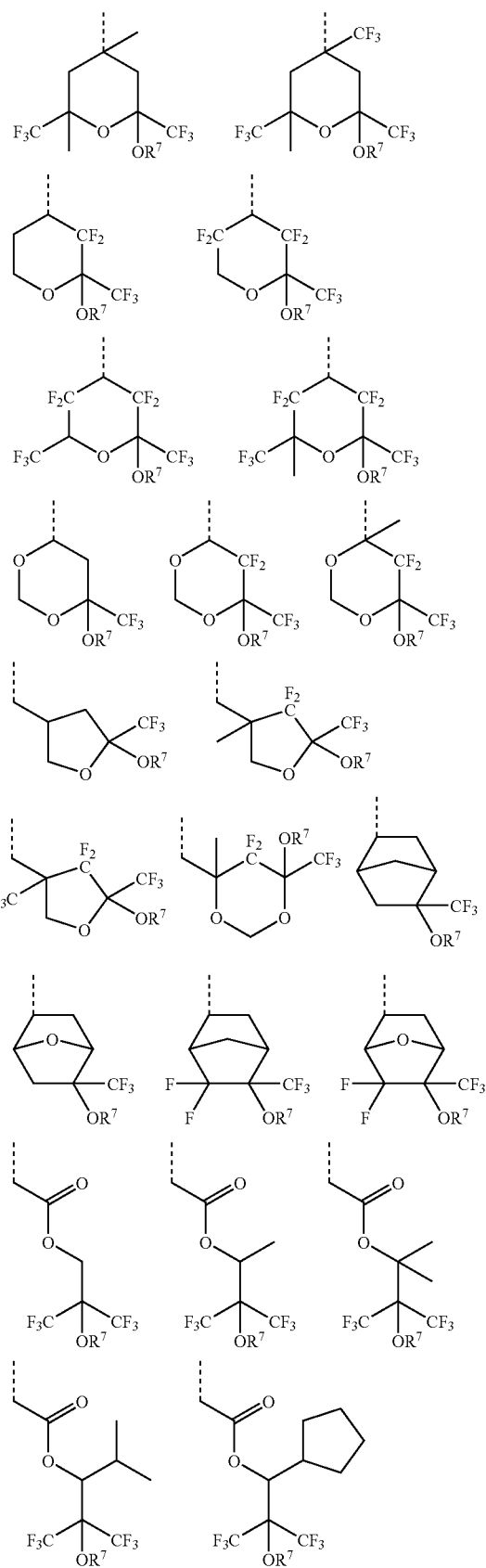

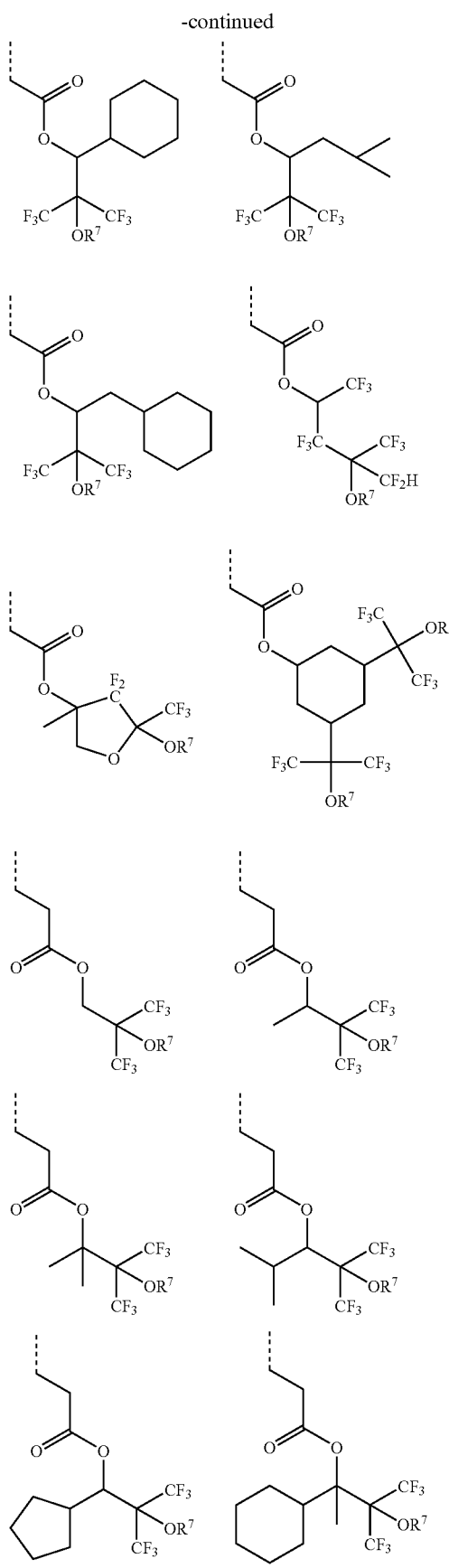
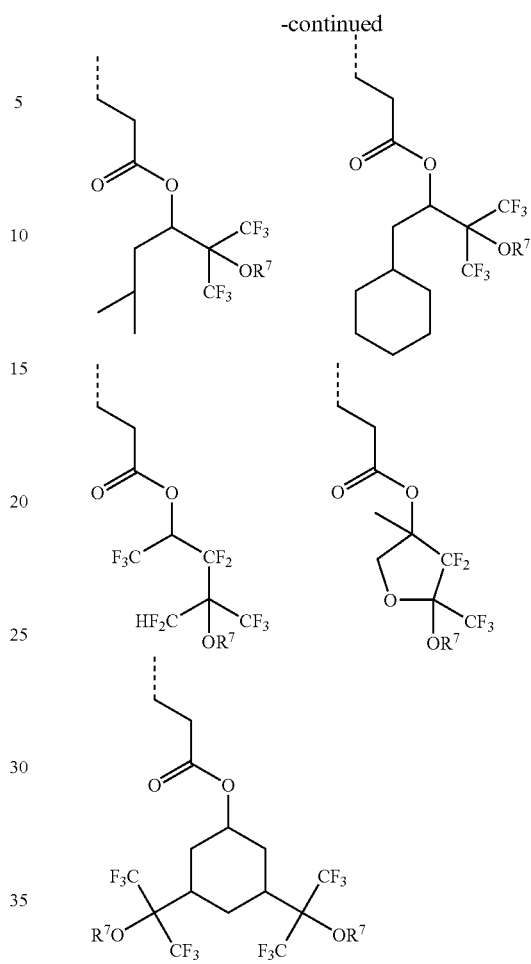

Herein, the broken line denotes a linking group and $R^7$ is as defined above.

In formula (1b), examples of the straight, branched or cyclic $C_2$-$C_{20}$ fluoroalkyl group represented by $R^6$ include, but are not limited to, 2,2,2-trifluoroethyl, 3,3,3-trifluoropropyl, 1H,1H,3H-tetrafluoropropyl, 1,1,1,3,3,3-hexafluoroisopropyl, 1H,1H,5H-octafluoropentyl, 1H,1H,7H-dodecafluoroheptyl, 2-(perfluorobutyl)ethyl, 2-(perfluorohexyl)ethyl, 2-(perfluorooctyl)ethyl, and 2-(perfluorodecyl)ethyl.

It is noted that the meaning of a+b+c=1 is that in a polymer comprising recurring units (1a), (1b) and (1c), the sum of recurring units (1a), (1b) and (1c) is 100 mol % based on the total amount of entire recurring units. The meaning of a+b+c<1 is that the sum of recurring units (1a), (1b) and (1c) is less than 100 mol % based on the total amount of entire recurring units, indicating the inclusion of other recurring units.

Illustrative, non-limiting examples of other recurring units are given below.

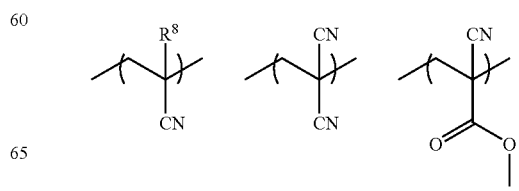

-continued

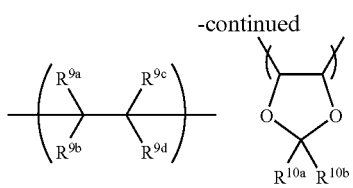

Herein, $R^8$ is hydrogen, or a straight, branched or cyclic $C_1$-$C_{20}$ alkyl or fluoroalkyl group. $R^{9a}$ to $R^{9d}$ are each independently hydrogen, fluorine, or a $C_1$-$C_4$ fluoroalkyl group, and at least one of $R^{9a}$ to $R^{9d}$ contains one or more fluorine atoms. $R^{10a}$ and $R^{10b}$ are hydrogen, methyl or trifluoromethyl.

The other recurring units are preferably included in an amount of not more than 30 mol %, and more preferably less than 25 mol %, based on the total of entire recurring units. In this regard, the sum of a+b+c is preferably more than 70 mol %, and more preferably at least 75 mol % based on the total of entire recurring units.

The polymers used in the resist compositions of the invention may be synthesized by general polymerization processes including radical copolymerizataion using initiators such as 2,2'-azobisisobutyronitrile (AIBN), ionic (or anionic) polymerization using alkyllithium, and the like. The polymerization may be carried out by its standard technique. Preferably the polymers are prepared by radical polymerization while the polymerization conditions depend on the type of initiator, temperature, pressure, concentration, solvent, additives, and the like.

Examples of the radical initiator used herein include azo compounds such as 2,2'-azobisisobutyronitrile (AIBN), 2,2'-azobis(4-methoxy-2,4-dimethylvaleronitrile), 2,2'-azobis(2,4-dimethylvaleronitrile), 2,2'-azobis(2,4,4-trimethylpentane), dimethyl 2,2'-azobis(2-methylpropionate); peroxides such as tert-butylperoxypivalate, lauroyl peroxide, benzoyl peroxide, tert-butylperoxylaurate; water-soluble polymerization initiators such as potassium persulfate; and redox initiators comprising a peroxide (e.g., potassium persulfate or hydrogen peroxide) combined with a reducing agent (e.g., sodium sulfite). Although the amount of polymerization initiator used may vary with its type and other polymerization conditions, it is generally used in an amount of 0.001 to 10 mol %, and preferably 0.01 to 5 mol % based on the total moles of monomers to be polymerized.

During the synthesis of the inventive polymer, any known chain transfer agent such as dodecyl mercaptan or 2-mercaptoethanol may be added for molecular weight control purpose. The amount of chain transfer agent added is preferably 0.01 to 10 mol % based on the total moles of monomers to be polymerized.

If necessary, a solvent may be used during the synthesis of the inventive polymer. Any solvent may be used as long as it does not interfere with the desired polymerization reaction. Examples of suitable organic solvents used herein include esters such as ethyl acetate, n-butyl acetate, and γ-butyrolactone; ketones such as acetone, methyl ethyl ketone, and methyl isobutyl ketone; aliphatic or aromatic hydrocarbons such as toluene, xylene and cyclohexane; alcohols such as isopropyl alcohol and ethylene glycol monomethyl ether; and ether solvents such as diethyl ether, dioxane, and tetrahydrofuran, which may be used alone or in admixture. Although the amount of solvent used may vary with the desired degree of polymerization (or molecular weight), the amount of initiator added, and other polymerization conditions such as polymerization temperature, it is generally used in such an amount as to provide a concentration of 0.1 to 95% by weight, preferably 5 to 90% by weight of monomers to be polymerized.

Although the temperature of the polymerization reaction may vary with the identity of polymerization initiator or the boiling point of solvent, it is preferably 20 to 200° C., and more preferably 50 to 140° C. Any desired reactor or vessel may be used for the polymerization reaction.

From the solution or dispersion of the polymer thus synthesized, the organic solvent or water serving as the reaction medium is removed by any of well-known techniques. Suitable techniques include, for example, re-precipitation followed by filtration, and heat distillation under vacuum.

Desirably the polymer has a weight average molecular weight (Mw) of about 1,000 to about 500,000, and especially about 2,000 to about 30,000, as determined by gel permeation chromatography (GPC) using polystyrene standards. This is because a polymer with too high a Mw may interfere with film formation after spin coating and lead to a decline of alkali solubility.

In the polymers of the invention wherein U1 stands for a total molar number of monomers corresponding to units of formula (1a), U2 stands for a total molar number of monomers corresponding to units of formula (1b), and U3 stands for a total molar number of monomers corresponding to units of formula (1c), with the proviso that U1+U2+U3=U, a proportion of U1, U2 and U3 is preferably determined so as to meet:

$0 \leq U1/U < 1.0$, more preferably $0.1 \leq U1/U \leq 0.6$, $0 < U2/U < 1.0$, more preferably $0.2 \leq U2/U \leq 0.8$, and $0 \leq U3/U \leq 1.0$, more preferably $0.1 \leq U3/U \leq 0.6$.

When used in the resist composition of the invention, the polymers may be compounded alone or as a mixture of two or more polymers in any desired proportion.

In the resist composition of the invention, the polymer(s) may be compounded in a total amount of 0.1 to 50 parts by weight, and preferably 0.5 to 10 parts by weight per 100 parts by weight of the base resin. At least 0.1 phr of the polymer is effective in improving the receding contact angle with water of the photoresist film at its surface. Up to 50 phr of the polymer is effective in forming a photoresist film having a low rate of dissolution in an alkaline developer and capable of maintaining the height of a fine pattern formed therein.

Notably the inventive polymer has a fluorinated ester unit on a lactone side chain. When a resist composition to which the inventive polymer is added at a level in the above-described range is subjected to alkaline development, some or all of the ester units are hydrolyzed during the alkaline development. As a result, the contact angle of resist film after development is reduced, and the occurrence of blob defects is minimized.

With regard to the inventive polymer, a lactone-containing monomer (1b') corresponding to formula (1b) may be prepared by any desired procedure, for example, the procedure shown by the following reaction scheme.

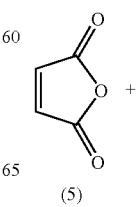

(5)

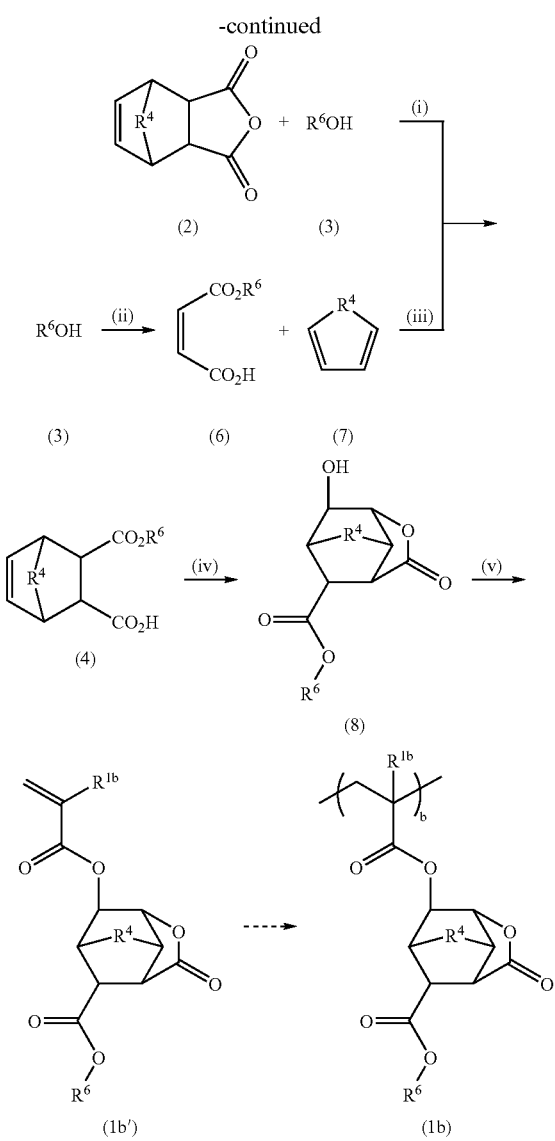

Herein $R^{1b}$, $R^4$ and $R^6$ are as defined above.

A first stage is to produce an intermediate carboxylic acid (4) via step (i) or steps (ii) and (iii).

In step (i), a carboxylic acid (4) is synthesized by reacting an acid anhydride (2) with an alcohol (3). The reaction takes place by heating at 40 to 150° C. in a solventless system or in a hydrocarbon solvent such as toluene or xylene. If desired, an organic base such as triethylamine, pyridine or 4-dimethylaminopyridine is added to the reaction system. Alternatively, carboxylic acid (4) is synthesized by reacting alcohol (3) with metal hydrides (e.g., borane, alkylborane, sodium hydride, lithium hydride, potassium hydride, and calcium hydride), alkyl metal compounds (e.g., trityllithium, tritylsodium, tritylpotassium, methyllithium, phenyllithium, n-butyllithium, sec-butyllithium, tert-butyllithium, and ethyl magnesium bromide), or alkoxides (e.g., sodium methoxide, sodium ethoxide, lithium methoxide, lithium ethoxide, lithium tert-butoxide, and potassium tert-butoxide) to form a corresponding alkoxide, and reacting it with acid anhydride (2).

In steps (ii) and (iii), carboxylic acid (4) is synthesized by reacting an acid anhydride (5) with an alcohol (3) to form a carboxylic acid (6), followed by Diels-Alder reaction with a diene (7).

Synthesis of carboxylic acid (6) may be performed by the same procedure as step (i). Diels-Alder reaction of carboxylic acid (6) with diene (7) may take place under well-known conditions. In an example where diene (7) is cyclopentadiene (of formula (7) wherein $R^4$ is —$CH_2$—), the reaction takes place in a solventless system or in a hydrocarbon solvent such as n-hexane, n-heptane, benzene, toluene or xylene while heating at 30 to 100° C., if necessary. In another example where diene (7) is furan (of formula (7) wherein $R^4$ is —O—), the reaction is carried out in a solventless system or in a hydrocarbon solvent such as n-hexane, n-heptane, benzene, toluene or xylene at −30° C. to 20° C. in the presence of a Lewis acid (e.g., lithium chloride, aluminum chloride, zinc chloride, zinc iodide, titanium tetrachloride, boron trifluoride, and borane-tetrahydrofuran complex) as a catalyst. These reaction conditions are preferable in view of percent yield.

A second stage is to produce an intermediate alcohol (8) via step (iv). In step (iv), alcohol (8) is synthesized through oxidizing reaction of a double bond in carboxylic acid (4) with concomitant lactonization. Examples of the oxidizing agent used herein include m-chloroperbenzoic acid, performic acid, peracetic acid, hydrogen peroxide, and oxygen. Desirably the oxidizing agent is used in an amount of 0.5 to 4.0 moles, and more desirably 1.0 to 2.5 moles per mole of carboxylic acid (4). A solvent may be used and is preferably selected from water, methylene chloride, ethers such as tetrahydrofuran, diethyl ether, di-n-butyl ether and 1,4-dioxane, and hydrocarbons such as n-hexane, n-heptane, benzene, toluene, xylene and cumene. The solvents may be used alone or in admixture. The reaction temperature and time vary with other conditions. For example, when performic acid is used as the oxidizing agent; reaction may be performed at a temperature of 10 to 80° C., and preferably 30 to 50° C. It is desired for higher yields that the reaction time is determined by monitoring the progress of reaction by gas chromatography (GC) or silica gel thin-layer chromatography (TLC) until the reaction is complete. The reaction time is usually about 0.5 hour to about 15 hours. After the completion of reaction, alcohol (8) is recovered from the reaction mixture by a conventional aqueous work-up step. If necessary, alcohol (8) can be purified by any standard technique such as distillation, recrystallization or chromatography.

A third stage is to produce a lactone-containing monomer (1b') via step (v). In step (v), lactone-containing monomer (1b') is synthesized by reacting alcohol (8) with an esterifying agent. The reaction readily takes place by a well-known procedure. The preferred esterifying agents are acid chlorides and carboxylic acids. In an example where an acid chloride is used as the esterifying agent, alcohol (8), the acid chloride (e.g., methacrylic chloride or norbornenecarboxylic chloride), and a base (e.g., triethylamine, pyridine or 4-dimethylaminopyridine) are sequentially or simultaneously added to a solventless system or a solvent system such as methylene chloride, toluene or hexane, while the system is cooled or heated as the case may be. In another example where a carboxylic acid is used as the esterifying agent, alcohol (8), the carboxylic acid (e.g., methacrylic acid or norbornenecarboxylic acid), and a mineral acid (e.g., hydrochloric acid, sulfuric acid, nitric acid or perchloric acid) or an organic acid (e.g., p-toluenesulfonic acid or benzenesulfonic acid) are added to a solvent such as toluene or hexane. The reaction is performed while the system is heated. The resultant water may be removed from the system, if necessary.

Resist Composition

The resist composition of the invention is advantageously used as a chemically amplified positive resist composition. In addition to the additive polymer described above, the chemically amplified positive resist composition generally comprises (A) a polymer (as a base resin) which becomes soluble in an alkaline developer under the action of an acid, (B) a compound which generates an acid upon exposure to high-energy radiation, and (C) an organic solvent.

Component A

Suitable polymers or base resins (A) include polymers of (meth)acrylic acid esters, alternating copolymers of cycloolefins and maleic anhydride, polynorbornene, cycloolefin metathesis ring-opening polymers, hydrogenated products of cycloolefin metathesis ring-opening polymers, and the like. Specifically the resin component (A) used herein includes, but is not limited to, those polymers comprising units of the following formula (R1) and/or (R2) and having a weight average molecular weight (Mw) of about 1,000 to about 100,000, especially about 3,000 to about 30,000, as measured by GPC versus polystyrene standards.

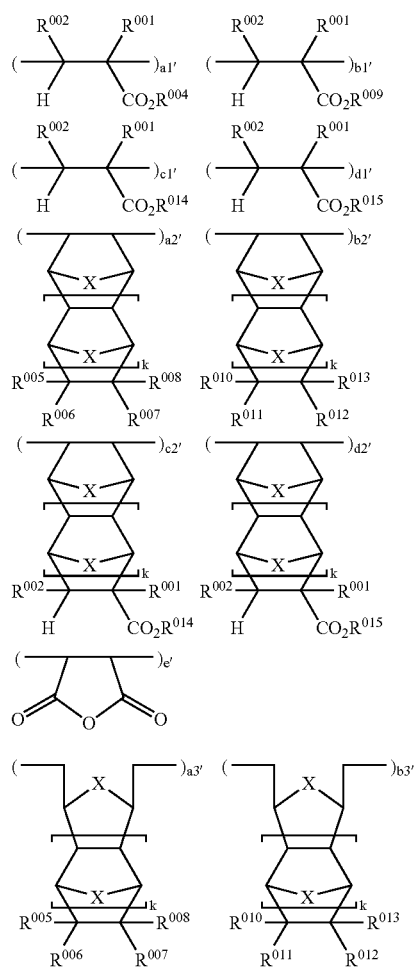

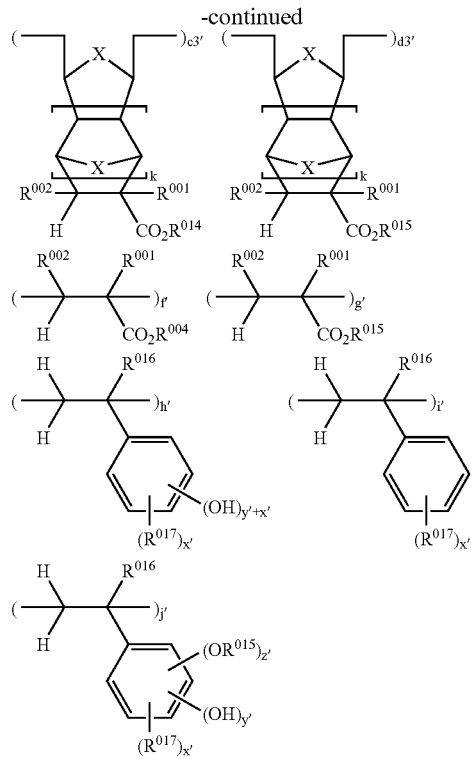

Herein, $R^{001}$ is hydrogen, methyl or $-CH_2CO_2R^{003}$.

$R^{002}$ is hydrogen, methyl or $-CO_2R^{003}$.

$R^{003}$ is a straight, branched or cyclic $C_1-C_{15}$ alkyl group, for example, methyl, ethyl, propyl, isopropyl, n-butyl, sec-butyl, tert-butyl, tert-amyl, n-pentyl, n-hexyl, cyclopentyl, cyclohexyl, ethylcyclopentyl, butylcyclopentyl, ethylcyclohexyl, butylcyclohexyl, adamantyl, ethyladamantyl, and butyladamantyl.

$R^{004}$ is hydrogen or a monovalent $C_1-C_{15}$ hydrocarbon group having at least one of fluorinated substituent groups, carboxyl groups and hydroxyl groups, for example, hydrogen, carboxyethyl, carboxybutyl, carboxycyclopentyl, carboxycyclohexyl, carboxynorbornyl, carboxyadamantyl, hydroxyethyl, hydroxybutyl, hydroxycyclopentyl, hydroxycyclohexyl, hydroxynorbornyl, hydroxyadamantyl, hydroxyhexafluoroisopropylcyclohexyl, and di(hydroxyhexafluoroisopropyl)cyclohexyl.

At least one of $R^{005}$ to $R^{008}$ represents a monovalent $C_1-C_{15}$ hydrocarbon group having at least one of fluorinated substituent groups, carboxyl groups and hydroxyl groups while the remaining R's independently represent hydrogen or straight, branched or cyclic $C_1-C_{15}$ alkyl groups. Examples of the monovalent $C_1-C_{15}$ hydrocarbon group having at least one of fluorinated substituent groups, carboxyl groups and hydroxyl groups include carboxy, carboxymethyl, carboxyethyl, carboxybutyl, hydroxymethyl, hydroxyethyl, hydroxybutyl, 2-carboxyethoxycarbonyl, 4-carboxybutoxycarbonyl, 2-hydroxyethoxycarbonyl, 4-hydroxybutoxycarbonyl, carboxycyclopentyloxycarbonyl, carboxycyclohexyloxycarbonyl, carboxynorbornyloxycarbonyl, carboxyadamantyloxycarbonyl, hydroxycyclopentyloxycarbonyl, hydroxycyclohexyloxycarbonyl, hydroxynorbornyloxycarbonyl, hydroxyadamantyloxycarbonyl, hydroxyhexafluoroisopropylcyclohexyloxycarbonyl, and di(hydroxyhexafluoroisopropyl)cyclohexyloxycarbonyl.

Examples of the straight, branched or cyclic $C_1$-$C_{15}$ alkyl group are the same as exemplified for $R^{003}$.

Alternatively, any two of $R^{005}$ to $R^{008}$ (e.g., $R^{005}$ and $R^{006}$, $R^{006}$ and $R^{007}$) may bond together to form a ring with the carbon atom to which they are attached. In that event, at least one of $R^{005}$ to $R^{008}$ is a divalent $C_1$-$C_{15}$ hydrocarbon group having at least one of fluorinated substituent groups, carboxyl groups and hydroxyl groups, while the remaining are independently a single bond or a straight, branched or cyclic $C_1$-$C_{15}$ alkylene group. Examples of the divalent $C_1$-$C_{15}$ hydrocarbon group having at least one of fluorinated substituent groups, carboxyl groups and hydroxyl groups include the groups exemplified as the monovalent hydrocarbon group having at least one of fluorinated substituent groups, carboxyl groups and hydroxyl groups, with one hydrogen atom eliminated therefrom. Examples of the straight, branched or cyclic $C_1$-$C_{15}$ alkylene groups include the groups exemplified for $R^{003}$, with one hydrogen atom eliminated therefrom.

$R^{009}$ is a monovalent $C_3$-$C_{15}$ hydrocarbon group containing a —$CO_2$— partial structure, for example, 2-oxooxolan-3-yl, 4,4-dimethyl-2-oxooxolan-3-yl, 4-methyl-2-oxooxan-4-yl, 2-oxo-1,3-dioxolan-4-ylmethyl, and 5-methyl-2-oxooxolan-5-yl.

At least one of $R^{010}$ to $R^{013}$ is a monovalent $C_2$-$C_{15}$ hydrocarbon group containing a —$CO_2$— partial structure, while the remaining R's are independently hydrogen or straight, branched or cyclic $C_1$-$C_{15}$ alkyl groups. Examples of the monovalent $C_2$-$C_{15}$ hydrocarbon group containing a —$CO_2$— partial structure include 2-oxooxolan-3-yloxycarbonyl, 4,4-dimethyl-2-oxooxolan-3-yloxycarbonyl, 4-methyl-2-oxooxan-4-yloxycarbonyl, 2-oxo-1,3-dioxolan-4-ylmethyloxycarbonyl, and 5-methyl-2-oxooxolan-5-yloxycarbonyl. Examples of the straight, branched or cyclic $C_1$-$C_{15}$ alkyl groups are the same as exemplified for $R^{003}$.

Alternatively, any two of $R^{010}$ to $R^{013}$ (e.g., $R^{010}$ and $R^{011}$, $R^{011}$ and $R^{012}$) may bond together to form a ring with the carbon atom to which they are attached. In that event, at least one of $R^{010}$ to $R^{013}$ is a divalent $C_2$-$C_{15}$ hydrocarbon group containing a —$CO_2$— partial structure, while the remaining are independently a single bond or a straight, branched or cyclic $C_1$-$C_{15}$ alkylene group. Examples of the divalent $C_2$-$C_{15}$ hydrocarbon group containing a —$CO_2$— partial structure include 1-oxo-2-oxapropane-1,3-diyl, 1,3-dioxo-2-oxapropane-1,3-diyl, 1-oxo-2-oxabutane-1,4-diyl, and 1,3-dioxo-2-oxabutane-1,4-diyl, as well as the groups exemplified as the monovalent hydrocarbon group containing a —$CO_2$— partial structure, with one hydrogen atom eliminated therefrom. Examples of the straight, branched or cyclic $C_1$-$C_{15}$ alkylene groups include the groups exemplified for $R^{003}$, with one hydrogen atom eliminated therefrom.

$R^{014}$ is a polycyclic $C_7$-$C_{15}$ hydrocarbon group or an alkyl group containing a polycyclic hydrocarbon group, for example, norbornyl, bicyclo[3.3.1]nonyl, tricyclo[5.2.1.0$^{2,6}$] decyl, adamantyl, ethyladamantyl, butyladamantyl, norbornylmethyl, and adamantylmethyl.

$R^{015}$ is an acid labile group, which will be described later.

X is —$CH_2$ or an oxygen atom.

The subscript k is 0 or 1.

The acid labile groups represented by $R^{015}$ may be selected from a variety of such groups. Examples of the acid labile group are groups of the following general formulae (L1) to (L4), tertiary alkyl groups of 4 to 20 carbon atoms, preferably 4 to 15 carbon atoms, trialkylsilyl groups in which each alkyl moiety has 1 to 6 carbon atoms, and oxoalkyl groups of 4 to 20 carbon atoms.

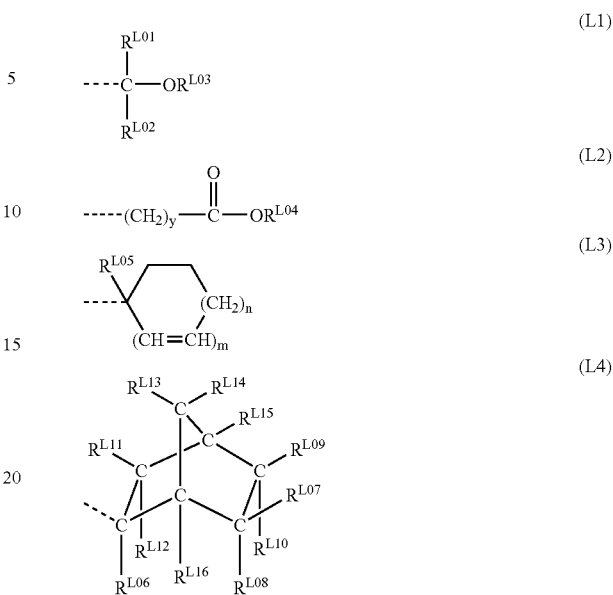

The broken line indicates a valence bond.

In formula (L1), $R^{L01}$ and $R^{L02}$ are hydrogen or straight, branched or cyclic alkyl groups of 1 to 18 carbon atoms, preferably 1 to 10 carbon atoms. Examples include hydrogen, methyl, ethyl, propyl, isopropyl, n-butyl, sec-butyl, tert-butyl, cyclopentyl, cyclohexyl, 2-ethylhexyl, n-octyl, and adamantyl. $R^{L03}$ is a monovalent hydrocarbon group of 1 to 18 carbon atoms, preferably 1 to 10 carbon atoms, which may contain a hetero atom such as oxygen, examples of which include unsubstituted straight, branched or cyclic alkyl groups and straight, branched or cyclic alkyl groups in which some hydrogen atoms are replaced by hydroxyl, alkoxy, oxo, amino, alkylamino or the like. Examples of the straight, branched or cyclic alkyl groups are as exemplified above for $R^{L01}$ and $R^{L02}$, and examples of the substituted alkyl groups are shown below.

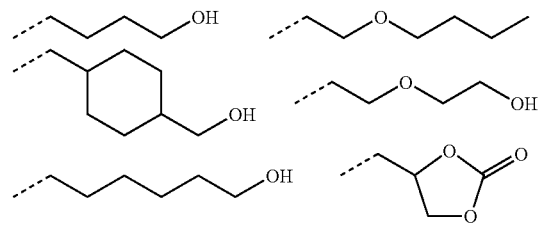

A pair of $R^{L01}$ and $R^{L02}$, $R^{L01}$ and $R^{L03}$, or $R^{L02}$ and $R^{L03}$ may bond together to form a ring with the carbon and oxygen atoms to which they are attached. Each of $R^{L01}$, $R^{L02}$ and $R^{L03}$ is a straight or branched alkylene group of 1 to 18 carbon atoms, preferably 1 to 10 carbon atoms when they form a ring.

In formula (L2), $R^{L04}$ is a tertiary alkyl group of 4 to 20 carbon atoms, preferably 4 to 15 carbon atoms, a trialkylsilyl group in which each alkyl moiety has 1 to 6 carbon atoms, an oxoalkyl group of 4 to 20 carbon atoms, or a group of formula (L1). Exemplary tertiary alkyl groups are tert-butyl, tert-amyl, 1,1-diethylpropyl, 2-cyclopentylpropan-2-yl, 2-cyclohexylpropan-2-yl, 2-(bicyclo[2.2.1]heptan-2-yl)propan-2-yl, 2-(adamantan-1-yl)propan-2-yl, 1-ethylcyclopentyl, 1-butylcyclopentyl, 1-ethylcyclohexyl, 1-butylcyclohexyl, 1-ethyl-2-cyclopentenyl, 1-ethyl-2-cyclohexenyl, 2-methyl-2-adamantyl, and 2-ethyl-2-adamantyl. Exemplary trialkylsilyl groups are trimethylsilyl, triethylsilyl, and dimethyl-tert-butylsilyl. Exemplary oxoalkyl groups are 3-oxocyclohexyl, 4-methyl-2-oxooxan-4-yl, and 5-methyl-2-oxooxolan-5-yl. In formula (L2), y is an integer of 0 to 6.

In formula (L3), $R^{L05}$ is a substituted or unsubstituted, $C_1$-$C_{10}$ straight, branched or cyclic alkyl group or a substituted or unsubstituted $C_6$-$C_{20}$ aryl group. Examples of the substituted or unsubstituted alkyl groups include straight, branched or cyclic ones such as methyl, ethyl, propyl, isopropyl, n-butyl, sec-butyl, tert-butyl, tert-amyl, n-pentyl, n-hexyl, cyclopentyl, cyclohexyl and bicyclo[2.2.1]heptyl; substituted forms of the foregoing in which some hydrogen atoms are replaced by hydroxyl, alkoxy, carboxy, alkoxycarbonyl, oxo, amino, alkylamino, cyano, mercapto, alkylthio, sulfo or other groups; and substituted forms of the foregoing in which some of the methylene groups are replaced by oxygen or sulfur atoms. Exemplary substituted or unsubstituted aryl groups are phenyl, methylphenyl, naphthyl, anthryl, phenanthryl, and pyrenyl. In formula (L3), m is 0 or 1, n is 0, 1, 2 or 3, and 2m+n is equal to 2 or 3.

In formula (L4), $R^{L06}$ is a substituted or unsubstituted, $C_1$-$C_{10}$ straight, branched or cyclic alkyl group or a substituted or unsubstituted $C_6$-$C_{20}$ aryl group. Examples of these groups are the same as exemplified for $R^{L05}$. $R^{L07}$ to $R^{L16}$ independently represent hydrogen or monovalent $C_1$-$C_{15}$ hydrocarbon groups. Exemplary hydrocarbon groups are straight, branched or cyclic alkyl groups such as methyl, ethyl, propyl, isopropyl, n-butyl, sec-butyl, tert-butyl, tert-amyl, n-pentyl, n-hexyl, n-octyl, n-nonyl, n-decyl, cyclopentyl, cyclohexyl, cyclopentylmethyl, cyclopentylethyl, cyclopentylbutyl, cyclohexylmethyl, cyclohexylethyl and cyclohexylbutyl, and substituted forms of the foregoing in which some hydrogen atoms are replaced by hydroxyl, alkoxy, carboxy, alkoxycarbonyl, oxo, amino, alkylamino, cyano, mercapto, alkylthio, sulfo or other groups. Alternatively, $R^{L07}$ to $R^{L16}$ may bond together to form a ring (for example, a pair of $R^{L07}$ and $R^{L08}$, $R^{L07}$ and $R^{L09}$, $R^{L08}$ and $R^{L10}$, $R^{L09}$ and $R^{L10}$, $R^{L11}$ and $R^{L12}$, $R^{L13}$ and $R^{L14}$, or a similar pair form a ring). Each of $R^{L07}$ to $R^{L16}$ represents a divalent $C_1$-$C_{15}$ hydrocarbon group when they form a ring, examples of which are the ones exemplified above for the monovalent hydrocarbon groups, with one hydrogen atom being eliminated. Two of $R^{L07}$ to $R^{L16}$ which are attached to vicinal carbon atoms (for example, a pair of $R^{L07}$ and $R^{L09}$, $R^{L09}$ and $R^{L15}$, $R^{L13}$ and $R^{L15}$, or a similar pair) may bond together directly to form a double bond.

Of the acid labile groups of formula (L1), the straight and branched ones are exemplified by the following groups.

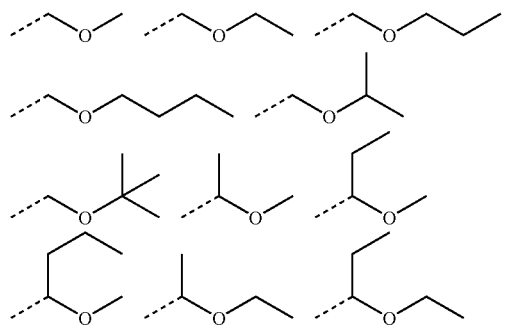

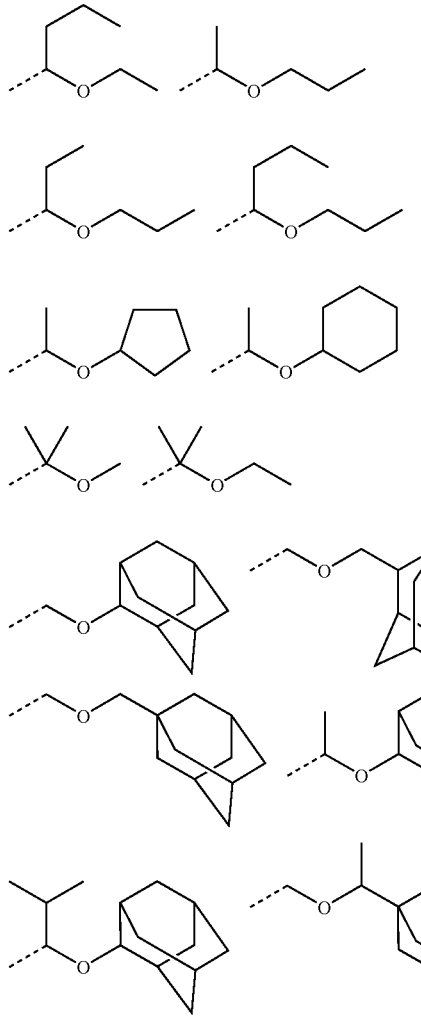

Of the acid labile groups of formula (L1), the cyclic ones are, for example, tetrahydrofuran-2-yl, 2-methyltetrahydrofuran-2-yl, tetrahydropyran-2-yl, and 2-methyltetrahydropyran-2-yl.

Examples of the acid labile groups of formula (L2) include tert-butoxycarbonyl, tert-butoxycarbonylmethyl, tert-amyloxycarbonyl, tert-amyloxycarbonylmethyl, 1,1-diethylpropyloxycarbonyl, 1,1-diethylpropyloxycarbonylmethyl, 1-ethylcyclopentyloxycarbonyl, 1-ethylcyclopentyloxycarbonylmethyl, 1-ethyl-2-cyclopentenyloxycarbonyl, 1-ethyl-2-cyclopentenyloxycarbonylmethyl, 1-ethoxyethoxycarbonylmethyl, 2-tetrahydropyranyloxycarbonylmethyl, and 2-tetrahydrofuranyloxycarbonylmethyl groups.

Examples of the acid labile groups of formula (L3) include 1-methylcyclopentyl, 1-ethylcyclopentyl, 1-n-propylcyclopentyl, 1-isopropylcyclopentyl, 1-n-butylcyclopentyl, 1-sec-butylcyclopentyl, 1-cyclohexylcyclopentyl, 1-(4-methoxy-n-butyl)cyclopentyl, 1-(bicyclo[2.2.1]heptan-2-yl) cyclopentyl, 1-(7-oxabicyclo[2.2.1]heptan-2-yl)cyclopentyl, 1-methylcyclohexyl, 1-ethylcyclohexyl, 3-methyl-1-cyclopenten-3-yl, 3-ethyl-1-cyclopenten-3-yl, 3-methyl-1-cyclohexen-3-yl, and 3-ethyl-1-cyclohexen-3-yl groups.

The acid labile groups of formula (L4) are preferably groups of the following formulae (L4-1) to (L4-4).

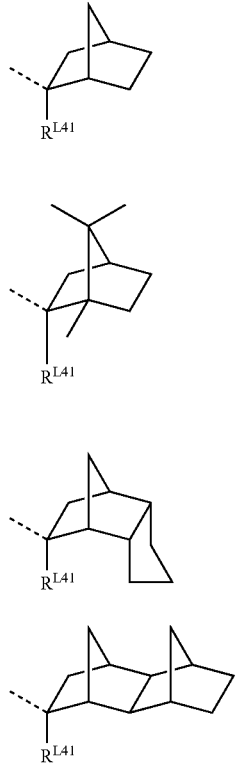

(L4-1)

(L4-2)

(L4-3)

(L4-4)

In formulae (L4-1) to (L4-4), the broken line indicates a bonding site and direction. $R^{L41}$ is each independently selected from monovalent hydrocarbon groups, typically straight, branched or cyclic $C_1$-$C_{10}$ alkyl groups, for example, methyl, ethyl, propyl, isopropyl, n-butyl, sec-butyl, tert-butyl, tert-amyl, n-pentyl, n-hexyl, cyclopentyl, and cyclohexyl.

For formulas (L4-1) to (L4-4), there can exist enantiomers and diastereomers. Each of formulae (L4-1) to (L4-4) collectively represents all such stereoisomers. Such stereoisomers may be used alone or in admixture.

For example, the general formula (L4-3) represents one or a mixture of two selected from groups having the following general formulas (L4-3-1) and (L4-3-2).

(L4-3-1)

(L4-3-2)

Herein $R^{L41}$ is as defined above.

Similarly, the general formula (L4-4) represents one or a mixture of two or more selected from groups having the following general formulas (L4-4-1) to (L4-4-4).

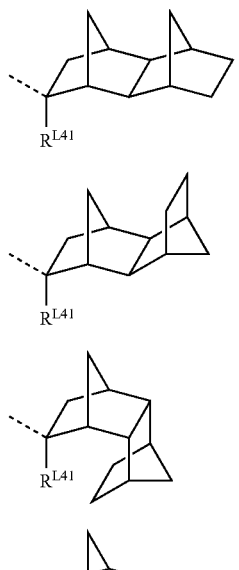

(L4-4-1)

(L4-4-2)

(L4-4-3)

(L4-4-4)

Herein $R^{L41}$ is as defined above.

Each of formulas (L4-1) to (L4-4), (L4-3-1) and (L4-3-2), and (L4-4-1) to (L4-4-4) collectively represents an enantiomer thereof and a mixture of enantiomers.

It is noted that in the above formulas (L4-1) to (L4-4), (L4-3-1) and (L4-3-2), and (L4-4-1) to (L4-4-4), the bond direction is on the exo side relative to the bicyclo[2.2.1] heptane ring, which ensures high reactivity for acid catalyzed elimination reaction (see JP-A 2000-336121). In preparing these monomers having a tertiary exo-alkyl group of bicyclo [2.2.1]heptane skeleton as a substituent group, there may be contained monomers substituted with an endo-alkyl group as represented by the following formulas (L4-1-endo) to (L4-4-endo). For good reactivity, an exo proportion of at least 50 mol % is preferred, with an exo proportion of at least 80 mol % being more preferred.

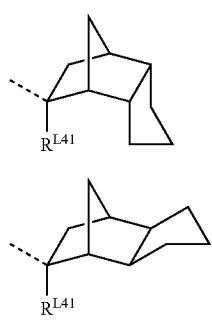

(L4-1-endo)

(L4-2-endo)

-continued

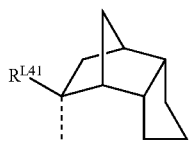
(L4-3-endo)

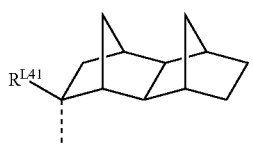
(L4-4-endo)

Herein $R^{L41}$ is as defined above.

Illustrative examples of the acid labile group of formula (L4) are given below.

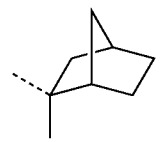 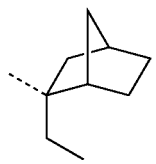 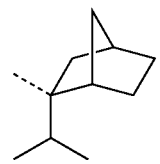
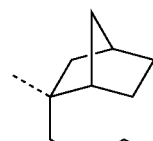 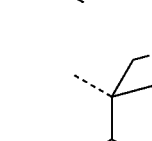 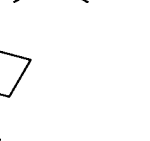
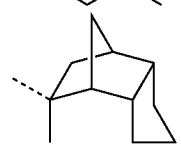  
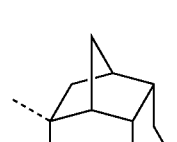  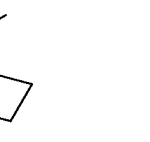
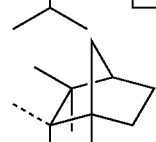 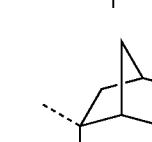 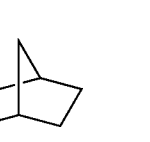
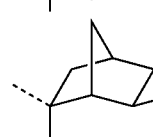 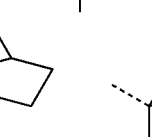 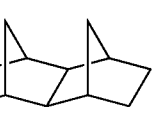

Examples of the tertiary $C_4$-$C_{20}$ alkyl, tri($C_1$-$C_6$-alkyl)silyl and $C_4$-$C_{20}$ oxoalkyl groups included in the acid labile groups represented by $R^{O15}$ are as exemplified above for $R^{L04}$.

In formula (R2), $R^{O16}$ is hydrogen or methyl. $R^{O17}$ is a straight, branched or cyclic $C_1$-$C_8$ alkyl group.

In formula (R1), the subscripts a1', a2', a3', b1', b2', b3', c1', c2', c3', d1', d2', d3', and e' are numbers from 0 to less than 1, satisfying a1'+a2'+a3'+b1'+b2'+b3'+c1'+c2'+c3'+d1'+d2'+d3'+e'=1. In formula (R2), f', g', h', i', and j' are numbers from 0 to less than 1, satisfying f'+g'+h'+i'+j'=1; x', y' and z' are each an integer of 0 to 3, satisfying $1 \leq x'+y'+z' \leq 5$ and $1 \leq y'+z' \leq 3$.

Examples of the recurring units incorporated at compositional ratio a1' in formula (R1) are shown below, though not limited thereto.

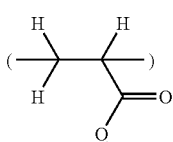 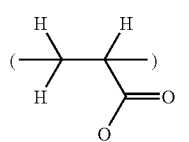
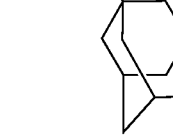 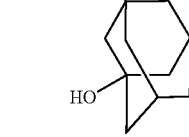
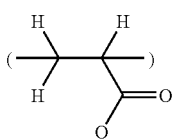 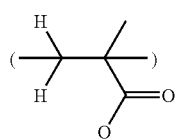
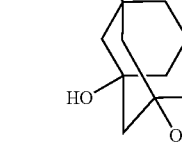 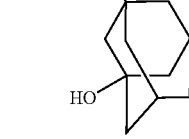
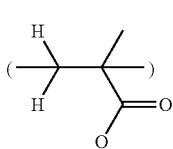 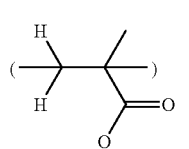
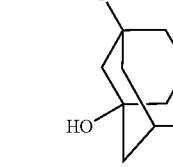 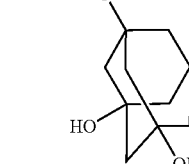
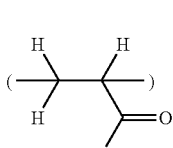 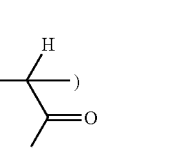
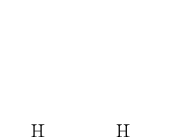 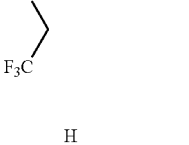
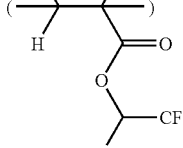 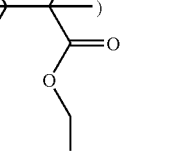
 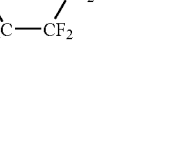

-continued
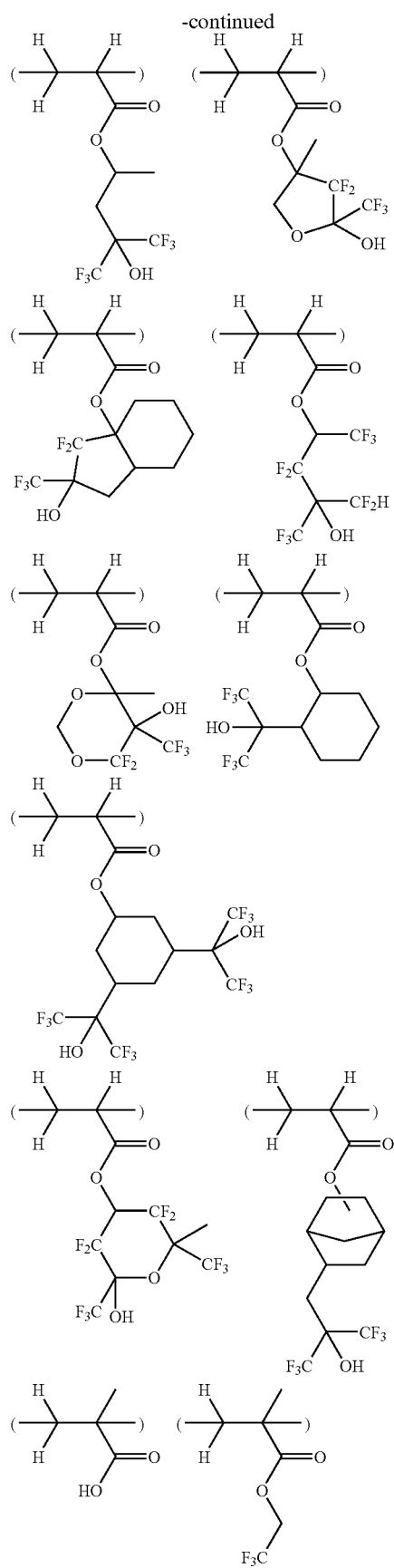
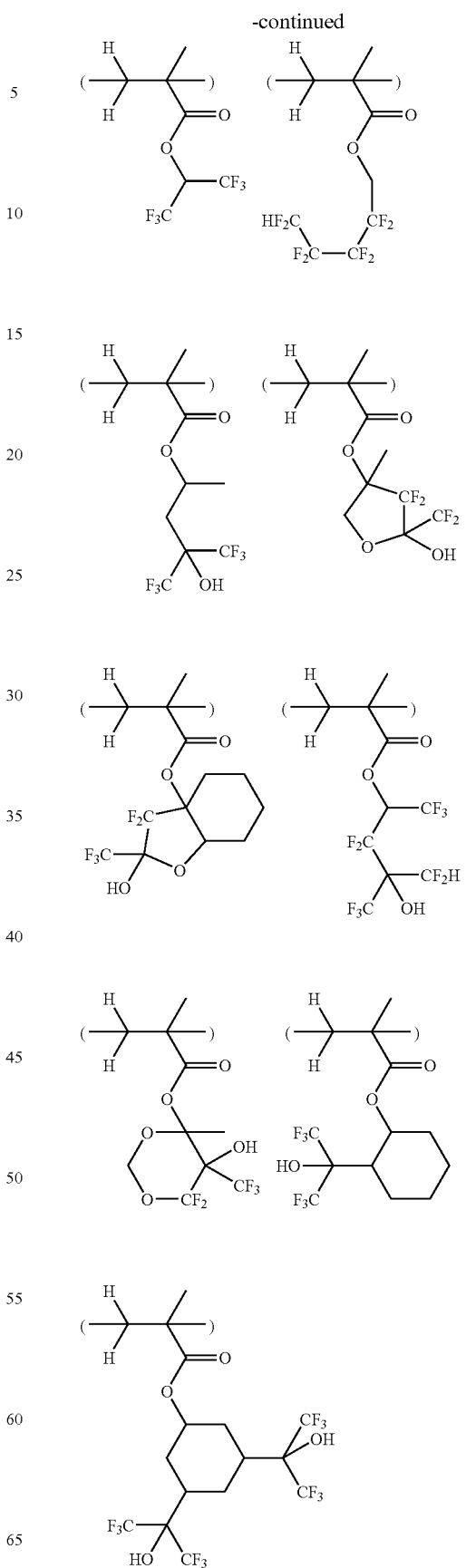

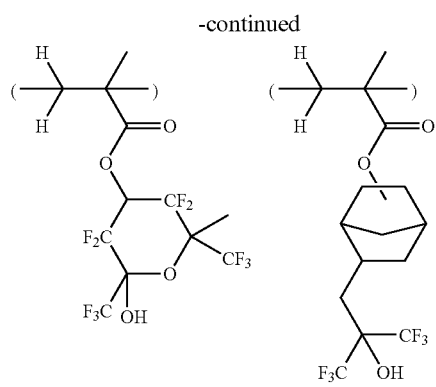
Examples of the recurring units incorporated at compositional ratio b1' in formula (R1) are shown below, though not limited thereto.
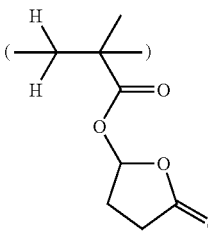
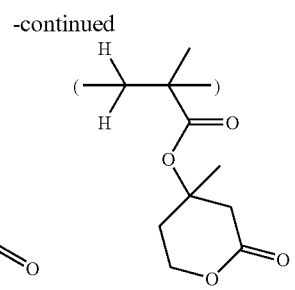
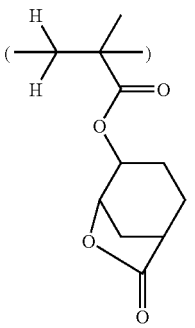
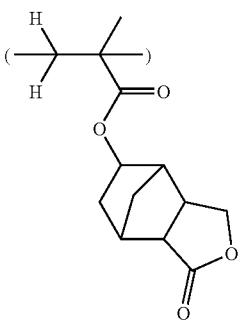
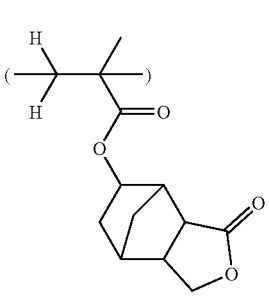
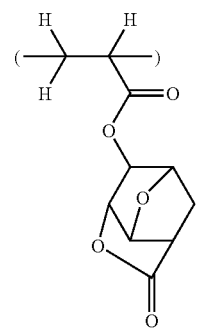
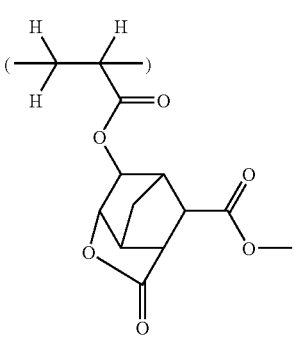

-continued
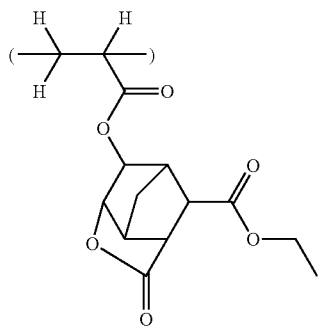
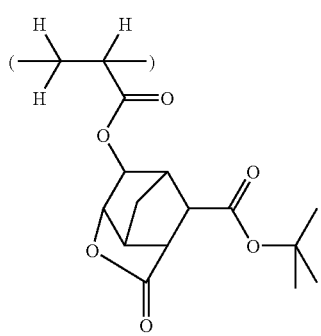
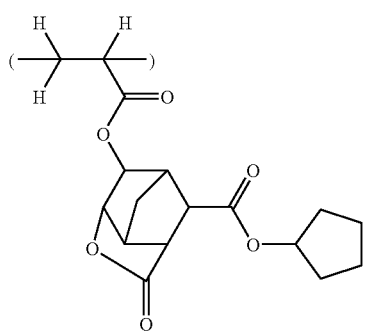
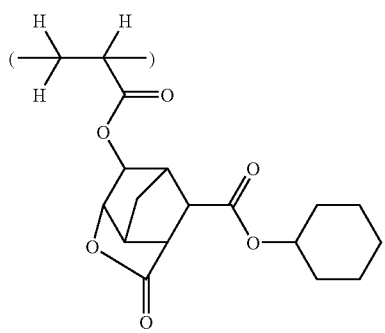
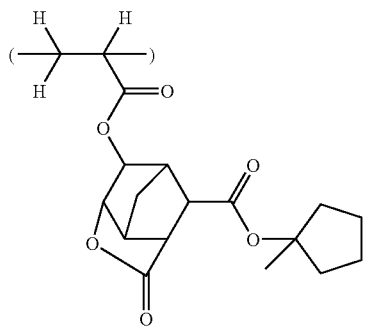
-continued
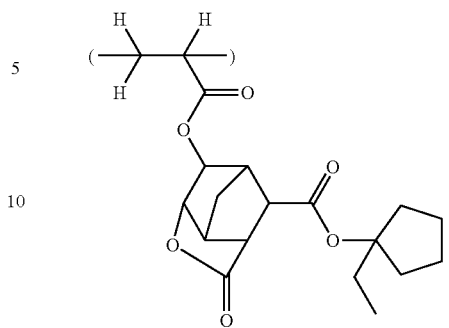
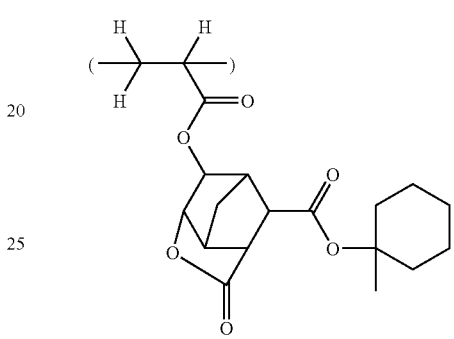
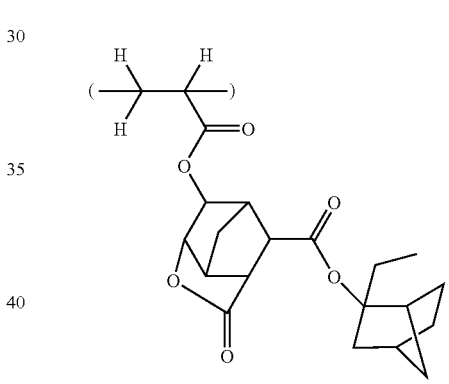
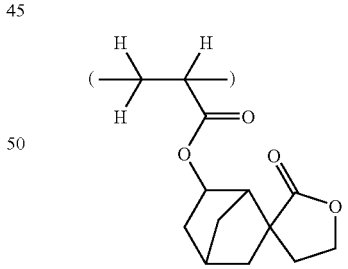
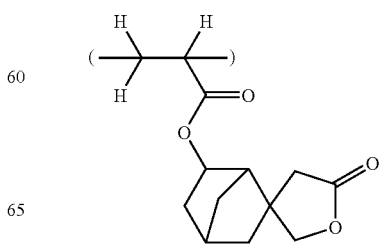

-continued
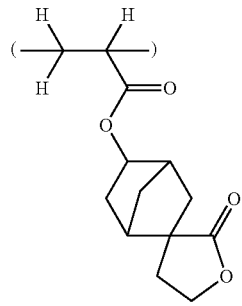
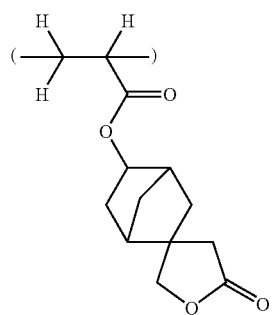
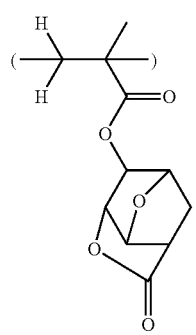
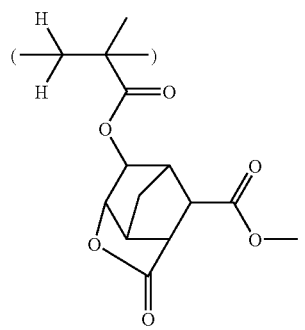
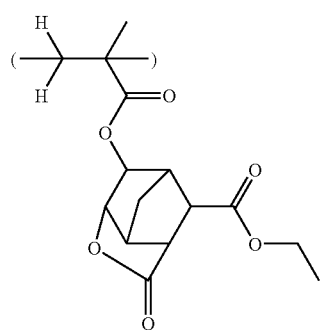
-continued
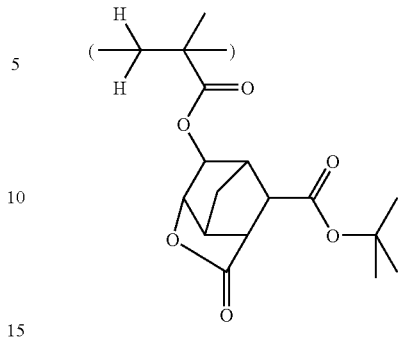
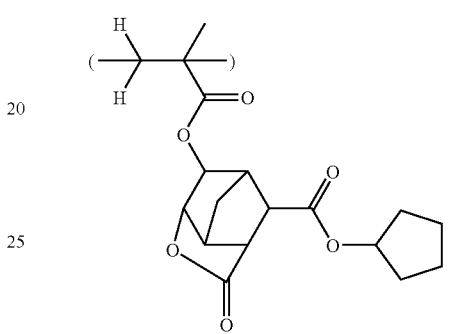
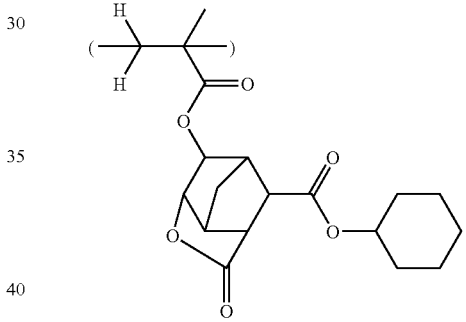
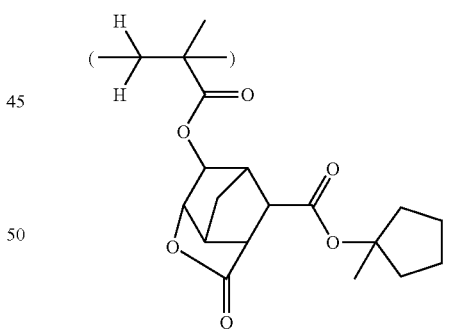
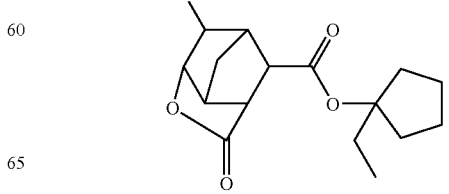

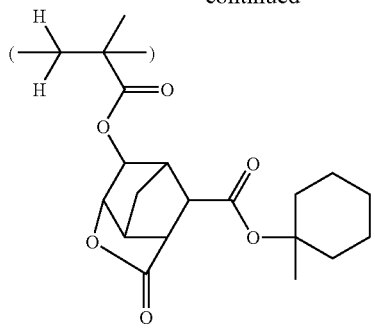
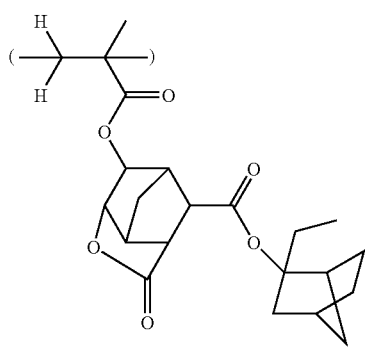
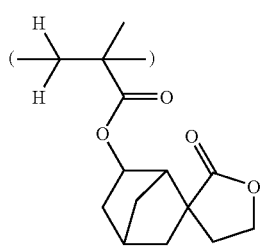
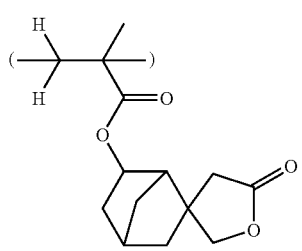
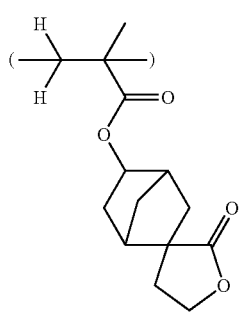
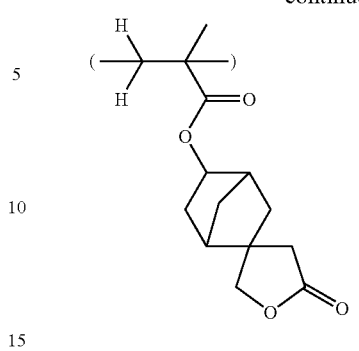
Examples of the recurring units incorporated at compositional ratio d1' in formula (R1) are shown below, though not limited thereto.
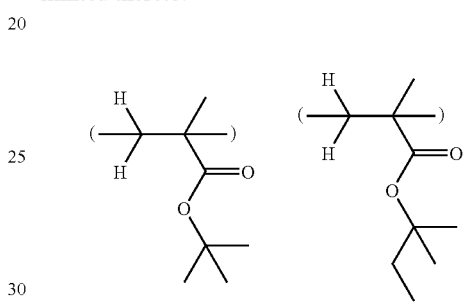
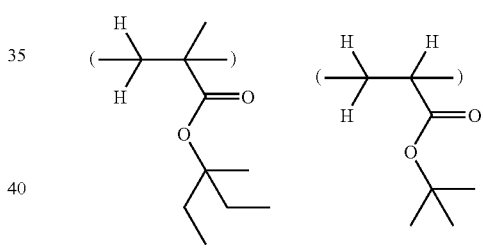
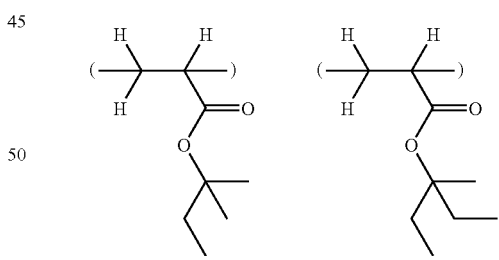
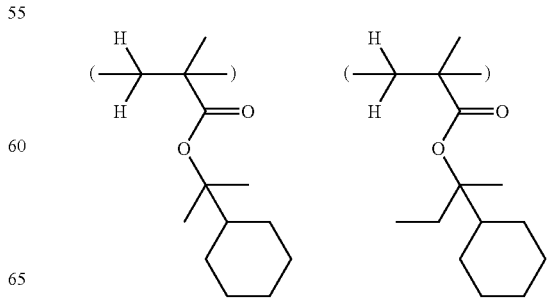

-continued
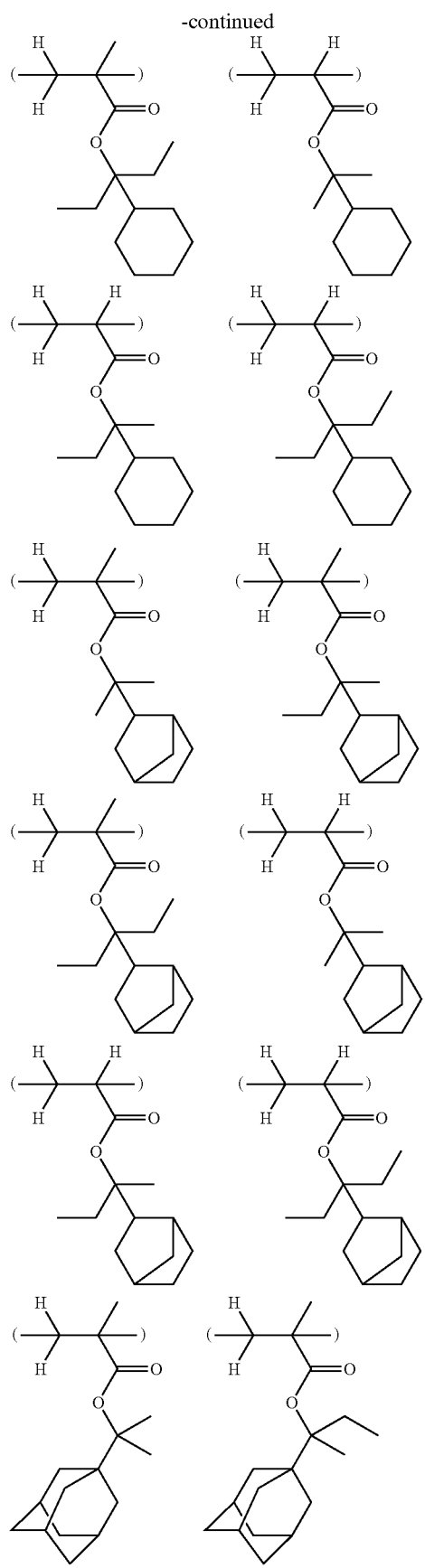
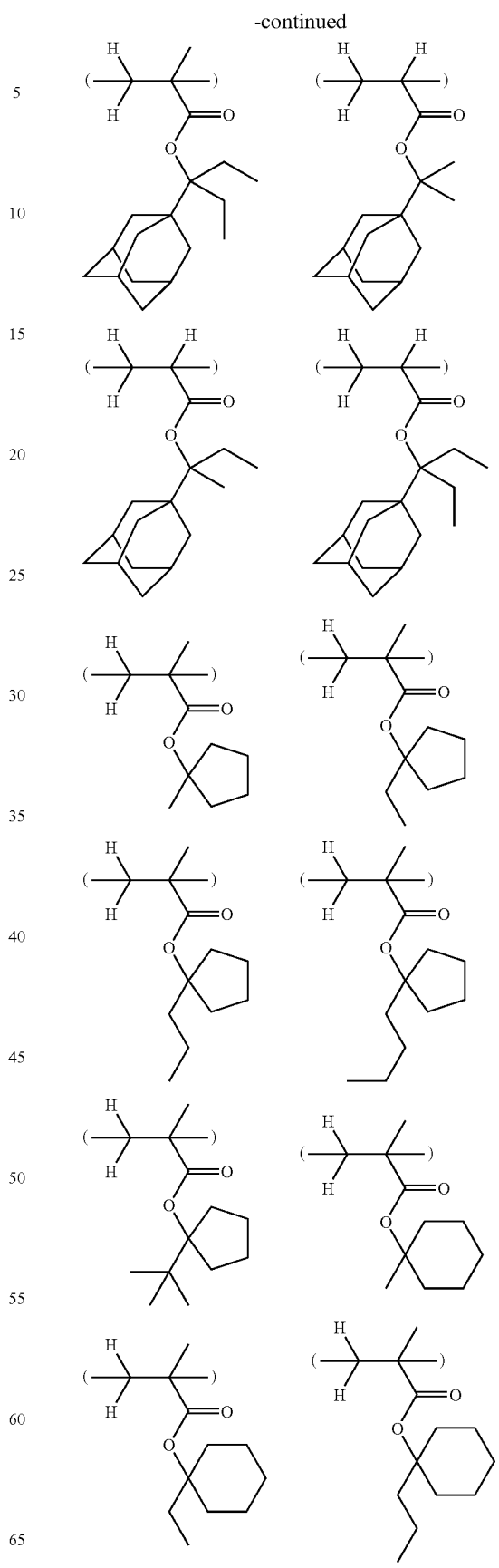

-continued
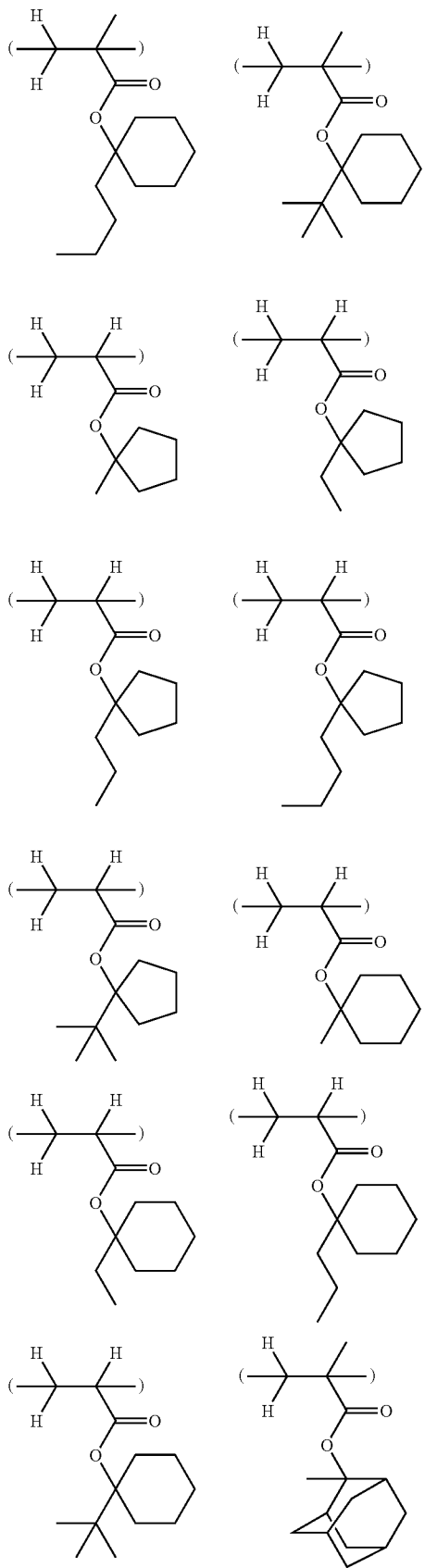
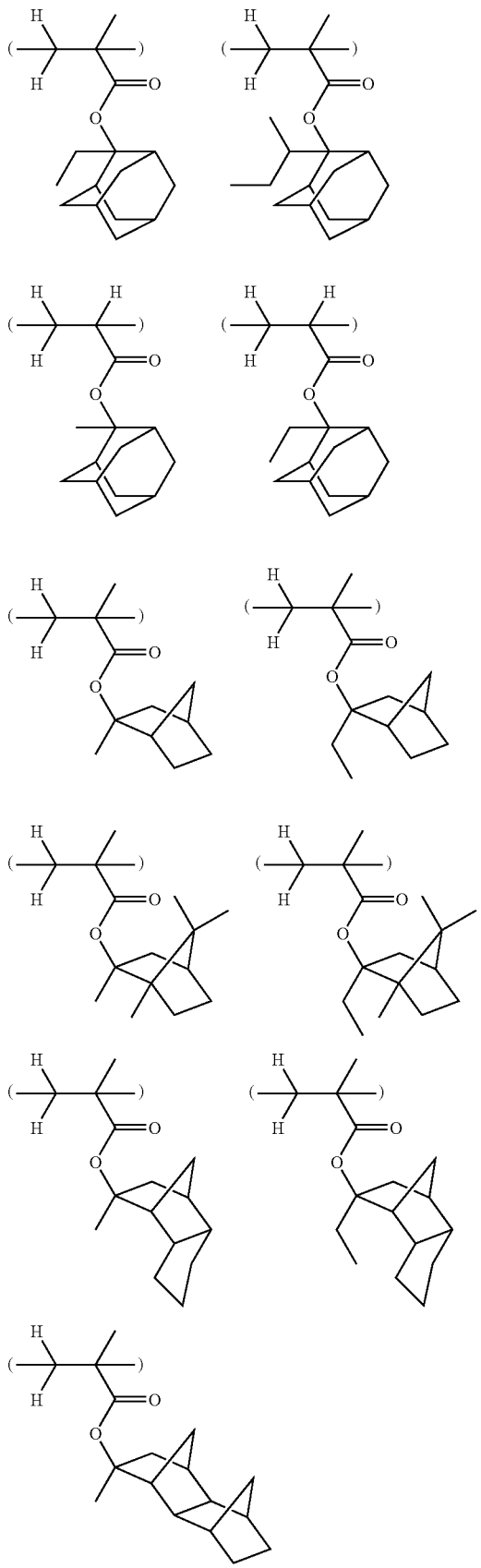

-continued
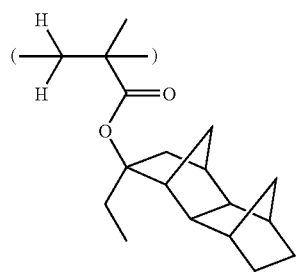
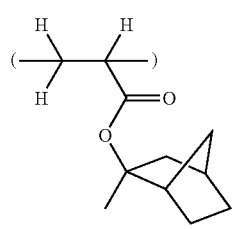
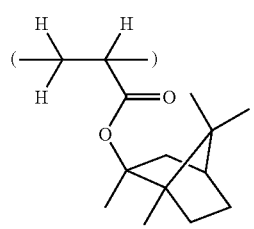
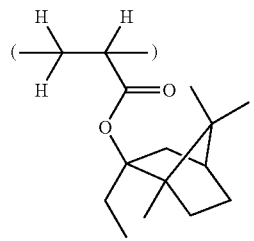
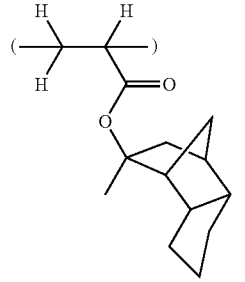
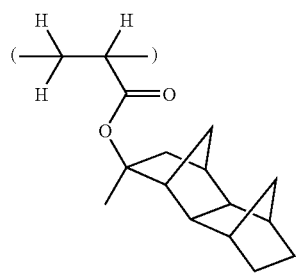
-continued
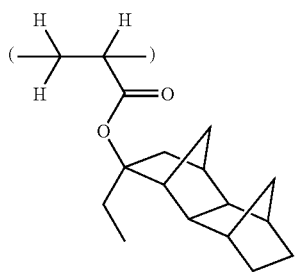
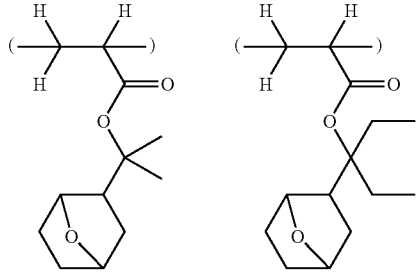
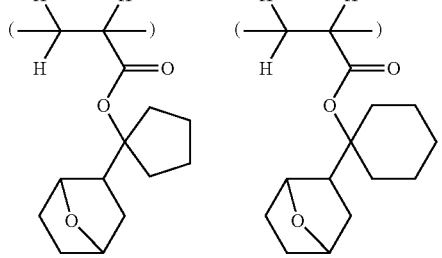
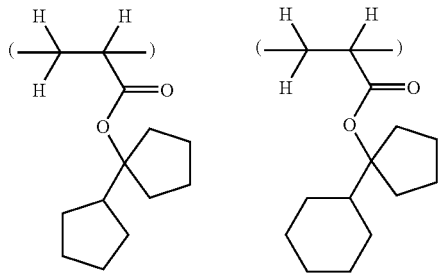
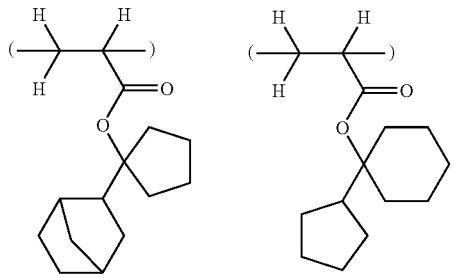
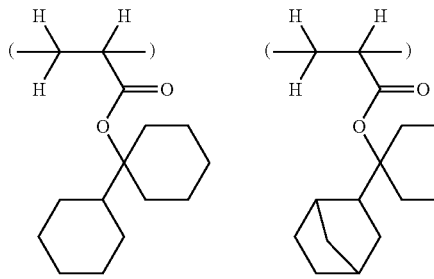

-continued
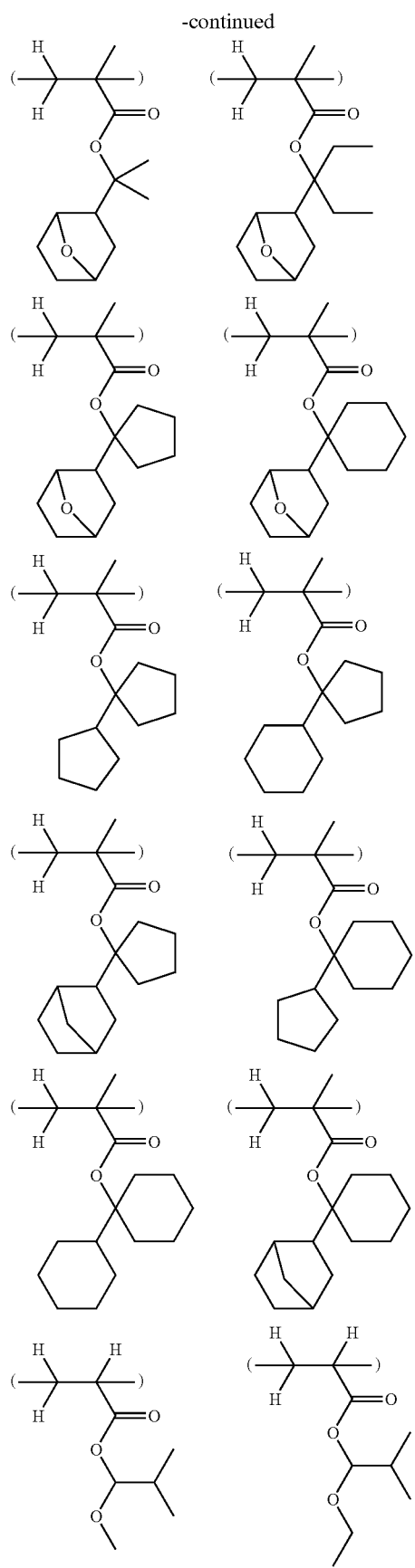
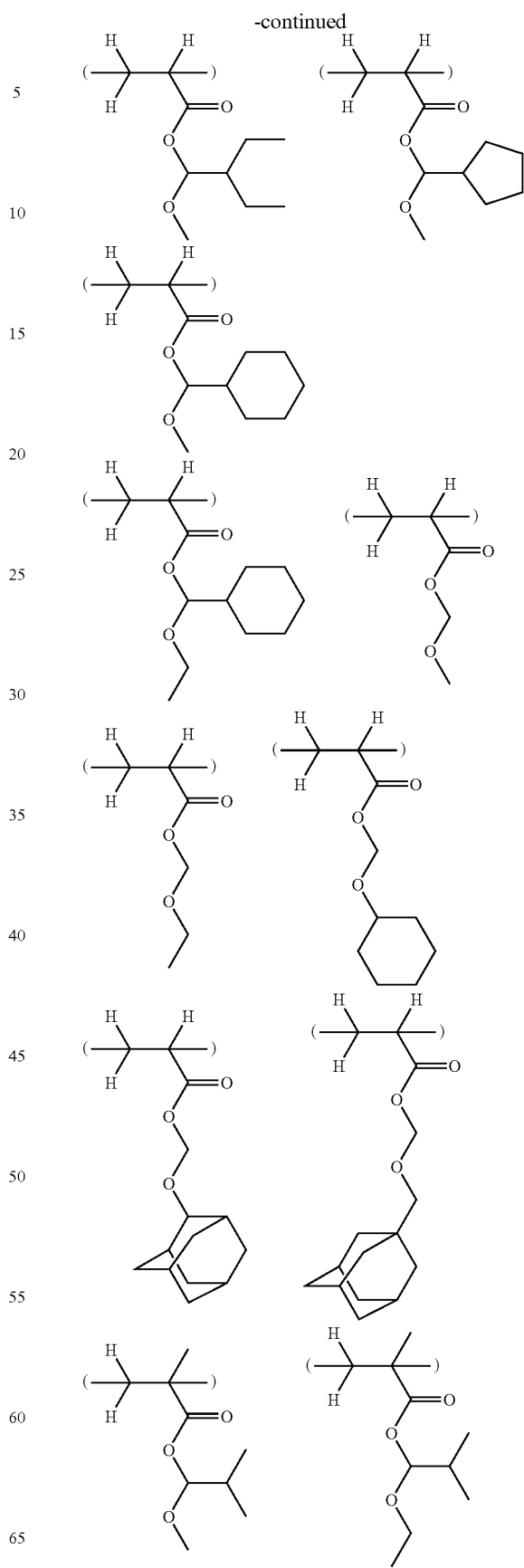

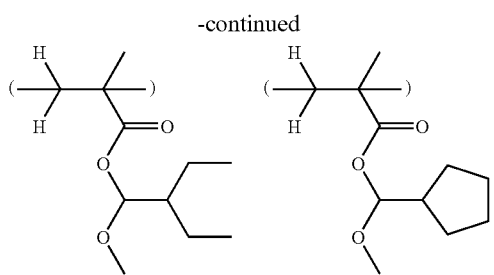
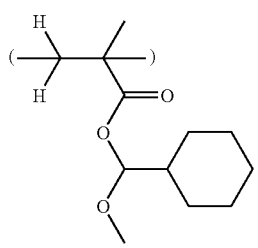
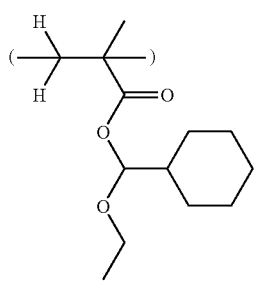
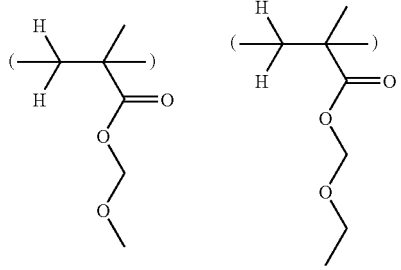
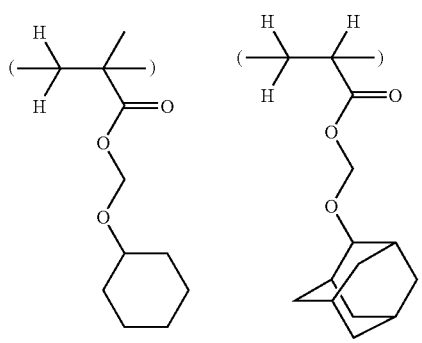
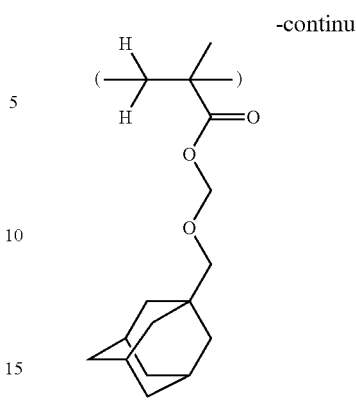
Examples of polymers comprising recurring units in compositional ratios a3', b3', c3' and d3' in formula (R1) are shown below, though not limited thereto.
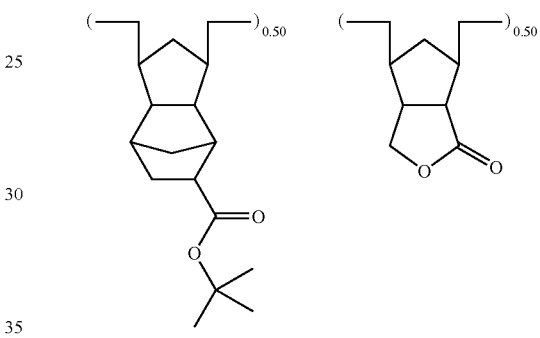
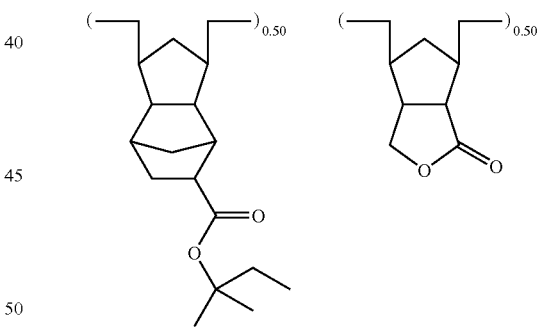
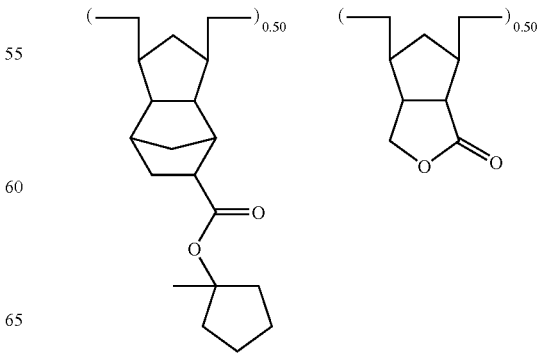

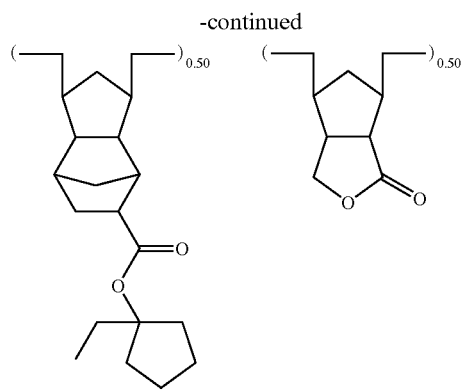
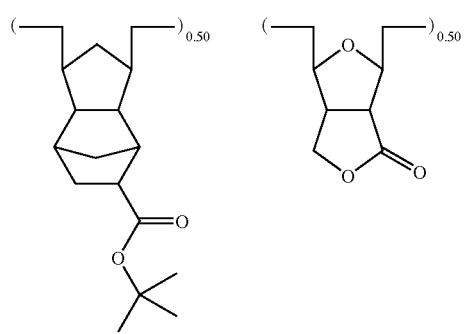
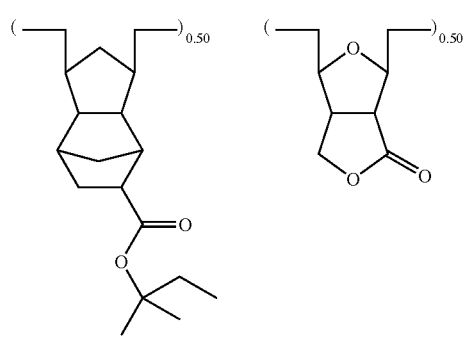
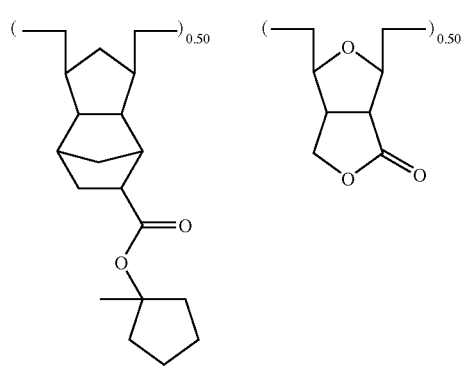
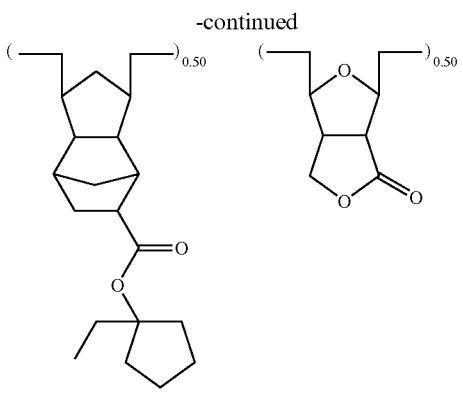
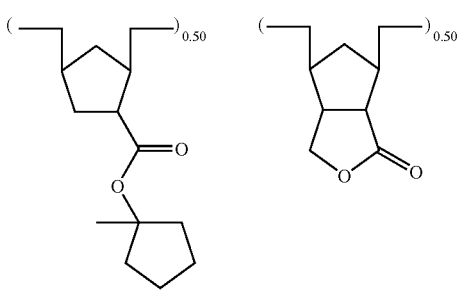
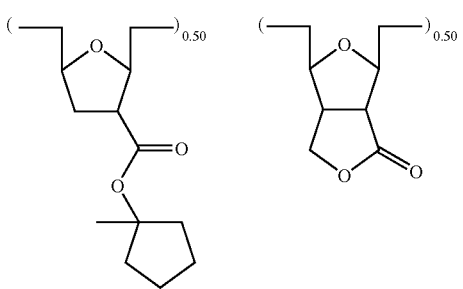
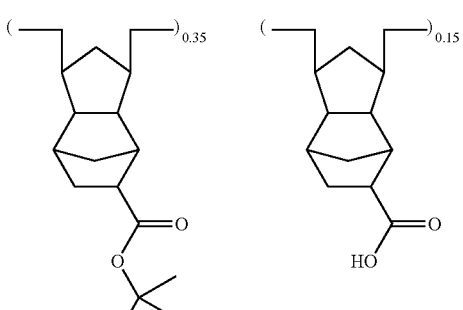
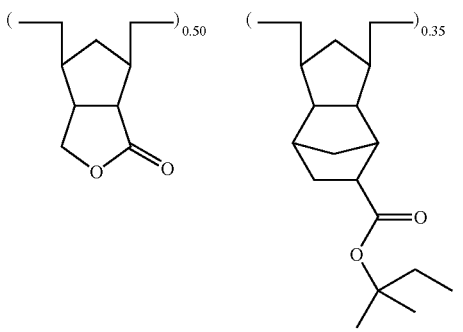

-continued
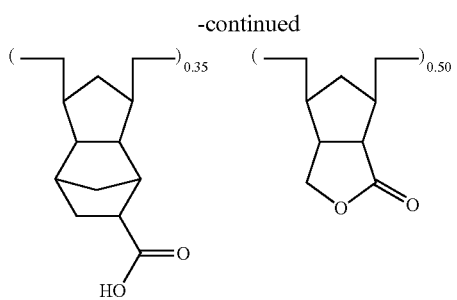
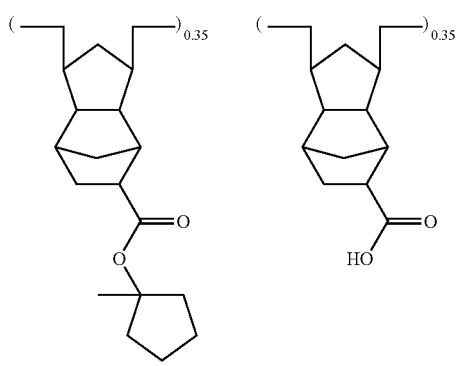
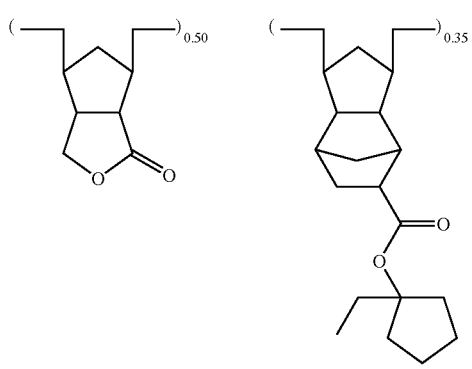
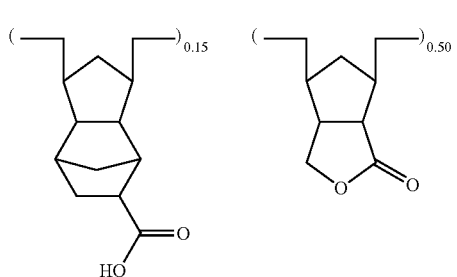
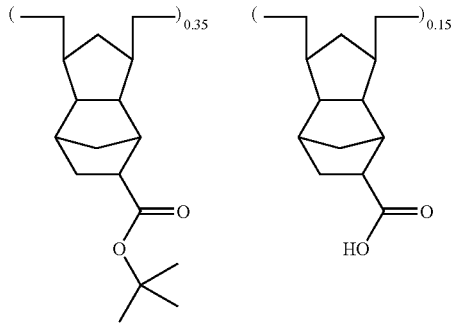
-continued
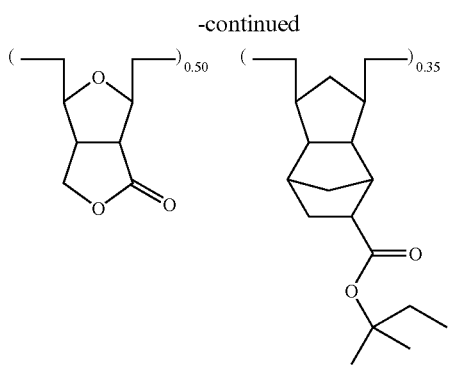
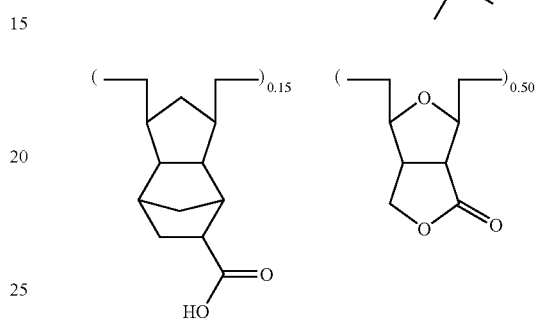
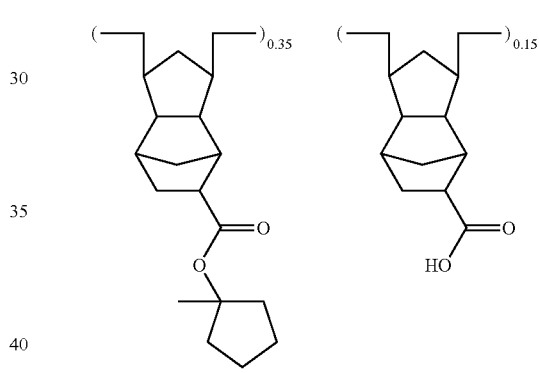
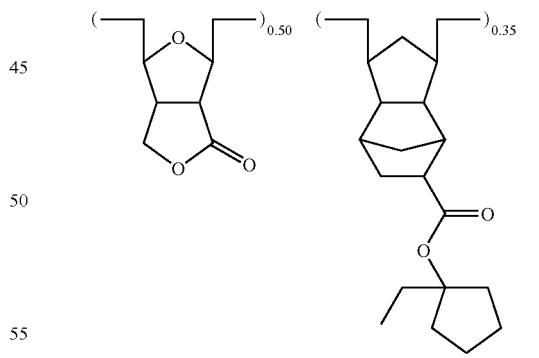
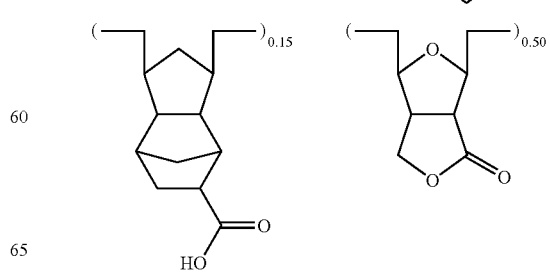

-continued

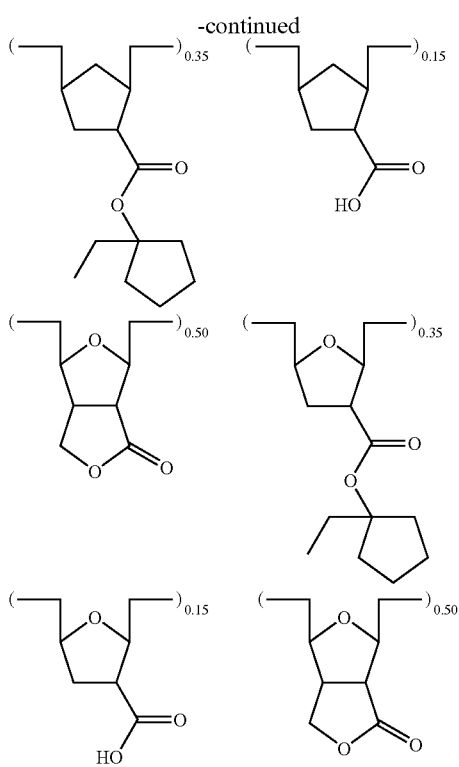

The polymer used as the base resin is not limited to one type and a mixture of two or more polymers may be added. The use of plural polymers allows for easy adjustment of resist properties.

Component B

Also included in the resist composition of the invention is (B) an acid generator, specifically a compound capable of generating an acid in response to actinic light or radiation in order that the resist composition function as a chemically amplified positive resist composition. Component (B) may be any compound capable of generating an acid upon exposure of high-energy radiation, which is generally referred to as "photoacid generator" or PAG. Suitable photoacid generators include sulfonium salts, iodonium salts, sulfonyldiazomethane, N-sulfonyloxyimide, and oxime-O-sulfonate acid generators. Exemplary acid generators are given below while they may be used alone or in admixture of two or more.

Sulfonium salts are salts of sulfonium cations with sulfonates, bis(substituted alkylsulfonyl)imides and tris(substituted alkylsulfonyl)methides. Exemplary sulfonium cations include triphenylsulfonium, (4-tert-butoxyphenyl)diphenylsulfonium, bis(4-tert-butoxyphenyl)phenylsulfonium, tris(4-tert-butoxyphenyl)sulfonium, (3-tert-butoxyphenyl)diphenylsulfonium, bis(3-tert-butoxyphenyl)phenylsulfonium, tris(3-tert-butoxyphenyl)sulfonium, (3,4-di-tert-butoxyphenyl)diphenylsulfonium, bis(3,4-di-tert-butoxyphenyl)phenylsulfonium, tris(3,4-di-tert-butoxyphenyl)sulfonium, diphenyl(4-thiophenoxyphenyl)sulfonium, (4-tert-butoxycarbonylmethyloxyphenyl)diphenylsulfonium, tris(4-tert-butoxycarbonylmethyloxyphenyl)sulfonium, (4-tert-butoxyphenyl)bis(4-dimethylaminophenyl)sulfonium, tris(4-dimethylaminophenyl)sulfonium, 2-naphthyldiphenylsulfonium, dimethyl-2-naphthylsulfonium, 4-hydroxyphenyldimethylsulfonium, 4-methoxyphenyldimethylsulfonium, trimethylsulfonium, 2-oxocyclohexylcyclohexylmethylsulfonium, trinaphthylsulfonium, tribenzylsulfonium, diphenylmethylsulfonium, dimethylphenylsulfonium, 2-oxo-2-phenylethylthiacyclopentanium, 4-n-butoxynaphthyl-1-thiacyclopentanium, and 2-n-butoxynaphthyl-1-thiacyclopentanium. Exemplary sulfonates include trifluoromethanesulfonate, pentafluoroethanesulfonate, nonafluorobutanesulfonate, dodecafluorohexanesulfonate, pentafluoroethylperfluorocyclohexanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, mesitylenesulfonate, 2,4,6-triisopropylbenzenesulfonate, toluenesulfonate, benzenesulfonate, 4-(4'-toluenesulfonyloxy)benzenesulfonate, naphthalenesulfonate, camphorsulfonate, octanesulfonate, dodecylbenzenesulfonate, butanesulfonate, methanesulfonate, 2-benzoyloxy-1,1,3,3,3-pentafluoropropanesulfonate, 1,1,3,3,3-pentafluoro-2-(4-phenylbenzoyloxy)propanesulfonate, 1,1,3,3,3-pentafluoro-2-pivaloyloxypropanesulfonate, 2-cyclohexanecarbonyloxy-1,1,3,3,3-pentafluoropropanesulfonate, 1,1,3,3,3-pentafluoro-2-furoyloxypropanesulfonate, 2-naphthoyloxy-1,1,3,3,3-pentafluoropropanesulfonate, 2-(4-tert-butylbenzoyloxy)-1,1,3,3,3-pentafluoropropanesulfonate, 2-adamantanecarbonyloxy-1,1,3,3,3-pentafluoropropanesulfonate, 2-acetyloxy-1,1,3,3,3-pentafluoropropanesulfonate, 1,1,3,3,3-pentafluoro-2-hydroxypropanesulfonate, 1,1,3,3,3-pentafluoro-2-tosyloxypropanesulfonate, 1,1-difluoro-2-naphthylethanesulfonate, 1,1,2,2-tetrafluoro-2-(norbornan-2-yl)ethanesulfonate, and 1,1,2,2-tetrafluoro-2-(tetracyclo[4.4.0.1$^{2,5}$.1$^{7,10}$]dodec-3-en-8-yl)ethanesulfonate.

Exemplary bis(substituted alkylsulfonyl)imides include bistrifluoromethylsulfonylimide, bispentafluoroethylsulfonylimide, bisheptafluoropropylsulfonylimide, and 1,3-propylenebissulfonylimide. A typical tris(substituted alkylsulfonyl)methide is tristrifluoromethylsulfonylmethide. Sulfonium salts based on combination of the foregoing examples are included.

Iodonium salts are salts of iodonium cations with sulfonates, bis(substituted alkylsulfonyl)imides and tris(substituted alkylsulfonyl)methides. Exemplary iodonium cations are aryliodonium cations including diphenyliodinium, bis(4-tert-butylphenyl)iodonium, 4-tert-butoxyphenylphenyliodonium, and 4-methoxyphenylphenyliodonium. Exemplary sulfonates include trifluoromethanesulfonate, pentafluoroethanesulfonate, nonafluorobutanesulfonate, dodecafluorohexanesulfonate, pentafluoroethylperfluorocyclohexanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, mesitylenesulfonate, 2,4,6-triisopropylbenzenesulfonate, toluenesulfonate, benzenesulfonate, 4-(4-toluenesulfonyloxy)benzenesulfonate, naphthalenesulfonate, camphorsulfonate, octanesulfonate, dodecylbenzenesulfonate, butanesulfonate, methanesulfonate, 2-benzoyloxy-1,1,3,3,3-pentafluoropropanesulfonate, 1,1,3,3,3-pentafluoro-2-(4-phenylbenzoyloxy)propanesulfonate, 1,1,3,3,3-pentafluoro-2-pivaloyloxypropanesulfonate, 2-cyclohexanecarbonyloxy-1,1,3,3,3-pentafluoropropanesulfonate, 1,1,3,3,3-pentafluoro-2-furoyloxypropanesulfonate, 2-naphthoyloxy-1,1,3,3,3-pentafluoropropanesulfonate, 2-(4-tert-butylbenzoyloxy)-1,1,3,3,3-pentafluoropropanesulfonate, 2-adamantanecarbonyloxy-1,1,3,3,3-pentafluoropropanesulfonate, 2-acetyloxy-1,1,3,3,3-pentafluoropropanesulfonate, 1,1,3,3,3-pentafluoro-2-hydroxypropanesulfonate, 1,1,3,3,3-pentafluoro-2-tosyloxypropanesulfonate, 1,1-difluoro-2-naphthylethanesulfonate, 1,1,2,2-tetrafluoro-2-(norbornan-2-yl)ethanesulfonate, and 1,1,2,2-tetrafluoro-2-(tetracyclo[4.4.0.1$^{2,5}$.1$^{7,10}$]dodec-3-en-8-yl)ethanesulfonate.

Exemplary bis(substituted alkylsulfonyl)imides include bistrifluoromethylsulfonylimide, bispentafluoroethylsulfonylimide, bisheptafluoropropylsulfonylimide, and 1,3-propylenebissulfonylimide. A typical tris(substituted alkylsulfonyl)methide is tristrifluoromethylsulfonylmethide. Iodonium salts based on combination of the foregoing examples are included.

Exemplary sulfonyldiazomethane compounds include bissulfonyldiazomethane compounds and sulfonylcarbonyldiazomethane compounds such as bis(ethylsulfonyl)diazomethane, bis(1-methylpropylsulfonyl)diazomethane, bis(2-methylpropylsulfonyl)diazomethane, bis(1,1-dimethylethylsulfonyl)diazomethane, bis(cyclohexylsulfonyl)diazomethane, bis(perfluoroisopropylsulfonyl)diazomethane, bis(phenylsulfonyl)diazomethane, bis(4-methylphenylsulfonyl)diazomethane, bis(2,4-dimethylphenylsulfonyl)diazomethane, bis(2-naphthylsulfonyl)diazomethane, bis(4-acetyloxyphenylsulfonyl)diazomethane, bis(4-methanesulfonyloxyphenylsulfonyl)diazomethane, bis(4-(4-toluenesulfonyloxy)phenylsulfonyl)diazomethane, bis(4-(n-hexyloxy)phenylsulfonyl)diazomethane, bis(2-methyl-4-(n-hexyloxy)phenylsulfonyl)diazomethane, bis(2,5-dimethyl-4-(n-hexyloxy)phenylsulfonyl)diazomethane, bis(3,5-dimethyl-4-(n-hexyloxy)phenylsulfonyl)diazomethane, bis(2-methyl-5-isopropyl-4-(n-hexyloxy)phenylsulfonyl)diazomethane, 4-methylphenylsulfonylbenzoyldiazomethane, tert-butylcarbonyl-4-methylphenylsulfonyldiazomethane, 2-naphthylsulfonylbenzoyldiazomethane, 4-methylphenylsulfonyl-2-naphthoyldiazomethane, methylsulfonylbenzoyldiazomethane, and tert-butoxycarbonyl-4-methylphenylsulfonyldiazomethane.

N-sulfonyloxyimide photoacid generators include combinations of imide skeletons with sulfonates. Exemplary imide skeletons are succinimide, naphthalene dicarboxylic acid imide, phthalimide, cyclohexyldicarboxylic acid imide, 5-norbornene-2,3-dicarboxylic acid imide, and 7-oxabicyclo[2.2.1]-5-heptene-2,3-dicarboxylic acid imide. Exemplary sulfonates include trifluoromethanesulfonate, pentafluoroethanesulfonate, nonafluorobutanesulfonate, dodecafluorohexanesulfonate, pentafluoroethylperfluorocyclohexanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, mesitylenesulfonate, 2,4,6-triisopropylbenzenesulfonate, toluenesulfonate, benzenesulfonate, naphthalenesulfonate, camphorsulfonate, octanesulfonate, dodecylbenzenesulfonate, butanesulfonate, methanesulfonate, 2-benzoyloxy-1,1,3,3,3-pentafluoropropanesulfonate, 1,1,3,3,3-pentafluoro-2-(4-phenylbenzoyloxy)propanesulfonate, 1,1,3,3,3-pentafluoro-2-pivaloyloxypropanesulfonate, 2-cyclohexanecarbonyloxy-1,1,3,3,3-pentafluoropropanesulfonate, 1,1,3,3,3-pentafluoro-2-furoyloxypropanesulfonate, 2-naphthoyloxy-1,1,3,3,3-pentafluoropropanesulfonate, 2-(4-tert-butylbenzoyloxy)-1,1,3,3,3-pentafluoropropanesulfonate, 2-adamantanecarbonyloxy-1,1,3,3,3-pentafluoropropanesulfonate, 2-acetyloxy-1,1,3,3,3-pentafluoropropanesulfonate, 1,1,3,3,3-pentafluoro-2-hydroxypropanesulfonate, 1,1,3,3,3-pentafluoro-2-tosyloxypropanesulfonate, 1,1-difluoro-2-naphthylethanesulfonate, 1,1,2,2-tetrafluoro-2-(norbornan-2-yl)ethanesulfonate, and 1,1,2,2-tetrafluoro-2-(tetracyclo[4.4.0.1$^{2,5}$.1$^{7,10}$]dodec-3-en-8-yl)ethanesulfonate.

Benzoinsulfonate photoacid generators include benzoin tosylate, benzoin mesylate, and benzoin butanesulfonate.

Pyrogallol trisulfonate photoacid generators include pyrogallol, phloroglucinol, catechol, resorcinol, and hydroquinone, in which all the hydroxyl groups are substituted by trifluoromethanesulfonate, pentafluoroethanesulfonate, nonafluorobutanesulfonate, dodecafluorohexanesulfonate, pentafluoroethylperfluorocyclohexanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, methanesulfonate, 2-benzoyloxy-1,1,3,3,3-pentafluoropropanesulfonate, 1,1,3,3,3-pentafluoro-2-(4-phenylbenzoyloxy)propanesulfonate, 1,1,3,3,3-pentafluoro-2-pivaloyloxypropanesulfonate, 2-cyclohexanecarbonyloxy-1,1,3,3,3-pentafluoropropanesulfonate, 1,1,3,3,3-pentafluoro-2-furoyloxypropanesulfonate, 2-naphthoyloxy-1,1,3,3,3-pentafluoropropanesulfonate, 2-(4-tert-butylbenzoyloxy)-1,1,3,3,3-pentafluoropropanesulfonate, 2-adamantanecarbonyloxy-1,1,3,3,3-pentafluoropropanesulfonate, 2-acetyloxy-1,1,3,3,3-pentafluoropropanesulfonate, 1,1,3,3,3-pentafluoro-2-hydroxypropanesulfonate, 1,1,3,3,3-pentafluoro-2-tosyloxypropanesulfonate, 1,1-difluoro-2-naphthylethanesulfonate, 1,1,2,2-tetrafluoro-2-(norbornan-2-yl)ethanesulfonate, and 1,1,2,2-tetrafluoro-2-(tetracyclo[4.4.0.1$^{2,5}$.1$^{7,10}$]dodec-3-en-8-yl)ethanesulfonate.

Nitrobenzyl sulfonate photoacid generators include 2,4-dinitrobenzyl sulfonate, 2-nitrobenzyl sulfonate, and 2,6-dinitrobenzyl sulfonate, with exemplary sulfonates including trifluoromethanesulfonate, pentafluoroethanesulfonate, nonafluorobutanesulfonate, dodecafluorohexanesulfonate, pentafluoroethylperfluorocyclohexanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, methanesulfonate, 2-benzoyloxy-1,1,3,3,3-pentafluoropropanesulfonate, 1,1,3,3,3-pentafluoro-2-(4-phenylbenzoyloxy)propanesulfonate, 1,1,3,3,3-pentafluoro-2-pivaloyloxypropanesulfonate, 2-cyclohexanecarbonyloxy-1,1,3,3,3-pentafluoropropanesulfonate, 1,1,3,3,3-pentafluoro-2-furoyloxypropanesulfonate, 2-naphthoyloxy-1,1,3,3,3-pentafluoropropanesulfonate, 2-(4-tert-butylbenzoyloxy)-1,1,3,3,3-pentafluoropropanesulfonate, 2-adamantanecarbonyloxy-1,1,3,3,3-pentafluoropropanesulfonate, 2-acetyloxy-1,1,3,3,3-pentafluoropropanesulfonate, 1,1,3,3,3-pentafluoro-2-hydroxypropanesulfonate, 1,1,3,3,3-pentafluoro-2-tosyloxypropanesulfonate, 1,1-difluoro-2-naphthylethanesulfonate, 1,1,2,2-tetrafluoro-2-(norbornan-2-yl)ethanesulfonate, and 1,1,2,2-tetrafluoro-2-(tetracyclo[4.4.0.1$^{2,5}$.1$^{7,10}$]dodec-3-en-8-yl)ethanesulfonate. Also useful are analogous nitrobenzyl sulfonate compounds in which the nitro group on the benzyl side is substituted by a trifluoromethyl group.

Sulfone photoacid generators include bis(phenylsulfonyl)methane, bis(4-methylphenylsulfonyl)methane, bis(2-naphthylsulfonyl)methane, 2,2-bis(phenylsulfonyl)propane, 2,2-bis(4-methylphenylsulfonyl)propane, 2,2-bis(2-naphthylsulfonyl)propane, 2-methyl-2-(p-toluenesulfonyl)

propiophenone, 2-cyclohexylcarbonyl-2-(p-toluenesulfonyl)propane, and 2,4-dimethyl-2-(p-toluenesulfonyl)pentan-3-one.

Photoacid generators in the form of glyoxime derivatives are described in Japanese Patent No. 2,906,999 and JP-A 9-301948 and include bis-O-(p-toluenesulfonyl)-α-dimethylglyoxime, bis-O-(p-toluenesulfonyl)-α-diphenylglyoxime, bis-O-(p-toluenesulfonyl)-α-dicyclohexylglyoxime, bis-O-(p-toluenesulfonyl)-2,3-pentanedioneglyoxime, bis-O-(n-butanesulfonyl)-α-dimethylglyoxime, bis-O-(n-butanesulfonyl)-α-diphenylglyoxime, bis-O-(n-butanesulfonyl)-α-dicyclohexylglyoxime, bis-O-(methanesulfonyl)-α-dimethylglyoxime, bis-O-(trifluoromethanesulfonyl)-α-dimethylglyoxime, bis-O-(2,2,2-trifluoroethanesulfonyl)-α-dimethylglyoxime, bis-O-(10-camphorsulfonyl)-α-dimethylglyoxime, bis-O-(benzenesulfonyl)-α-dimethylglyoxime, bis-O-(p-fluorobenzenesulfonyl)-α-dimethylglyoxime, bis-O-(p-trifluoromethylbenzenesulfonyl)-α-dimethylglyoxime, bis-O-(xylenesulfonyl)-α-dimethylglyoxime, bis-O-(trifluoromethanesulfonyl)-nioxime, bis-O-(2,2,2-trifluoroethanesulfonyl)-nioxime, bis-O-(10-camphorsulfonyl)-nioxime, bis-O-(benzenesulfonyl)-nioxime, bis-O-(p-fluorobenzenesulfonyl)-nioxime, bis-O-(p-trifluoromethylbenzenesulfonyl)-nioxime, and bis-O-(xylenesulfonyl)-nioxime.

Also included are the oxime sulfonates described in U.S. Pat. No. 6,004,724, for example, (5-(4-toluenesulfonyl)oxyimino-5H-thiophen-2-ylidene)phenylacetonitrile, (5-(10-camphorsulfonyl)oxyimino-5H-thiophen-2-ylidene)phenylacetonitrile, (5-n-octanesulfonyloxyimino-5H-thiophen-2-ylidene)phenylacetonitrile, (5-(4-toluenesulfonyl)oxyimino-5H-thiophen-2-ylidene)(2-methylphenyl)acetonitrile, (5-(10-camphorsulfonyl)oxyimino-5H-thiophen-2-ylidene)(2-methylphenyl)acetonitrile, (5-n-octanesulfonyloxyimino-5H-thiophen-2-ylidene)(2-methylphenyl)acetonitrile, etc.

Also included are the oxime sulfonates described in U.S. Pat. No. 6,916,591, for example, (5-(4-(4-toluenesulfonyloxy)benzenesulfonyl)oxyimino-5H-thiophen-2-ylidene)phenylacetonitrile and (5-(2,5-bis(4-toluenesulfonyloxy)benzenesulfonyl)oxyimino-5H-thiophen-2-ylidene)phenylacetonitrile.

Also included are the oxime sulfonates described in U.S. Pat. No. 6,261,738 and JP-A 2000-314956, for example, 2,2,2-trifluoro-1-phenyl-ethanone oxime-O-methylsulfonate; 2,2,2-trifluoro-1-phenyl-ethanone oxime-O-(10-camphorylsulfonate); 2,2,2-trifluoro-1-phenyl-ethanone oxime-O-(4-methoxyphenylsulfonate); 2,2,2-trifluoro-1-phenyl-ethanone oxime-O-(1-naphthylsulfonate); 2,2,2-trifluoro-1-phenylethanone oxime-O-(2-naphthylsulfonate); 2,2,2-trifluoro-1-phenyl-ethanone oxime-O-(2,4,6-trimethylphenylsulfonate); 2,2,2-trifluoro-1-(4-methylphenyl)-ethanone oxime-O-(10-camphorylsulfonate); 2,2,2-trifluoro-1-(4-methylphenyl)ethanone oxime-O-(methylsulfonate); 2,2,2-trifluoro-1-(2-methylphenyl)-ethanone oxime-O-(10-camphorylsulfonate); 2,2,2-trifluoro-1-(2,4-dimethylphenyl)-ethanone oxime-O-(10-camphorylsulfonate); 2,2,2-trifluoro-1-(2,4-dimethylphenyl)ethanone oxime-O-(1-naphthylsulfonate); 2,2,2-trifluoro-1-(2,4-dimethylphenyl)-ethanone oxime-O-(2-naphthylsulfonate); 2,2,2-trifluoro-1-(2,4,6-trimethylphenyl)-ethanone oxime-O-(10-camphorylsulfonate); 2,2,2-trifluoro-1-(2,4,6-trimethylphenyl)-ethanone oxime-O-(1-naphthylsulfonate); 2,2,2-trifluoro-1-(2,4,6-trimethylphenyl)-ethanone oxime-O-(2-naphthylsulfonate); 2,2,2-trifluoro-1-(4-methoxyphenyl)-ethanone oxime-O-methylsulfonate; 2,2,2-trifluoro-1-(4-methylthiophenyl)-ethanone oxime-O-methylsulfonate; 2,2,2-trifluoro-1-(3,4-dimethoxyphenyl)-ethanone oxime-O-methylsulfonate; 2,2,3,3,4,4,4-heptafluoro-1-phenyl-butanone oxime-O-(10-camphorylsulfonate); 2,2,2-trifluoro-1-(phenyl)-ethanone oxime-O-methylsulfonate; 2,2,2-trifluoro-1-(phenyl)-ethanone oxime-O-10-camphorylsulfonate; 2,2,2-trifluoro-1-(phenyl)-ethanone oxime-O-(4-methoxyphenyl)sulfonate; 2,2,2-trifluoro-1-(phenyl)-ethanone oxime-O-(1-naphthyl)sulfonate; 2,2,2-trifluoro-1-(phenyl)-ethanone oxime-O-(2-naphthyl)sulfonate; 2,2,2-trifluoro-1-(phenyl)-ethanone oxime-O-(2,4,6-trimethylphenyl)sulfonate; 2,2,2-trifluoro-1-(4-methylphenyl)-ethanone oxime-O-(10-camphoryl)sulfonate; 2,2,2-trifluoro-1-(4-methylphenyl)-ethanone oxime-O-methylsulfonate; 2,2,2-trifluoro-1-(2-methylphenyl)-ethanone oxime-O-(10-camphoryl)sulfonate; 2,2,2-trifluoro-1-(2,4-dimethylphenyl)-ethanone oxime-O-(1-naphthyl)sulfonate; 2,2,2-trifluoro-1-(2,4-dimethylphenyl)-ethanone oxime-O-(2-naphthyl)sulfonate; 2,2,2-trifluoro-1-(2,4,6-trimethylphenyl)-ethanone oxime-O-(10-camphoryl)sulfonate; 2,2,2-trifluoro-1-(2,4,6-trimethylphenyl)-ethanone oxime-O-(1-naphthyl)sulfonate; 2,2,2-trifluoro-1-(2,4,6-trimethylphenyl)-ethanone oxime-O-(2-naphthyl)sulfonate; 2,2,2-trifluoro-1-(4-methoxyphenyl)-ethanone oxime-O-methylsulfonate; 2,2,2-trifluoro-1-(4-thiomethylphenyl)-ethanone oxime-O-methylsulfonate; 2,2,2-trifluoro-1-(3,4-dimethoxyphenyl)-ethanone oxime-O-methylsulfonate; 2,2,2-trifluoro-1-(4-methoxyphenyl)-ethanone bxime-O-(4-methylphenyl)sulfonate; 2,2,2-trifluoro-1-(4-methoxyphenyl)-ethanone oxime-O-(4-methoxyphenyl)sulfonate; 2,2,2-trifluoro-1-(4-methoxyphenyl)-ethanone oxime-O-(4-dodecylphenyl)-sulfonate; 2,2,2-trifluoro-1-(4-methoxyphenyl)-ethanone oxime-O-octylsulfonate; 2,2,2-trifluoro-1-(4-thiomethyl-phenyl)-ethanone oxime-O-(4-methoxyphenyl)sulfonate; 2,2,2-trifluoro-1-(4-thiomethylphenyl)-ethanone oxime-O-(4-dodecylphenyl)sulfonate; 2,2,2-trifluoro-1-(4-thiomethylphenyl)-ethanone oxime-O-octylsulfonate; 2,2,2-trifluoro-1-(4-thiomethylphenyl)-ethanone oxime-O-(2-naphthyl)sulfonate; 2,2,2-trifluoro-1-(2-methylphenyl)-ethanone oxime-O-methylsulfonate; 2,2,2-trifluoro-1-(4-methylphenyl)ethanone oxime-O-phenylsulfonate; 2,2,2-trifluoro-1-(4-chlorophenyl)ethanone oxime-O-phenylsulfonate; 2,2,3,3,4,4,4-heptafluoro-1-(phenyl)-butanone oxime-O-(10-camphoryl)sulfonate; 2,2,2-trifluoro-1-naphthyl-ethanone oxime-O-methylsulfonate; 2,2,2-trifluoro-2-naphthyl-ethanone oxime-O-methylsulfonate; 2,2,2-trifluoro-1-[4-benzylphenyl]-ethanone oxime-O-methylsulfonate; 2,2,2-trifluoro-1-[4-(phenyl-1,4-dioxa-but-1-yl)phenyl]-ethanone oxime-O-methylsulfonate; 2,2,2-trifluoro-1-naphthyl-ethanone oxime-O-propylsulfonate; 2,2,2-trifluoro-2-naphthyl-ethanone oxime-O-propylsulfonate; 2,2,2-trifluoro-1-[4-benzylphenyl]-ethanone oxime-O-propyl-sulfonate; 2,2,2-trifluoro-1-[4-methylsulfonylphenyl]-ethanone oxime-O-propylsulfonate; 1,3-bis[1-(4-phenoxyphenyl)-2,2,2-trifluoroethanone oxime-O-sulfonyl]phenyl; 2,2,2-trifluoro-1-[4-methylsulfonyloxyphenyl]-ethanone oxime-O-propylsulfonate; 2,2,2-trifluoro-1-[4-methylcarbonyloxyphenyl]-ethanone oxime-O-propylsulfonate; 2,2,2-trifluoro-1-[6H,7H-5,8-dioxonaphth-2-yl]-ethanone oxime-O-propylsulfonate; 2,2,2-trifluoro-1-[4-methoxycarbonylmethoxyphenyl]-ethanone oxime-O-propylsulfonate; 2,2,2-trifluoro-1-[4-(methoxycarbonyl)-(4-amino-1-oxa-pent-1-yl)-phenyl]-ethanone oxime-O-propylsulfonate; 2,2,2-trifluoro-1-[3,5-dimethyl-4-ethoxyphenyl]-ethanone oxime-O-propylsulfonate; 2,2,2-trifluoro-1-[4-benzyloxyphenyl]-ethanone oxime-O- propylsulfonate; 2,2,2-trifluoro-1-[2-thiophenyl]-ethanone oxime-O-propylsulfonate; 2,2,2-trifluoro-1-[1-dioxathiophen-2-yl)]-ethanone oxime-O-propylsulfonate; 2,2,2-trifluoro-1-(4-(3-(4-(2,2,2-trifluoro-1-(trifluoromethanesulfonyloxyimino)-ethyl)-phenoxy)-propoxy)-phenyl) ethanone oxime(trifluoromethanesulfonate); 2,2,2-trifluoro-1-(4-(3-(4-(2,2,2-trifluoro-1-(1-propanesulfonyloxyimino)-ethyl)-phenoxy)-propoxy)-phenyl)ethanone oxime(1-propanesulfonate); and 2,2,2-trifluoro-1-(4-(3-(4-(2,2,2-trifluoro-1-(1-butanesulfonyloxyimino)-ethyl)-phenoxy)-propoxy)-phenyl)ethanone oxime(1-butanesulfonate). Also included are the oxime sulfonates described in U.S. Pat. No. 6,916,591, for example, 2,2,2-trifluoro-1-(4-(3-(4-(2,2,2-trifluoro-1-(4-(4-methylphenylsulfonyloxy)phenylsulfonyloxyimino)-ethyl)-phenoxy)-propoxy)-phenyl)ethanone oxime(4-(4-methylphenylsulfonyloxy)-phenylsulfonate) and 2,2,2-trifluoro-1-(4-(3-(4-(2,2,2-trifluoro-1-(2,5-bis(4-methylphenylsulfonyloxy)-benzenesulfonyloxy)phenylsulfonyloxyimino)-ethyl)-phenoxy)-propoxy)-phenyl)ethanone oxime(2,5-bis(4-methylphenylsulfonyloxy) benzenesulfonyloxy)phenylsulfonate).

Also included are the oxime sulfonates described in JP-A 9-95479 and JP-A 9-230588 and the references cited therein, for example, α-(p-toluenesulfonyloxyimino)-phenylacetonitrile, α-(p-chlorobenzenesulfonyloxyimino)-phenylacetonitrile, α-(4-nitrobenzenesulfonyloxyimino)-phenylacetonitrile, α-(4-nitro-2-trifluoromethylbenzenesulfonyloxyimino)-phenylacetonitrile, α-(benzenesulfonyloxyimino)-4-chlorophenylacetonitrile, α-(benzenesulfonyloxyimino)-2,4-dichlorophenylacetonitrile, α-(benzenesulfonyloxyimino)-2,6-dichlorophenylacetonitrile, α-(benzenesulfonyloxyimino)-4-methoxyphenylacetonitrile, α-(2-chlorobenzenesulfonyloxyimino)-4-methoxyphenylacetonitrile, α-(benzenesulfonyloxyimino)-2-thienylacetonitrile, α-(4-dodecylbenzenesulfonyloxyimino)-phenylacetonitrile, α-[(4-toluenesulfonyloxyimino)-4-methoxyphenyl]acetonitrile, α-[(dodecylbenzenesulfonyloxyimino)-4-methoxyphenyl] acetonitrile, α-(tosyloxyimino)-3-thienylacetonitrile, α-(methylsulfonyloxyimino)-1-cyclopentenylacetonitrile, α-(ethylsulfonyloxyimino)-1-cyclopentenylacetonitrile, α-(isopropylsulfonyloxyimino)-1-cyclopentenylacetonitrile, α-(n-butylsulfonyloxyimino)-1-cyclopentenylacetonitrile, α-(ethylsulfonyloxyimino)-1-cyclohexenylacetonitrile, α-(isopropylsulfonyloxyimino)-1-cyclohexenylacetonitrile, and α-(n-butylsulfonyloxyimino)-1-cyclohexenylacetonitrile.

Also included are oxime sulfonates having the formula:

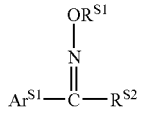

wherein $R^{s1}$ is a substituted or unsubstituted haloalkylsulfonyl or halobenzenesulfonyl group of 1 to 10 carbon atoms, $R^{s2}$ is a haloalkyl group of 1 to 11 carbon atoms, and $Ar^{s1}$ is a substituted or unsubstituted aromatic or hetero-aromatic group, as described in WO 2004/074242. Examples include 2-[2,2,3,3,4,4,5,5-octafluoro-1-(nonafluorobutylsulfonyloxyimino)-pentyl]-fluorene, 2-[2,2,3,3,4,4-pentafluoro-1-(nonafluorobutylsulfonyloxyimino)-butyl]-fluorene, 2-[2,2,3,3,4,4,5,5,6,6-decafluoro-1-(nonafluorobutylsulfonyloxyimino)-hexyl]-fluorene, 2-[2,2,3,3,4,4,5,5-octafluoro-1-(nonafluorobutylsulfonyloxyimino)-pentyl]-4-biphenyl, 2-[2,2,3,3,4,4-pentafluoro-1-(nonafluorobutylsulfonyloxyimino)-butyl]-4-biphenyl, and 2-[2,2,3,3,4,4,5,5,6,6-decafluoro-1-(nonafluorobutylsulfonyloxyimino)-hexyl]-4-biphenyl.

Suitable bisoxime sulfonates include those described in JP-A 9-208554, for example, bis(α-(4-toluenesulfonyloxy) imino)-p-phenylenediacetonitrile, bis(α-(benzenesulfonyloxy)imino)-p-phenylenediacetonitrile, bis(α-(methanesulfonyloxy)imino)-p-phenylenediacetonitrile, bis(α-(butanesulfonyloxy)imino)-p-phenylenediacetonitrile, bis (α-(10-camphorsulfonyloxy)imino)-p-phenylenediacetonitrile, bis(α-(4-toluenesulfonyloxy) imino)-p-phenylenediacetonitrile, bis(α-(trifluoromethanesulfonyloxy)imino)-p-phenylenediacetonitrile, bis(α-(4-methoxybenzenesulfonyloxy)imino)-p-phenylenediacetonitrile, bis(α-(4-toluenesulfonyloxy) imino)-m-phenylenediacetonitrile, bis(α-(benzenesulfonyloxy)imino)-m-phenylenediacetonitrile, bis (α-(methanesulfonyloxy)imino)-m-phenylenediacetonitrile, bis(α-(butanesulfonyloxy)imino)-m-phenylenediacetonitrile, bis(α-(10-camphorsulfonyloxy)imino)-m-phenylenediacetonitrile, bis(α-(4-toluenesulfonyloxy)imino)-m-phenylenediacetonitrile, bis(α-(trifluoromethanesulfonyloxy) imino)-m-phenylenediacetonitrile, bis(α-(4-methoxybenzenesulfonyloxy)imino)-m-phenylenediacetonitrile, etc.

Of these, preferred photoacid generators are sulfonium salts, bissulfonyldiazomethanes, N-sulfonyloxyimides, oxime-O-sulfonates and glyoxime derivatives. More preferred photoacid generators are sulfonium salts, bissulfonyldiazomethanes, N-sulfonyloxyimides, and oxime-O-sulfonates. Typical examples include triphenylsulfonium p-toluenesulfonate, triphenylsulfonium camphorsulfonate, triphenylsulfonium pentafluorobenzenesulfonate, triphenylsulfonium nonafluorobutanesulfonate, triphenylsulfonium 4-(4'-toluenesulfonyloxy)benzenesulfonate, triphenylsulfonium 2,4,6-triisopropylbenzenesulfonate, 4-tert-butoxyphenyldiphenylsulfonium p-toluenesulfonate, 4-tert-butoxyphenyldiphenylsulfonium camphorsulfonate, 4-tert-butoxyphenyldiphenylsulfonium 4-(4'-toluenesulfonyloxy) benzenesulfonate, tris(4-methylphenyl)sulfonium camphorsulfonate, tris(4-tert-butylphenyl)sulfonium camphorsulfonate, 4-tert-butylphenyldiphenylsulfonium camphorsulfonate, 4-tert-butylphenyldiphenylsulfonium nonafluoro-1-butanesulfonate, 4-tert-butylphenyldiphenylsulfonium pentafluoroethylperfluorocyclohexanesulfonate, 4-tert-butylphenyldiphenylsulfonium perfluoro-1-octanesulfonate, triphenylsulfonium 1,1-difluoro-2-naphthyl-ethanesulfonate, triphenylsulfonium 1,1,2,2-tetrafluoro-2-(norbornan-2-yl)ethanesulfonate, bis(tert-butylsulfonyl)diazomethane, bis(cyclohexylsulfonyl)diazomethane, bis(2,4-dimethylphenylsulfonyl)diazomethane, bis(4-(n-hexyloxy) phenylsulfonyl)diazomethane, bis(2-methyl-4-(n-hexyloxy) phenylsulfonyl)diazomethane, bis(2,5-dimethyl-4-(n-hexyloxy)phenylsulfonyl)diazomethane, bis(3,5-dimethyl-4-(n-hexyloxy)phenylsulfonyl)diazomethane, bis(2-methyl-5-isopropyl-4-(n-hexyloxy)phenylsulfonyl)diazomethane, bis(4-tert-butylphenylsulfonyl)diazomethane, N-camphorsulfonyloxy-5-norbornene-2,3-dicarboxylic acid imide, N-p-toluenesulfonyloxy-5-norbornene-2,3-dicarboxylic acid imide, 2-[2,2,3,3,4,4,5,5-octafluoro-1-(nonafluorobutylsulfonyloxyimino)-pentyl]-fluorene, 2-[2,2,3,3,4,4-pentafluoro-1-(nonafluorobutylsulfonyloxyimino)-butyl]-fluorene, and 2-[2,2,3,3,4,4,5,5,6,6-decafluoro-1-(nonafluorobutylsulfonyloxyimino)-hexyl]-fluorene.

In the chemically amplified positive resist composition, an appropriate amount of the photoacid generator (B) is, but not limited to, 0.1 to 20 parts, and especially 0.1 to 10 parts by weight per 100 parts by weight of the base resin. If the amount of the photoacid generator is up to 20 phr, the resulting photoresist film has a sufficiently high transmittance to minimize a risk of degrading resolution.

The photoacid generators may be used alone or in admixture of two or more. The transmittance of the resist film can be controlled by using a photoacid generator having a low transmittance at the exposure wavelength and adjusting the amount of the photoacid generator added.

In the resist composition, there may be added a compound which is decomposed with an acid to generate another acid, that is, acid-amplifier compound. For these compounds, reference should be made to J. Photopolym. Sci. and Tech., 8, 43-44, 45-46 (1995), and ibid., 9, 29-30 (1996).

Examples of the acid-amplifier compound include tert-butyl-2-methyl-2-tosyloxymethyl acetoacetate and 2-phenyl-2-(2-tosyloxyethyl)-1,3-dioxolane, but are not limited thereto. Of well-known photoacid generators, many of those compounds having poor stability, especially poor thermal stability exhibit an acid amplifier-like behavior.

In the resist composition, an appropriate amount of the acid-amplifier compound is up to 2 parts, and preferably up to 1 part by weight per 100 parts by weight of the base polymer. Up to 2 phr of the acid-amplifier compound allows for diffusion control, minimizing a risk of degrading resolution and pattern profile.

In addition to components (A) and (B) as well as the additive polymer, the resist composition of the invention may further comprise (C) an organic solvent, (D) a basic compound, (F) a dissolution inhibitor, a surfactant, and other components.

Component C

The organic solvent (C) used herein may be any organic solvent in which the base resin, acid generator, and other components are soluble. Illustrative, non-limiting, examples of the organic solvent include ketones such as cyclohexanone and methyl-2-n-amyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone. These solvents may be used alone or in combinations of two or more thereof. Of the above organic solvents, it is recommended to use diethylene glycol dimethyl ether, 1-ethoxy-2-propanol, propylene glycol monomethyl ether acetate, and mixtures thereof because the acid generator is most soluble therein.

An appropriate amount of the organic solvent used is about 200 to 3,000 parts, especially about 400 to 2,500 parts by weight per 100 parts by weight of the base resin.

Component D

In the resist composition, an organic nitrogen-containing compound or compounds may be compounded as the basic compound (D). The organic nitrogen-containing compound used herein is preferably a compound capable of suppressing the rate of diffusion when the acid generated by the acid generator diffuses within the resist film. The inclusion of organic nitrogen-containing compound holds down the rate of acid diffusion within the resist film, resulting in better resolution. In addition, it suppresses changes in sensitivity following exposure and reduces substrate and environment dependence, as well as improving the exposure latitude and the pattern profile.

Suitable organic nitrogen-containing compounds include primary, secondary, and tertiary aliphatic amines, mixed amines, aromatic amines, heterocyclic amines, nitrogen-containing compounds having carboxyl group, nitrogen-containing compounds having sulfonyl group, nitrogen-containing compounds having hydroxyl group, nitrogen-containing compounds having hydroxyphenyl group, alcoholic nitrogen-containing compounds, amide derivatives, imide derivatives, and carbamate derivatives.

Examples of suitable primary aliphatic amines include ammonia, methylamine, ethylamine, n-propylamine, isopropylamine, n-butylamine, isobutylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine. Examples of suitable secondary aliphatic amines include dimethylamine, diethylamine, di-n-propylamine, diisopropylamine, di-n-butylamine, diisobutylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine. Examples of suitable tertiary aliphatic amines include trimethylamine, triethylamine, tri-n-propylamine, triisopropylamine, tri-n-butylamine, triisobutylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of suitable mixed amines include dimethylethylamine, methylethylpropylamine, benzylamine, phenethylamine, and benzyldimethylamine. Examples of suitable aromatic and heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, diaminonaphthalene, pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 4-pyrrolidinopyridine, 2-(1-ethylpropyl) pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable nitrogen-containing compounds having carboxyl group include aminobenzoic acid, indolecarboxylic acid, and amino acid derivatives (e.g. nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine). Examples of suitable nitrogen-containing compounds having sulfonyl group include 3-pyridinesulfonic acid and pyridinium p-toluenesulfonate. Examples of suitable nitrogen-containing compounds having hydroxyl group, nitrogen-containing compounds having hydroxyphenyl group, and alcoholic nitrogen-containing compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidine ethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide. Examples of suitable amide derivatives include formamide, N-methylformamide, N,N-dimethylformamide, acetamide, N-methylacetamide, N,N-dimethylacetamide, propionamide, benzamide, and 1-cyclohexylpyrrolidone. Suitable imide derivatives include phthalimide, succinimide, and maleimide. Suitable carbamate derivatives include N-t-butoxycarbonyl-N,N-dicyclohexylamine, N-t-butoxycarbonylbenzimidazole and oxazolidinone.

In addition, organic nitrogen-containing compounds of the following general formula (B)-1 may also be included alone or in admixture.

$$N(X)_n(Y)_{3-n} \quad (B)\text{-}1$$

In the formula, n is equal to 1, 2 or 3; side chain Y is independently hydrogen or a straight, branched or cyclic alkyl group of 1 to 20 carbon atoms which may contain an ether or hydroxyl group; and side chain X is independently selected from groups of the following general formulas (X1) to (X3), and two or three X's may bond together to form a ring.

In the formulas, $R^{300}$, $R^{302}$ and $R^{305}$ are independently straight or branched alkylene groups of 1 to 4 carbon atoms; $R^{301}$ and $R^{304}$ are independently hydrogen, straight, branched or cyclic alkyl groups of 1 to 20 carbon atoms, which may contain at least one hydroxyl, ether, ester group or lactone ring; $R^{303}$ is a single bond or a straight or branched alkylene group of 1 to 4 carbon atoms; and $R^{306}$ is a straight, branched or cyclic alkyl group of 1 to 20 carbon atoms, which may contain at least one hydroxyl, ether, ester group or lactone ring.

Illustrative examples of the compounds of formula (B)-1 include tris(2-methoxymethoxyethyl)amine, tris{2-(2-methoxyethoxy)ethyl}amine, tris{2-(2-methoxyethoxymethoxy) ethyl}amine, tris{2-(1-methoxyethoxy)ethyl}amine, tris{2-(1-ethoxyethoxy)ethyl}amine, tris{2-(1-ethoxypropoxy) ethyl}amine, tris[2-{2-(2-hydroxyethoxy)ethoxy}ethyl] amine, 4,7,13,16,21,24-hexaoxa-1,10-diazabicyclo[8.8.8] hexacosane, 4,7,13,18-tetraoxa-1,10-diazabicyclo[8.5.5] eicosane, 1,4,10,13-tetraoxa-7,16-diazabicyclooctadecane, 1-aza-12-crown-4, 1-aza-15-crown-5, 1-aza-18-crown-6, tris (2-formyloxyethyl)amine, tris(2-acetoxyethyl)amine, tris(2-propionyloxyethyl)amine, tris(2-butyryloxyethyl)amine, tris (2-isobutyryloxyethyl)amine, tris(2-valeryloxyethyl)amine, tris(2-pivaloyloxyethyl)amine, N,N-bis(2-acetoxyethyl)-2-(acetoxyacetoxy)ethylamine, tris(2-methoxycarbonyloxyethyl)amine, tris(2-tert-butoxycarbonyloxyethyl)amine, tris [2-(2-oxopropoxy)ethyl]amine, tris[2-(methoxycarbonylmethyl)oxyethyl]amine, tris[2-(tert-butoxycarbonylmethyloxy)ethyl]amine, tris[2-(cyclohexyloxycarbonylmethyloxy)ethyl]amine, tris(2-methoxycarbonylethyl)amine, tris(2-ethoxycarbonylethyl) amine, N,N-bis(2-hydroxyethyl)-2-(methoxycarbonyl) ethylamine, N,N-bis(2-acetoxyethyl)-2-(methoxycarbonyl) ethylamine, N,N-bis(2-hydroxyethyl)-2-(ethoxycarbonyl) ethylamine, N,N-bis(2-acetoxyethyl)-2-(ethoxycarbonyl) ethylamine, N,N-bis(2-hydroxyethyl)-2-(2-methoxyethoxycarbonyl)ethylamine, N,N-bis(2-acetoxyethyl)-2-(2-methoxyethoxycarbonyl)ethylamine, N,N-bis(2-hydroxyethyl)-2-(2-hydroxyethoxycarbonyl) ethylamine, N,N-bis(2-acetoxyethyl)-2-(2-acetoxyethoxycarbonyl)ethylamine, N,N-bis(2-hydroxyethyl)-2-[(methoxycarbonyl)methoxycarbonyl]-ethylamine, N,N-bis(2-acetoxyethyl)-2-[(methoxycarbonyl)methoxycarbonyl]-ethylamine, N,N-bis(2-hydroxyethyl)-2-(2-oxopropoxycarbonyl)ethylamine, N,N-bis(2-acetoxyethyl)-2-(2-oxopropoxycarbonyl)ethylamine, N,N-bis(2-hydroxyethyl)-2-(tetrahydrofurfuryloxycarbonyl)-ethylamine, N,N-bis(2-acetoxyethyl)-2-(tetrahydrofurfuryloxycarbonyl)-ethylamine, N,N-bis(2-hydroxyethyl)-2-[(2-oxotetrahydrofuran-3-yl)oxycarbonyl] ethylamine, N,N-bis(2-acetoxyethyl)-2-[(2- oxotetrahydrofuran-3-yl)oxycarbonyl]ethylamine, N,N-bis(2-hydroxyethyl)-2-(4-hydroxybutoxycarbonyl)ethylamine, N,N-bis(2-formyloxyethyl)-2-(4-formyloxybutoxycarbonyl)ethylamine, N,N-bis(2-formyloxyethyl)-2-(2-formyloxyethoxycarbonyl)ethylamine, N,N-bis(2-methoxyethyl)-2-(methoxycarbonyl)ethylamine, N-(2-hydroxyethyl)-bis[2-(methoxycarbonyl)ethyl]amine, N-(2-acetoxyethyl)-bis[2-(methoxycarbonyl)ethyl]amine, N-(2-hydroxyethyl)-bis[2-(ethoxycarbonyl)ethyl]amine, N-(2-acetoxyethyl)-bis[2-(ethoxycarbonyl)ethyl]amine, N-(3-hydroxy-1-propyl)-bis[2-(methoxycarbonyl)ethyl]amine, N-(3-acetoxy-1-propyl)-bis[2-(methoxycarbonyl)ethyl]amine, N-(2-methoxyethyl)-bis[2-(methoxycarbonyl)ethyl]amine, N-butyl-bis[2-(methoxycarbonyl)ethyl]amine, N-butyl-bis[2-(2-methoxyethoxycarbonyl)ethyl]amine, N-methyl-bis(2-acetoxyethyl)amine, N-ethyl-bis(2-acetoxyethyl)amine, N-methyl-bis(2-pivaloyloxyethyl)amine, N-ethyl-bis[2-(methoxycarbonyloxy)ethyl]amine, N-ethyl-bis[2-(tert-butoxycarbonyloxy)ethyl]amine, tris(methoxycarbonylmethyl)amine, tris(ethoxycarbonylmethyl)amine, N-butyl-bis(methoxycarbonylmethyl)amine, N-hexyl-bis(methoxycarbonylmethyl)amine, and β-(diethylamino)-δ-valerolactone.

Also useful are one or more organic nitrogen-containing compounds having cyclic structure represented by the following general formula (B)-2.

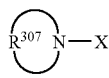

(B)-2

Herein X is as defined above, and $R^{307}$ is a straight or branched alkylene group of 2 to 20 carbon atoms which may contain one or more carbonyl, ether, ester or sulfide groups.

Illustrative examples of the organic nitrogen-containing compounds having formula (B)-2 include 1-[2-(methoxymethoxy)ethyl]pyrrolidine, 1-[2-(methoxymethoxy)ethyl]piperidine, 4-[2-(methoxymethoxy)ethyl]morpholine, 1-[2-[(2-methoxyethoxy)methoxy]ethyl]pyrrolidine, 1-[2-[(2-methoxyethoxy)methoxy]ethyl]piperidine, 4-[2-[(2-methoxyethoxy)methoxy]ethyl]morpholine, 2-(1-pyrrolidinyl)ethyl acetate, 2-piperidinoethyl acetate, 2-morpholinoethyl acetate, 2-(1-pyrrolidinyl)ethyl formate, 2-piperidinoethyl propionate, 2-morpholinoethyl acetoxyacetate, 2-(1-pyrrolidinyl)ethyl methoxyacetate, 4-[2-(methoxycarbonyloxy)ethyl]morpholine, 1-[2-(t-butoxycarbonyloxy)ethyl]piperidine, 4-[2-(2-methoxyethoxycarbonyloxy)ethyl]morpholine, methyl 3-(1-pyrrolidinyl)propionate, methyl 3-piperidinopropionate, methyl 3-morpholinopropionate, methyl 3-(thiomorpholino)propionate, methyl 2-methyl-3-(1-pyrrolidinyl)propionate, ethyl 3-morpholinopropionate, methoxycarbonylmethyl 3-piperidinopropionate, 2-hydroxyethyl 3-(1-pyrrolidinyl)propionate, 2-acetoxyethyl 3-morpholinopropionate, 2-oxotetrahydrofuran-3-yl 3-(1-pyrrolidinyl)propionate, tetrahydrofurfuryl 3-morpholinopropionate, glycidyl 3-piperidinopropionate, 2-methoxyethyl 3-morpholinopropionate, 2-(2-methoxyethoxy)ethyl 3-(1-pyrrolidinyl)propionate, butyl 3-morpholinopropionate, cyclohexyl 3-piperidinopropionate, α-(1-pyrrolidinyl)methyl-γ-butyrolactone, β-piperidino-γ-butyrolactone, β-morpholino-δ-valerolactone, methyl 1-pyrrolidinylacetate, methyl piperidinoacetate, methyl morpholinoacetate, methyl thiomorpholinoacetate, ethyl 1-pyrrolidinylacetate, 2-methoxyethyl morpholinoacetate, 2-morpholinoethyl 2-methoxyacetate, 2-morpholinoethyl 2-(2-methoxyethoxy)acetate, 2-morpholinoethyl 2-[2-(2-methoxyethoxy)ethoxy]acetate, 2-morpholinoethyl hexanoate, 2-morpholinoethyl octanoate, 2-morpholinoethyl decanoate, 2-morpholinoethyl laurate, 2-morpholinoethyl myristate, 2-morpholinoethyl palmitate, and 2-morpholinoethyl stearate.

Also, one or more organic nitrogen-containing compounds having cyano group represented by the following general formulae (B)-3 to (B)-6 may be blended.

(B)-3

(B)-4

(B)-5

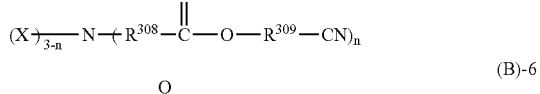

(B)-6

Herein, X, $R^{307}$ and n are as defined above, and $R^{308}$ and $R^{309}$ are each independently a straight or branched alkylene group of 1 to 4 carbon atoms.

Illustrative examples of the organic nitrogen-containing compounds having cyano represented by formulae (B)-3 to (B)-6 include 3-(diethylamino)propiononitrile, N,N-bis(2-hydroxyethyl)-3-aminopropiononitrile, N,N-bis(2-acetoxyethyl)-3-aminopropiononitrile, N,N-bis(2-formyloxyethyl)-3-aminopropiononitrile, N,N-bis(2-methoxyethyl)-3-aminopropiononitrile, N,N-bis[2-(methoxymethoxy)ethyl]-3-aminopropiononitrile, methyl N-(2-cyanoethyl)-N-(2-methoxyethyl)-3-aminopropionate, methyl N-(2-cyanoethyl)-N-(2-hydroxyethyl)-3-aminopropionate, methyl N-(2-acetoxyethyl)-N-(2-cyanoethyl)-3-aminopropionate, N-(2-cyanoethyl)-N-ethyl-3-aminopropiononitrile, N-(2-cyanoethyl)-N-(2-hydroxyethyl)-3-aminopropiononitrile, N-(2-acetoxyethyl)-N-(2-cyanoethyl)-3-aminopropiononitrile, N-(2-cyanoethyl)-N-(2-formyloxyethyl)-3-aminopropiononitrile, N-(2-cyanoethyl)-N-(2-methoxyethyl)-3-aminopropiononitrile, N-(2-cyanoethyl)-N-[2-(methoxymethoxy)ethyl]-3-aminopropiononitrile, N-(2-cyanoethyl)-N-(3-hydroxy-1-propyl)-3-aminopropiononitrile, N-(3-acetoxy-1-propyl)-N-(2-cyanoethyl)-3-aminopropiononitrile, N-(2-cyanoethyl)-N-(3-formyloxy-1-propyl)-3-aminopropiononitrile, N-(2-cyanoethyl)-N-tetrahydrofurfuryl-3-aminopropiononitrile, N,N-bis(2-cyanoethyl)-3-aminopropiononitrile, diethylaminoacetonitrile, N,N-bis(2-hydroxyethyl)aminoacetonitrile, N,N-bis(2-acetoxyethyl)aminoacetonitrile, N,N-bis(2-formyloxyethyl)aminoacetonitrile, N,N-bis(2-methoxyethyl)aminoacetonitrile, N,N-bis[2-(methoxymethoxy)ethyl]aminoacetonitrile, methyl N-cyanomethyl-N-(2-methoxyethyl)-3-aminopropionate, methyl N-cyanomethyl-N-(2-hydroxyethyl)-3-aminopropionate, methyl N-(2-acetoxyethyl)-N-cyanomethyl-3-aminopropionate, N-cyanomethyl-N-(2-hydroxyethyl)aminoacetonitrile, N-(2-acetoxyethyl)-N-(cyanomethyl)aminoacetonitrile, N-cyanomethyl-N-(2-formyloxyethyl)aminoacetonitrile, N-cyanomethyl-N-(2-methoxyethyl)aminoacetonitrile, N-cyanomethyl-N-[2-(methoxymethoxy)ethyl]aminoacetonitrile, N-cyanomethyl-N-(3-hydroxy-1-propyl)aminoacetonitrile, N-(3-acetoxy-1-propyl)-N-(cyanomethyl)aminoacetonitrile, N-cyanomethyl-N-(3-formyloxy-1-propyl) aminoacetonitrile, N,N-bis(cyanomethyl)aminoacetonitrile, 1-pyrrolidinepropiononitrile, 1-piperidinepropiononitrile, 4-morpholinepropiononitrile, 1-pyrrolidineacetonitrile, 1-piperidineacetonitrile, 4-morpholineacetonitrile, cyanomethyl 3-diethylaminopropionate, cyanomethyl N,N-bis(2-hydroxyethyl)-3-aminopropionate, cyanomethyl N,N-bis(2-acetoxyethyl)-3-aminopropionate, cyanomethyl N,N-bis(2-formyloxyethyl)-3-aminopropionate, cyanomethyl N,N-bis (2-methoxyethyl)-3-aminopropionate, cyanomethyl N,N-bis [2-(methoxymethoxy)ethyl]-3-aminopropionate, 2-cyanoethyl 3-diethylaminopropionate, 2-cyanoethyl N,N-bis(2-hydroxyethyl)-3-aminopropionate, 2-cyanoethyl N,N-bis(2-acetoxyethyl)-3-aminopropionate, 2-cyanoethyl N,N-bis(2-formyloxyethyl)-3-aminopropionate, 2-cyanoethyl N,N-bis(2-methoxyethyl)-3-aminopropionate, 2-cyanoethyl N,N-bis[2-(methoxymethoxy)ethyl]-3-aminopropionate, cyanomethyl 1-pyrrolidinepropionate, cyanomethyl 1-piperidinepropionate, cyanomethyl 4-morpholinepropionate, 2-cyanoethyl 1-pyrrolidinepropionate, 2-cyanoethyl 1-piperidinepropionate, and 2-cyanoethyl 4-morpholinepropionate.

Also included are organic nitrogen-containing compounds having an imidazole structure and a polar functional group, represented by the general formula (B)-7.

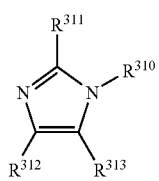

(B)-7

Herein, $R^{310}$ is a straight, branched or cyclic alkyl group of 2 to 20 carbon atoms bearing at least one polar functional group selected from among hydroxyl, carbonyl, ester, ether, sulfide, carbonate, cyano and acetal groups; $R^{311}$, $R^{312}$ and $R^{313}$ are each independently a hydrogen atom, a straight, branched or cyclic alkyl group, aryl group or aralkyl group having 1 to 10 carbon atoms.

Also included are organic nitrogen-containing compounds having a benzimidazole structure and a polar functional group, represented by the general formula (B)-8.

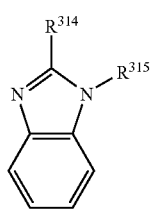

(B)-8

Herein, $R^{314}$ is a hydrogen atom, a straight, branched or cyclic alkyl group, aryl group or aralkyl group having 1 to 10 carbon atoms. $R^{315}$ is a polar functional group-bearing, straight, branched or cyclic alkyl group of 1 to 20 carbon atoms, and the alkyl group contains as the polar functional group at least one group selected from among ester, acetal and cyano groups, and may additionally contain at least one group selected from among hydroxyl, carbonyl, ether, sulfide and carbonate groups.

Further included are heterocyclic nitrogen-containing compounds having a polar functional group, represented by the general formulae (B)-9 and (B)-10.

(B)-9

(B)-10

Herein, A is a nitrogen atom or $=C-R^{322}$, B is a nitrogen atom or $=C-R^{323}$, $R^{316}$ is a straight, branched or cyclic alkyl group of 2 to 20 carbon atoms bearing at least one polar functional group selected from among hydroxyl, carbonyl, ester, ether, sulfide, carbonate, cyano and acetal groups; $R^{317}$, $R^{318}$, $R^{319}$ and $R^{320}$ are each independently a hydrogen atom, a straight, branched or cyclic alkyl group or aryl group having 1 to 10 carbon atoms, or a pair of $R^{317}$ and $R^{318}$ and a pair of $R^{319}$ and $R^{320}$, taken together, may form a benzene, naphthalene or pyridine ring; $R^{321}$ is a hydrogen atom, a straight, branched or cyclic alkyl group or aryl group having 1 to 10 carbon atoms; $R^{322}$ and $R^{323}$ each are a hydrogen atom, a straight, branched or cyclic alkyl group or aryl group having 1 to 10 carbon atoms, or a pair of $R^{321}$ and $R^{323}$, taken together, may form a benzene or naphthalene ring.

Also included are organic nitrogen-containing compounds of aromatic carboxylic ester structure having the general formulae (B)-11 to (B)-14.

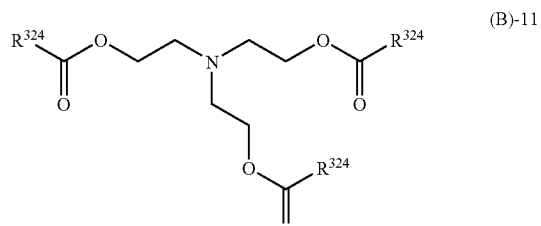

(B)-11

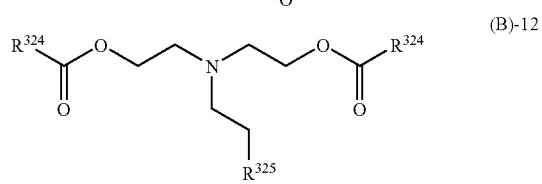

(B)-12

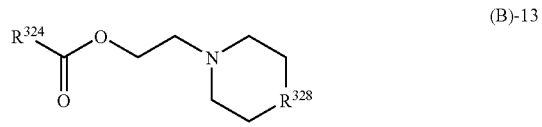

(B)-13

(B)-14

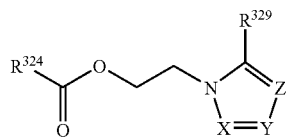

Herein $R^{324}$ is a $C_6$-$C_{20}$ aryl group or $C_4$-$C_{20}$ hetero-aromatic group, in which some or all of hydrogen atoms may be replaced by halogen atoms, straight, branched or cyclic $C_1$-$C_{20}$ alkyl groups, $C_6$-$C_{20}$ aryl groups, $C_1$-$C_{20}$ aralkyl groups, $C_1$-$C_{10}$ alkoxy groups, $C_1$-$C_{10}$ acyloxy groups or $C_1$-$C_{10}$ alkylthio groups. $R^{325}$ is $CO_2R^{326}$, $OR^{327}$ or cyano group. $R^{326}$ is a $C_1$-$C_{10}$ alkyl group, in which some methylene groups may be replaced by oxygen atoms. $R^{327}$ is a $C_1$-$C_{10}$ alkyl or acyl group, in which some methylene groups may be replaced by oxygen atoms. $R^{328}$ is a single bond, methylene, ethylene, sulfur atom or —O(CH$_2$CH$_2$O)$_n$— group wherein n is 0, 1, 2, 3 or 4. $R^{329}$ is hydrogen, methyl, ethyl or phenyl. X is a nitrogen atom or $CR^{330}$. Y is a nitrogen atom or $CR^{331}$. Z is a nitrogen atom or $CR^{332}$. $R^{330}$, $R^{331}$ and $R^{332}$ are each independently hydrogen, methyl or phenyl. Alternatively, a pair of $R^{330}$ and $R^{331}$ or a pair of $R^{331}$ and $R^{332}$ may bond together to form a $C_6$-$C_{20}$ aromatic ring or $C_2$-$C_{20}$ hetero-aromatic ring.

Further included are organic nitrogen-containing compounds of 7-oxanorbornane-2-carboxylic ester structure having the general formula (B)-15.

(B)-15

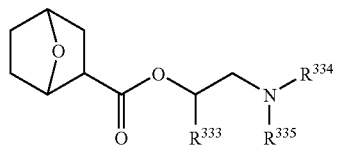

Herein $R^{333}$ is hydrogen or a straight, branched or cyclic $C_1$-$C_{10}$ alkyl group. $R^{334}$ and $R^{335}$ are each independently a $C_1$-$C_{20}$ alkyl group, $C_6$-$C_{20}$ aryl group or $C_7$-$C_{20}$ aralkyl group, which may contain one or more polar functional groups selected from among ether, carbonyl, ester, alcohol, sulfide, nitrile, amine, imine, and amide and in which some hydrogen atoms may be replaced by halogen atoms. $R^{334}$ and $R^{335}$, taken together, may form a heterocyclic or hetero-aromatic ring of 2 to 20 carbon atoms.

The organic nitrogen-containing compounds may be used alone or in admixture of two or more. The organic nitrogen-containing compound is preferably formulated in an amount of 0.001 to 2 parts, and especially 0.01 to 1 part by weight, per 100 parts by weight of the base resin. At least 0.001 phr of the nitrogen-containing compound achieves a desired addition effect whereas up to 2 phr minimizes a risk of lowering sensitivity.

The resist composition of the invention may include a surfactant which is commonly used for improving the coating characteristics. It may be added in conventional amounts so long as this does not compromise the objects of the invention.

Nonionic surfactants are preferred, examples of which include perfluoroalkylpolyoxyethylene ethanols, fluorinated alkyl esters, perfluoroalkylamine oxides, perfluoroalkyl EO-addition products, and fluorinated organosiloxane compounds. Useful surfactants are commercially available under the trade names Fluorad FC-430 and FC-431 from Sumitomo 3M, Ltd., Surflon S-141, S-145, KH-10, KH-20, KH-30 and KH-40 from Asahi Glass Co., Ltd., Unidyne DS-401, DS-403 and DS-451 from Daikin Industry Co., Ltd., Megaface F-8151 from Dai-Nippon Ink & Chemicals, Inc., and X-70-092 and X-70-093 from Shin-Etsu Chemical Co., Ltd. Preferred surfactants are Fluorad FC-430 from Sumitomo 3M, Ltd., KH-20 and KH-30 from Asahi Glass Co., Ltd., and X-70-093 from Shin-Etsu Chemical Co., Ltd.

Also, if desired, other components including dissolution regulators, carboxylic acid compounds and acetylene alcohol derivatives may be added to the resist composition of the invention. Optional components may be added in conventional amounts so long as this does not compromise the objects of the invention.

The dissolution regulator or inhibitor which can be added to the resist composition is a compound having on the molecule at least two phenolic hydroxyl groups, in which an average of from 0 to 100 mol % of all the hydrogen atoms on the phenolic hydroxyl groups are replaced by acid labile groups or a compound having on the molecule at least one carboxyl group, in which an average of 50 to 100 mol % of all the hydrogen atoms on the carboxyl groups are replaced by acid labile groups, both the compounds having a weight average molecular weight within a range of 100 to 1,000, and preferably 150 to 800.

The degree of substitution of the hydrogen atoms on the phenolic hydroxyl groups with acid labile groups is on average at least 0 mol %, and preferably at least 30 mol %, of all the phenolic hydroxyl groups. The upper limit is 100 mol %, and preferably 80 mol %. The degree of substitution of the hydrogen atoms on the carboxyl groups with acid labile groups is on average at least 50 mol %, and preferably at least 70 mol %, of all the carboxyl groups, with the upper limit being 100 mol %.

Preferable examples of such compounds having two or more phenolic hydroxyl groups or compounds having at least one carboxyl group include those of formulas (D1) to (D14) below.

(D1)

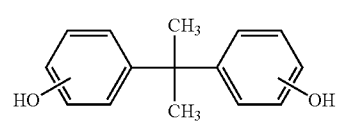

(D2)

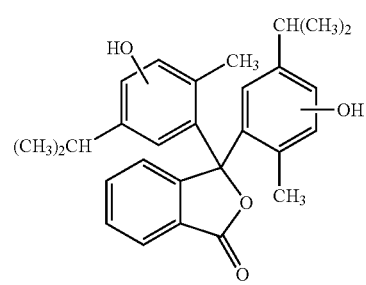

(D3)

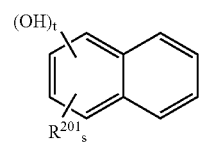

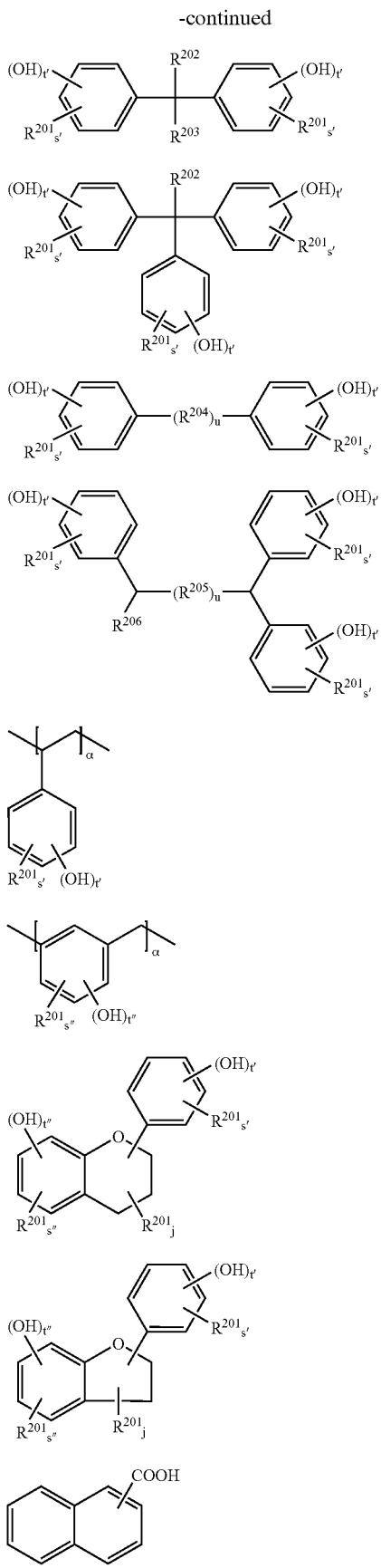

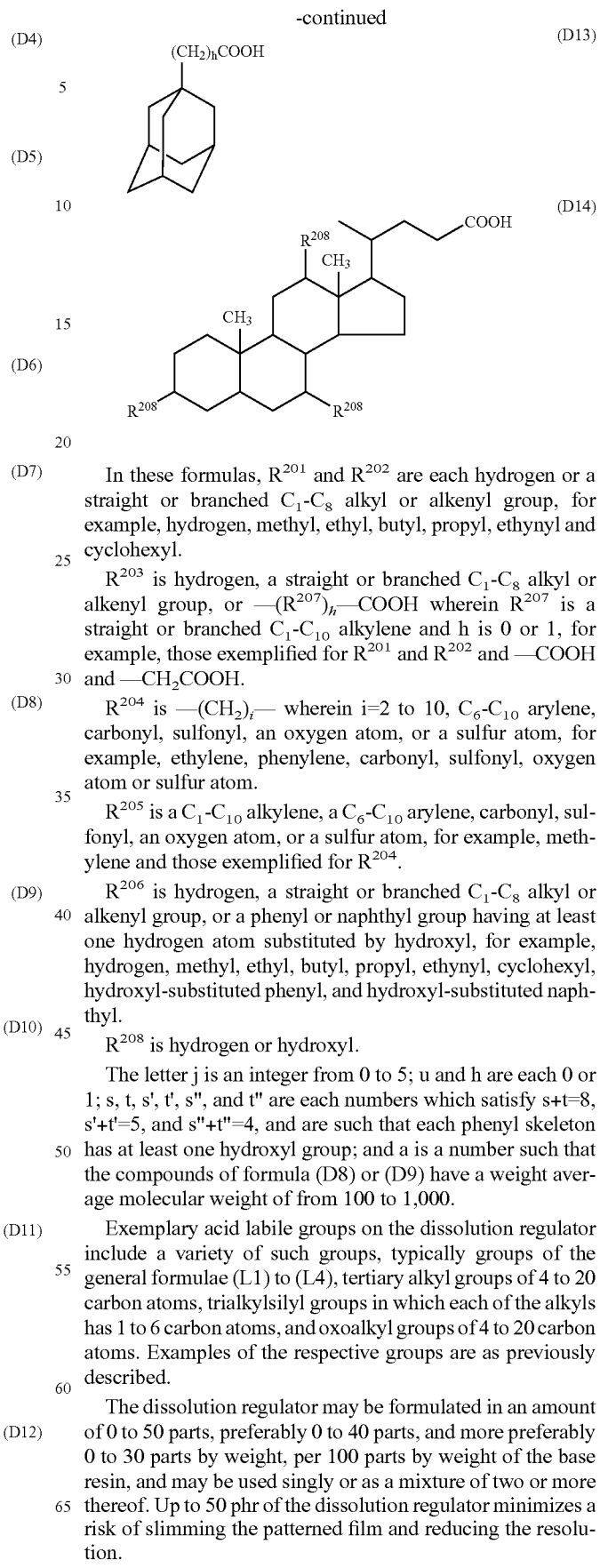

In these formulas, $R^{201}$ and $R^{202}$ are each hydrogen or a straight or branched $C_1$-$C_8$ alkyl or alkenyl group, for example, hydrogen, methyl, ethyl, butyl, propyl, ethynyl and cyclohexyl.

$R^{203}$ is hydrogen, a straight or branched $C_1$-$C_8$ alkyl or alkenyl group, or —$(R^{207})_h$—COOH wherein $R^{207}$ is a straight or branched $C_1$-$C_{10}$ alkylene and h is 0 or 1, for example, those exemplified for $R^{201}$ and $R^{202}$ and —COOH and —CH$_2$COOH.

$R^{204}$ is —(CH$_2$)$_i$— wherein i=2 to 10, $C_6$-$C_{10}$ arylene, carbonyl, sulfonyl, an oxygen atom, or a sulfur atom, for example, ethylene, phenylene, carbonyl, sulfonyl, oxygen atom or sulfur atom.

$R^{205}$ is a $C_1$-$C_{10}$ alkylene, a $C_6$-$C_{10}$ arylene, carbonyl, sulfonyl, an oxygen atom, or a sulfur atom, for example, methylene and those exemplified for $R^{204}$.

$R^{206}$ is hydrogen, a straight or branched $C_1$-$C_8$ alkyl or alkenyl group, or a phenyl or naphthyl group having at least one hydrogen atom substituted by hydroxyl, for example, hydrogen, methyl, ethyl, butyl, propyl, ethynyl, cyclohexyl, hydroxyl-substituted phenyl, and hydroxyl-substituted naphthyl.

$R^{208}$ is hydrogen or hydroxyl.

The letter j is an integer from 0 to 5; u and h are each 0 or 1; s, t, s', t', s", and t" are each numbers which satisfy s+t=8, s'+t'=5, and s"+t"=4, and are such that each phenyl skeleton has at least one hydroxyl group; and a is a number such that the compounds of formula (D8) or (D9) have a weight average molecular weight of from 100 to 1,000.

Exemplary acid labile groups on the dissolution regulator include a variety of such groups, typically groups of the general formulae (L1) to (L4), tertiary alkyl groups of 4 to 20 carbon atoms, trialkylsilyl groups in which each of the alkyls has 1 to 6 carbon atoms, and oxoalkyl groups of 4 to 20 carbon atoms. Examples of the respective groups are as previously described.

The dissolution regulator may be formulated in an amount of 0 to 50 parts, preferably 0 to 40 parts, and more preferably 0 to 30 parts by weight, per 100 parts by weight of the base resin, and may be used singly or as a mixture of two or more thereof. Up to 50 phr of the dissolution regulator minimizes a risk of slimming the patterned film and reducing the resolution.

The dissolution regulator can be synthesized by introducing acid labile groups into a compound having phenolic hydroxyl or carboxyl groups in accordance with an organic chemical formulation.

In the resist composition, a carboxylic acid compound may be blended. Exemplary, non-limiting carboxylic acid compounds include one or more compounds selected from Groups I and II below. Including this compound improves the PED stability of the resist and ameliorates edge roughness on nitride film substrates.

Group I:

Compounds in which some or all of the hydrogen atoms on the phenolic hydroxyl groups of the compounds of general formulas (A1) to (A10) below are replaced by —$R^{401}$—COOH (wherein $R^{401}$ is a straight or branched alkylene of 1 to 10 carbon atoms), and in which the molar ratio C/(C+D) of phenolic hydroxyl groups (C) to =C—COOH groups (D) in the molecule is from 0.1 to 1.0.

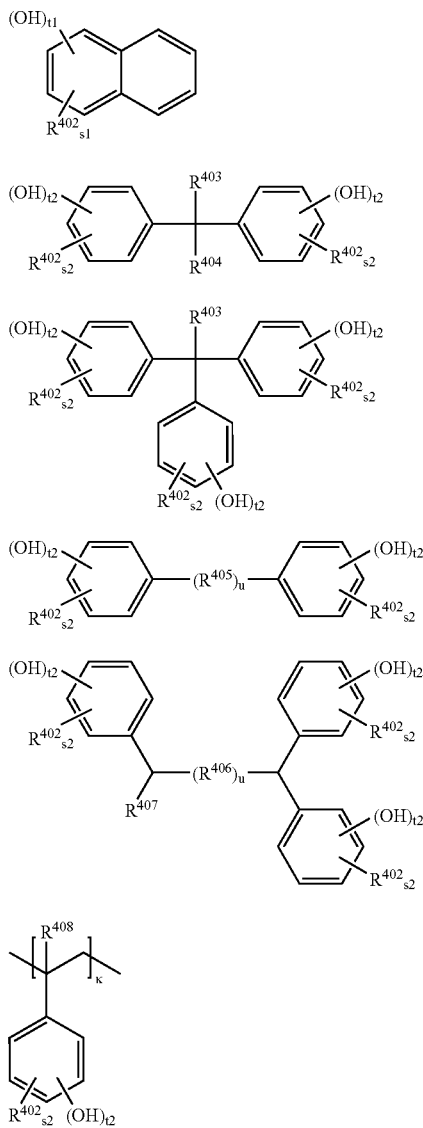

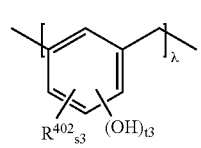

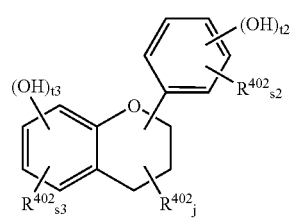

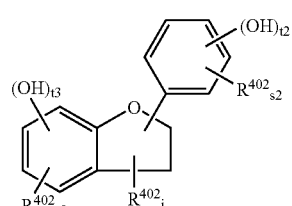

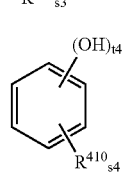

In these formulas, $R^{402}$ and $R^{403}$ are each hydrogen or a straight or branched $C_1$-$C_8$ alkyl or alkenyl; $R^{404}$ is hydrogen, a straight or branched $C_1$-$C_8$ alkyl or alkenyl, or a —$(R^{409})_h$—COOR' group (R' being hydrogen or —$R^{409}$—COOH); $R^{405}$ is —$(CH_2)_i$— (wherein i is 2 to 10), a $C_6$-$C_{10}$ arylene, carbonyl, sulfonyl, an oxygen atom, or a sulfur atom; $R^{406}$ is a $C_1$-$C_{10}$ alkylene, a $C_6$-$C_{10}$ arylene, carbonyl, sulfonyl, an oxygen atom, or a sulfur atom; $R^{407}$ is hydrogen, a straight or branched $C_1$-$C_8$ alkyl or alkenyl, or a hydroxyl-substituted phenyl or naphthyl; $R^{408}$ is hydrogen or methyl; $R^{409}$ is a straight or branched $C_1$-$C_{10}$ alkylene; $R^{410}$ is hydrogen, a straight or branched $C_1$-$C_8$ alkyl or alkenyl, or a —$R^{411}$—COOH group wherein $R^{411}$ is a straight or branched $C_1$-$C_{10}$ alkylene; the letter j is an integer from 0 to 3; s1, t1, s2, t2, s3, t3, s4, and t4 are each numbers which satisfy s1+t1=8, s2+t2=5, s3+t3=4, and s4+t4=6, and are such that each phenyl structure has at least one hydroxyl group; u is a number from 1 to 4, h is a number from 1 to 4; κ is a number such that the compound of formula (A6) may have a weight average molecular weight of 1,000 to 5,000; and λ is a number such that the compound of formula (A7) may have a weight average molecular weight of 1,000 to 10,000.

Group II:

Compounds of general formulas (A11) to (A15) below.

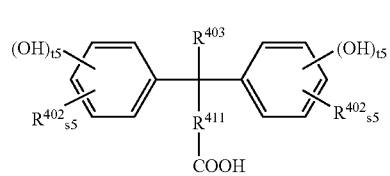

-continued

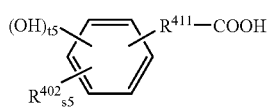 (A12)

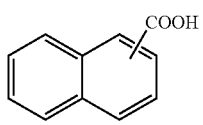 (A13)

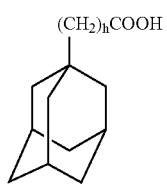 (A14)

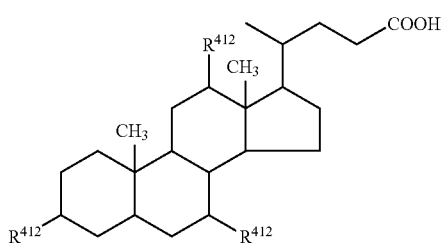 (A15)

In these formulas, $R^{402}$, $R^{403}$, and $R^{411}$ are as defined above; $R^{412}$ is hydrogen or hydroxyl; s5 and t5 are numbers which satisfy $s5 \geqq 0$, $t5 \geqq 0$, and $s5+t5=5$; and h is a number from 1 to 4.

Illustrative, non-limiting examples of the compound having a carboxyl group include compounds of the general formulas AI-1 to AI-14 and AII-1 to AII-10 below.

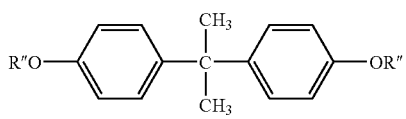 (AI-1)

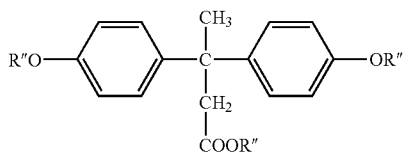 (AI-2)

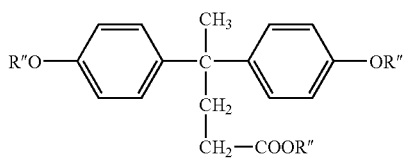 (AI-3)

(AI-4)

-continued

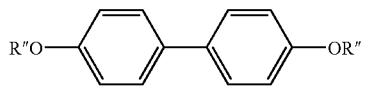 (AI-5)

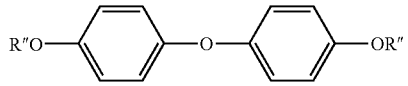 (AI-6)

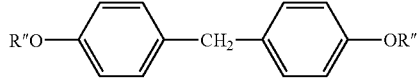 (AI-7)

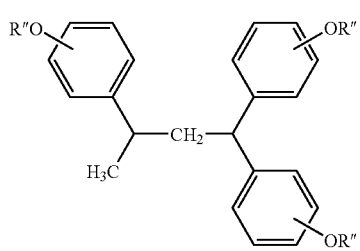 (AI-8)

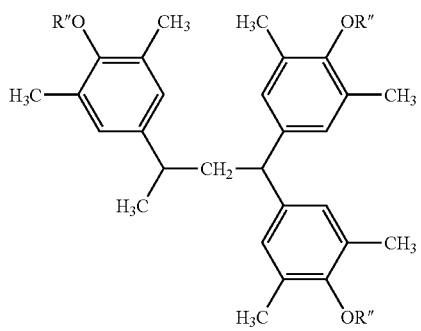 (AI-9)

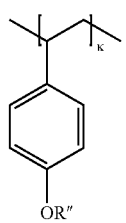 (AI-10)

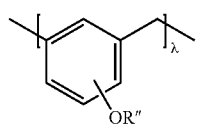 (AI-11)

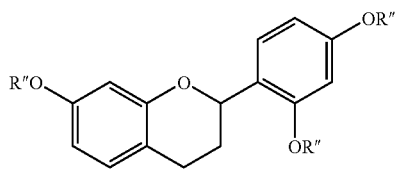 (AI-12)

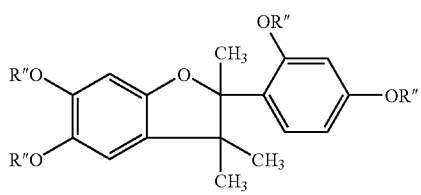 (AI-13)

-continued (AI-14)
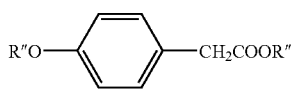

(AII-1)

(AII-2)
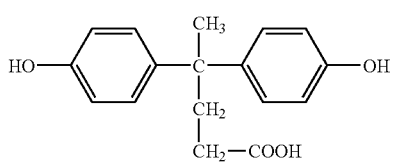

(AII-3)
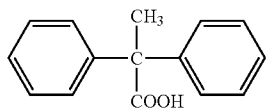

(AII-4)
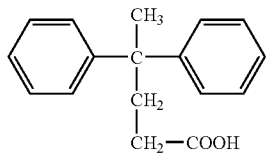

(AII-5)
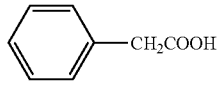

(AII-6)
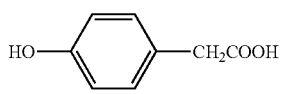

(AII-7)
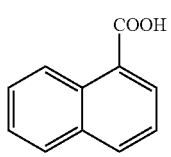

(AII-8)
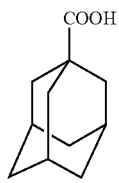

(AII-9)
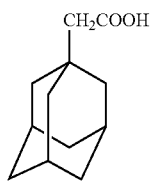

(AII-10)
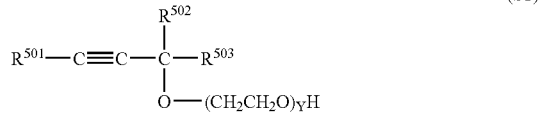

In the above formulas, R" is hydrogen or a —CH$_2$COOH group such that the —CH$_2$COOH group accounts for 10 to 100 mol % of R" in each compound, κ and λ are as defined above.

The compound having a =C—COOH group in the molecule is added in an amount ranging from 0 to 5 parts, preferably 0.1 to 5 parts, more preferably 0.1 to 3 parts, even more preferably 0.1 to 2 parts by weight, per 100 parts by weight of the base resin. Up to 5 phr of the compound minimizes a risk of the resist composition reducing its resolution.

The resist composition of the invention may additionally include an acetylene alcohol derivative. Preferred acetylene alcohol derivatives are those having the general formula (S1) or (S2) below.

$$R^{501}-C \equiv C-\underset{\underset{O-(CH_2CH_2O)_YH}{|}}{\overset{\overset{R^{502}}{|}}{C}}-R^{503} \quad (S1)$$

$$R^{505}-\underset{\underset{H(OCH_2CH_2)_X-O}{|}}{\overset{\overset{R^{504}}{|}}{C}}-C \equiv C-\underset{\underset{O-(CH_2CH_2O)_YH}{|}}{\overset{\overset{R^{502}}{|}}{C}}-R^{503} \quad (S2)$$

In the formulas, $R^{501}$, $R^{502}$, $R^{503}$, $R^{504}$, and $R^{505}$ are each hydrogen or a straight, branched or cyclic $C_1$-$C_8$ alkyl; and X and Y are each 0 or a positive number, satisfying $0 \leq X \leq 30$, $0 \leq Y \leq 30$, and $0 \leq X+Y \leq 40$.

Preferable examples of the acetylene alcohol derivative include Surfynol 61, Surfynol 82, Surfynol 104, Surfynol 104E, Surfynol 104H, Surfynol 104A, Surfynol TG, Surfynol PC, Surfynol 440, Surfynol 465, and Surfynol 485 from Air Products and Chemicals Inc., and Surfynol E1004 from Nisshin Chemical Industry K.K.

The acetylene alcohol derivative is preferably added in an amount of 0.01 to 2% by weight, and more preferably 0.02 to 1% by weight, based on the weight of the resist composition. At least 0.01 wt % is fully effective in improving the coating operation and shelf stability. Up to 2 wt % minimizes a risk of the resist composition reducing its resolution.

Process

The pattern forming process of the invention involves the steps of (1) applying the resist composition onto a substrate to form a coating, (2) heat treating the coating and exposing it to high-energy radiation through a photomask, and (3) developing the exposed coating with a developer. Preferably the high-energy radiation has a wavelength in the range of 180 to 250 nm.

The step of exposing the resist coating to high-energy radiation may be an immersion lithography step of directing radiation via a liquid and be carried out, for example, by using radiation having a wavelength of 180 to 250 nm, holding a liquid between the projection lens and the resist-coated substrate and directing the radiation to the substrate via the liquid. The liquid used in the immersion lithography is typically water.

Pattern formation using the resist composition of the invention may be carried out by a known lithographic technique. For example, the resist composition is applied onto a substrate such as a silicon wafer by spin coating or the like. The coating is then pre-baked on a hot plate at 60 to 150° C. for 1 to 10 minutes, and preferably at 80 to 140° C. for 1 to 5 minutes to form a resist film having a thickness of 0.1 to 2.0 μm.

A mask having the desired pattern is then placed over the resist film, and the film exposed through the mask to high-energy radiation such as deep-UV, excimer laser or x-ray, or electron beam in a dose of about 1 to 200 mJ/cm$^2$, and preferably about 10 to 100 mJ/cm$^2$.

The photoresist film formed from the resist composition of the invention exhibits a good barrier against water and prevents the photoresist material from being leached in water. It thus eliminates a need for a protective coating in the immersion lithography, contributing to a reduction of the cost required in the formation of protective coating or the like. Also the photoresist film has so large a receding contact angle with water that few droplets are left on the resist film surface after immersion lithography scanning, minimizing defective pattern formation which is caused by residual droplets on the film surface.

It is also possible to form a protective coating on top of the resist film prior to the immersion lithography. While the protective coatings include solvent strippable type and developer dissolvable type, the developer dissolvable protective coating which can be stripped at the same time as the development of photoresist is advantageous for process simplicity.

The developer dissolvable topcoat uses as a base resin a polymer comprising recurring units having a carboxyl or α-trifluoromethylhydroxy group as the alkali-soluble group. Any solvent may be used as long as the resist layer is not dissolved therein. The solvent may be selected from higher alcohols of 4 to 20 carbon atoms, ethers, alkanes and compounds having fluorinated alkyl groups.

A protective coating is formed by spin coating a topcoat solution on the prebaked photoresist film, and prebaking the coating on a hot plate at 50 to 150° C. for 1 to 10 minutes, and preferably 70 to 140° C. for 1 to 5 minutes.

After exposure, the layer structure is post-exposure baked (PEB) on a hot plate at 60 to 150° C. for 1 to 5 minutes, and preferably at 80 to 140° C. for 1 to 3 minutes. Finally, development is carried out using as the developer an aqueous alkali solution, such as 0.1 to 5 wt %, and preferably 2 to 3 wt %, tetramethylammonium hydroxide (TMAH), this being done by a conventional technique such as dip, puddle, or spray technique for a period of 0.1 to 3 minutes, and preferably 0.5 to 2 minutes. These steps result in the formation of the desired pattern on the substrate.

When used for mask blanks, the resist compositions of the invention often include novolac and hydroxystyrene base resins. Those resins in which alkali-soluble hydroxyl groups are substituted by acid labile groups are used for positive resists while these resins in combination with crosslinking agents are used for negative resists. Base polymers which can be used herein include copolymers of hydroxystyrene with one or more of (meth)acrylic derivatives, styrenes, vinyl naphthalenes, vinyl anthracenes, vinyl pyrenes, hydroxyvinyl naphthalenes, hydroxyvinyl anthracenes, indenes, hydroxyindenes, acenaphthylenes, and norbornadienes.

Where the inventive polymer is used as an additive to a resist composition for use with mask blanks, the inventive polymer is added to the above-mentioned base resin to form a resist solution, which is coated on a mask blank substrate of SiO$_2$, Cr, CrO, CrN, MoSi or the like. By further forming a SOG film and an organic undercoat film between the photoresist and the blank substrate, there is provided a three-layer structure which is also acceptable herein. Once the resist film is formed, the structure is irradiated with electron beam in vacuum using an electron beam exposure system. The irradiation is followed by post-exposure baking (PEB) and development in an alkaline developer for 10 to 300 seconds.

EXAMPLE

Examples of the invention are given below by way of illustration and not by way of limitation. The abbreviations used herein are GPC for gel permeation chromatography, NMR for nuclear magnetic resonance, Mw for weight average molecular weight, Mn for number average molecular weight, Mw/Mn for molecular weight dispersity, PGMEA for propylene glycol monomethyl ether acetate, and TMAH for tetramethylammonium hydroxide. Mw and Mn are determined by GPC versus polystyrene standards.

Monomers 1 to 9 used in Polymer Synthesis Examples are identified below by their structural formula. Of these, Monomers 1, 3, and 4 were synthesized in Monomer Synthesis Examples 1 to 3.

Monomer Synthesis Example 1

Synthesis of Monomer 1

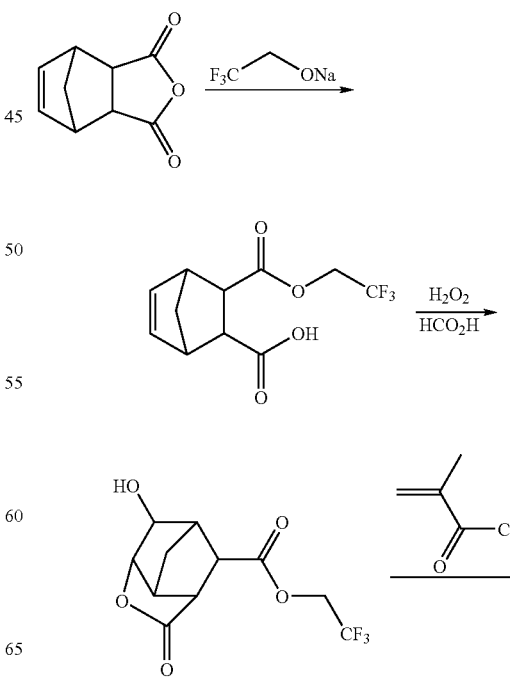

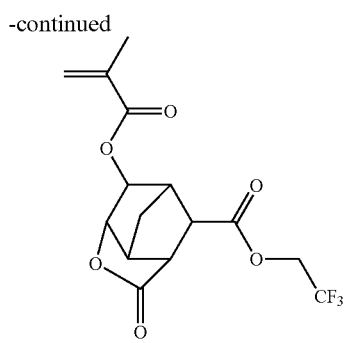

[1-1] Synthesis of 3-(2,2,2-trifluoroethoxycarbonyl)-5-norbornene-2-carboxylic acid A flask was charged with 13.8 g of sodium hydride (purity 60%) and 80 ml of tetrahydrofuran, to which 33.0 g of 1,1,1-trifluoroethanol was added dropwise at 30° C. After the completion of dropwise addition, the contents were stirred at the temperature for one hour, then cooled down to 10° C. A mixture of 49.2 g of 5-norbornene-2,3-dicarboxylic anhydride and 150 ml of tetrahydrofuran was added dropwise. After the completion of dropwise addition, the contents were stirred at the temperature for one hour. 150 g of 10% hydrochloric acid was added to quench the reaction. This was followed by standard workup and recrystallization from n-hexane, obtaining 69.8 g of the target compound (yield 88%).

$^1$H-NMR (600 MHz in CDCl$_3$): δ=1.51 (1H, dd), 1.61 (1H, d), 2.76 (1H, dd), 3.18 (1H, s), 3.33 (1H, s), 3.45 (1H, t), 4.42-4.48 (1H, m), 4.55-4.62 (1H, m), 6.14-6.17 (1H, m), 6.30-6.33 (1H, m) ppm

[1-2] Synthesis of 2,2,2-trifluoroethyl 6-hydroxy-2-oxohexahydro-3,5-methano-2H-cyclopenta[b]furan-7-carboxylate A flask was charged with 61.0 g of the half-ester obtained in [1-1], 120 g of t-butyl alcohol, and 20.0 g of formic acid, to which 42.3 g of 35% aqueous hydrogen peroxide was added dropwise at 35 to 50° C. while monitoring an exotherm. After the completion of dropwise addition, the contents were stirred at the temperature for 8 hours. The reaction solution was then cooled down to 10° C. and combined with 30 g of sodium sulfite. This was followed by standard workup and recrystallization from n-hexane, obtaining 54.4 g of the target compound (yield 84%).

$^1$H-NMR (600 MHz in DMSO-d$_6$): δ=1.45 (1H, dd), 1.92 (1H, d), 2.53 (1H, s), 2.82 (1H, d), 2.98 (1H, s), 3.18 (1H, t), 3.64 (1H, s), 4.31 (1H, d), 4.71-4.89 (2H, m), 5.39 (1H, d) ppm

[1-3] Synthesis of 7-(2,2,2-trifluoroethoxycarbonyl)-2-oxohexahydro-3,5-methano-2H-cyclopenta[b]furan-6-yl methacrylate (Monomer 1)

In 200 ml of toluene were dissolved 40.0 g of the alcohol obtained in [1-2] and 20.3 g of triethylamine. At 10° C., 18.7 g of methacryloyl chloride was added to the solution, which was stirred at the temperature for one hour. 100 ml of water was added below 30° C. This was followed by standard workup and recrystallization from diisopropyl ether, obtaining 38.8 g of the target compound (yield 78%).

IR (thin film): ν=3018, 2985, 2962, 2939, 1791, 1756, 1722, 1417, 1324, 1301, 1286, 1160, 1108, 1074, 1043, 1020, 985 cm$^{-1}$ $^1$H-NMR (600 MHz in CDCl$_3$): δ=1.79 (1H, d), 1.94 (3H, s), 2.00 (1H, d), 2.92 (2H, d), 3.10 (1H, d-like), 3.28 (1H, t-like), 4.42-4.50 (1H, m), 4.55-4.65 (2H, m), 4.72 (1H, s), 5.64 (1H, t-like), 6.11 (1H, s) ppm $^{19}$F-NMR (565 MHz in CDCl$_3$): δ=−74.5 (3F, dd) ppm Monomer Synthesis Example 2

Synthesis of Monomer 3

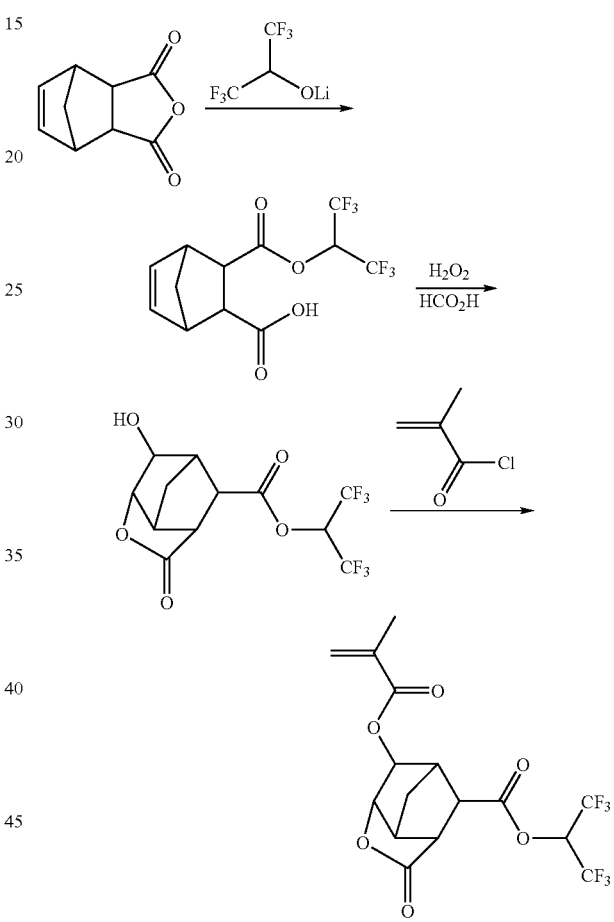

[2-1] Synthesis of 3-(1,1,1,3,3,3-hexafluoroisopropoxycarbonyl)-5-norbornene-2-carboxylic acid A flask was charged with 223.5 g of 1,1,1,3,3,3-hexafluoroisopropyl alcohol and 500 ml of tetrahydrofuran, to which 500 ml of a solution (2.6 mole/L) of n-butyllithium in n-hexane was added dropwise at −10° C. After the completion of dropwise addition, the contents were stirred at room temperature for one hour, then cooled down to 10° C. A mixture of 198.5 g of 5-norbornene-2,3-dicarboxylic anhydride and 600 ml of tetrahydrofuran was added dropwise. After the completion of dropwise addition, the contents were stirred at 60° C. for 10 hours. 500 g of 10% hydrochloric acid was added to quench the reaction. This was followed by standard workup and recrystallization from n-hexane, obtaining 345.5 g of the target compound (yield 86%).

$^1$H-NMR (600 MHz in CDCl$_3$): δ=1.56 (2H, dt), 2.86 (1H, dd), 3.21 (1H, d-like), 3.37 (1H, d-like), 3.47 (1H, dd), 5.78 (1H, sept), 6.19 (1H, dd), 6.34 (1H, dd) ppm

[2-2] Synthesis of 1,1,1,3,3,3-hexafluoroisopropyl 6-hydroxy-2-oxohexahydro-3,5-methano-2H-cyclopenta[b]furan-7-carboxylate A flask was charged with 300.0 g of the half-ester obtained in [2-1], 600 g of t-butyl alcohol, and 103.9 g of formic acid, to which 263.2 g of 35% aqueous hydrogen peroxide was added dropwise at 35 to 50° C. while monitoring an exotherm. After the completion of dropwise addition, the contents were stirred at the temperature for 8 hours. The reaction solution was then cooled down to 10° C. and combined with 200 g of sodium sulfite. This was followed by standard workup and recrystallization from n-hexane, obtaining 235.8 g of the target compound (yield 75%).

$^1$H-NMR (600 MHz in DMSO-d$_6$): δ=1.38 (1H, dd), 1.96 (1H, d), 2.54 (1H, s), 2.83 (1H, dd), 3.23 (1H, dt), 3.28 (1H, s), 3.69 (1H, s), 4.34 (1H, d), 5.45 (1H, d), 6.88 (1H, sept) ppm

[2-3] Synthesis of 7-(1,1,1,3,3,3-hexafluoroisopropoxycarbonyl)-2-oxohexahydro-3,5-methano-2H-cyclopenta[b]furan-6-yl methacrylate (Monomer 3)

In 200 ml of acetonitrile were dissolved 80.0 g of the alcohol obtained in [2-2] and 32.6 g of triethylamine. At 10° C., 30.0 g of methacryloyl chloride was added to the solution, which was stirred at the temperature for one hour. 150 ml of water was added below 30° C. This was followed by standard workup and recrystallization from diisopropyl ether, obtaining 66.0 g of the target compound (yield 69%).

IR (thin film): ν=2973, 2933, 1793, 1722, 1639, 1469, 1390, 1361, 1322, 1297, 1238, 1203, 1157, 1110, 1093, 1018, 946, 908 cm$^{-1}$ $^1$H-NMR (600 MHz in CDCl$_3$): δ=1.75 (1H, dd), 1.95 (3H, s), 2.04 (1H, dd), 2.92 (1H, s), 3.02 (1H, s), 3.13 (1H, d-like), 3.32 (1H, dt-like), 4.63 (1H, d), 4.76 (1H, d), 5.65 (1H, t-like), 5.76 (1H, sept), 6.12 (1H, s) ppm $^{19}$F-NMR (565 MHz in CDCl$_3$): δ=−73.8 to −73.9 (3F, m), −73.8 to −73.7 (3F, m) ppm Monomer Synthesis Example 3

Synthesis of Monomer 4

Synthesis was carried out as [1-1] to [1-3] in Monomer Synthesis Example 1 aside from using 2,2,3,3,4,4,5,5-octafluoro-1-pentanol instead of 1,1,1-trifluoroethanol. There was obtained 7-(2,2,3,3,4,4,5,5-octafluoro-1-pentyloxycarbonyl)-2-oxohexahydro-3,5-methanol-2H-cyclopenta[b]furan-6-yl methacrylate (Monomer 4) in a three-step yield of 49%.

IR (thin film): ν=2983, 2933, 1791, 1758, 1724, 1639, 1456, 1405, 1340, 1321, 1299, 1253, 1172, 1114, 1076, 1043, 1018, 946 cm$^{-1}$ $^1$H-NMR (600 MHz in CDCl$_3$): δ=1.12 (1H, d), 1.79 (1H, dd), 1.94 (3H, t), 2.00 (1H, dd), 2.91 (2H, d), 3.11 (1H, d-like), 3.28 (1H, dt-like), 4.54-4.62 (2H, m), 4.71-4.77 (2H, m), 5.63-5.64 (1H, m), 6.11 (1H, d-like) ppm $^{19}$F-NMR (565 MHz in CDCl$_3$): δ=−137.9 to −137.7 (2F, m), −130.5 to −130.4 (2F, m), −126.0 (2F, t-like), −120.5 to −120.3 (2F, m) ppm

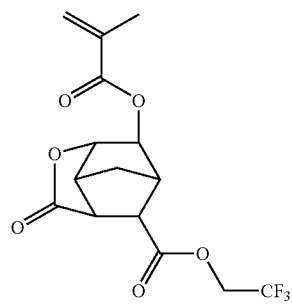

Monomer 1

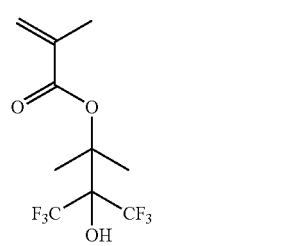

Monomer 2

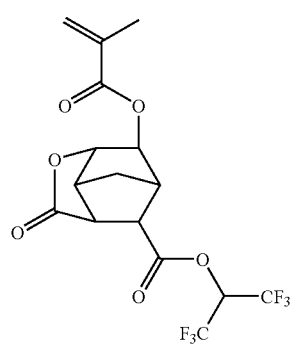

Monomer 3

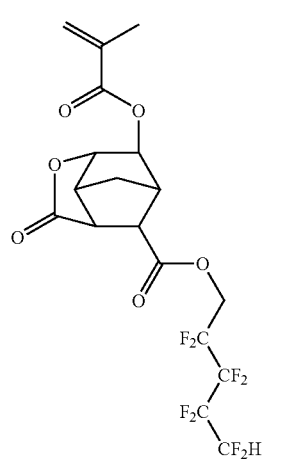

Monomer 4

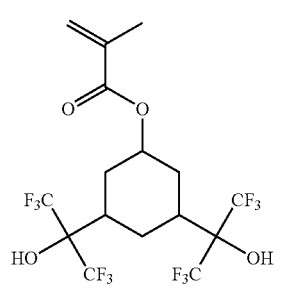

Monomer 5

-continued

Monomer 6

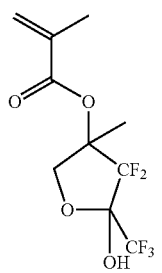

Monomer 7

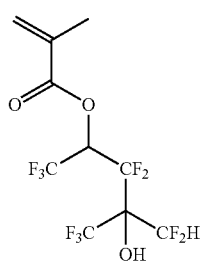

Monomer 8

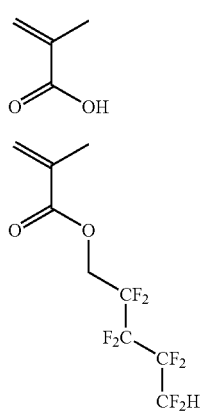

Monomer 9

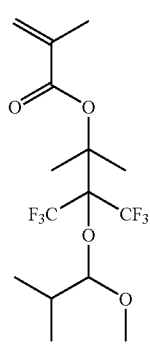

Monomer 10

-continued

Monomer 11

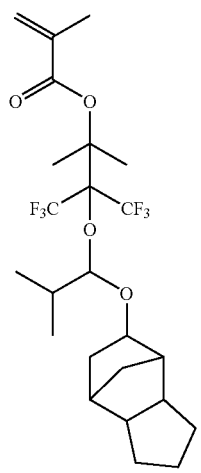

Polymer Synthesis Example 1

Copolymerization of Monomers 1 and 2 (60/40)

To a flask in a nitrogen blanket, 44.11 g of Monomer 1, 55.89 g of Monomer 2, 2.08 g of 2,2'-azobisisobutyronitrile (AIBN), 0.37 g of 2-mercaptoethanol, and 100.0 g of methyl ethyl ketone were fed to form a monomer solution, which was kept at a temperature of 20-25° C. To another flask in a nitrogen blanket, 50.0 g of methyl ethyl ketone was fed. With stirring, it was heated to 80° C., to which the monomer solution was added dropwise over 4 hours. After the completion of dropwise addition, the polymerization solution was continuously stirred for a 2 hours while keeping the temperature at 80° C. After the maturing, the solution was cooled to room temperature. The polymerization solution thus obtained was added dropwise to 2,000 g of hexane, after which the precipitated copolymer was filtered. The copolymer was washed with 600 g of hexane, whereupon white solids were isolated. The white solids were vacuum dried at 50° C. for 20 hours, obtaining 91.2 g of the target polymer, Polymer 1. The resin was analyzed for composition by $^1$H-NMR, finding that the copolymer consisted of Monomers 1 and 2 in a ratio of 41/59 mol %. The copolymer was also analyzed for molecular weight by GPC, finding Mw of 7,500 and Mw/Mn of 1.6.

Synthesis Examples 2 to 9

As in Synthesis Example 1, Polymers 2 to 9 were synthesized using Monomers 1 to 11 according to the recipe of Table 1. Note that V-601 is a trade name of dimethyl 2,2'-azobis(2-methylpropionate) by Wako Pure Chemical Industries, Ltd.

TABLE 1

| Polymer | Monomers (charge in gram) | Initiator (g) | 2-mercaptoethanol (g) | Yield (g) | Compositional ratio (mol %) | Mw | Mw/Mn |
|---|---|---|---|---|---|---|---|
| Polymer 2 | Monomer 2 (56.76) Monomer 3 (43.24) | 1.95 (AIBN) | 0.35 | 91.2 | 65:35 | 7,600 | 1.6 |
| Polymer 3 | Monomer 2 (71.00) Monomer 4 (29.00) | 1.98 (AIBN) | 0.35 | 90.0 | 80:20 | 7,700 | 1.6 |

TABLE 1-continued
| Polymer | Monomers (charge in gram) | Initiator (g) | 2-mercaptoethanol (g) | Yield (g) | Compositional ratio (mol %) | Mw | Mw/Mn |
|---|---|---|---|---|---|---|---|
| Polymer 4 | Monomer 1 (31.70) Monomer 5 (68.30) | 1.49 (AIBN) | 0.27 | 90.1 | 39:61 | 7,500 | 1.6 |
| Polymer 5 | Monomer 1 (44.45) Monomer 6 (44.55) | 2.10 (AIBN) | 0.37 | 90.9 | 39:61 | 7,700 | 1.6 |
| Polymer 6 | Monomer 1 (38.80) Monomer 7 (61.20) | 1.83 (AIBN) | 0.33 | 91.6 | 39:61 | 7,800 | 1.6 |
| Polymer 7 | Monomer 1 (65.60) Monomer 8 (20.27) Monomer 9 (14.13) | 3.09 (AIBN) | 0.55 | 90.5 | 40:50:10 | 7,600 | 1.6 |
| Polymer 8 | Monomer 1 (47.50) Monomer 10 (52.20) | 3.16 (V-601) | 0.00 | 90.5 | 50:50 | 11,800 | 1.7 |
| Polymer 9 | Monomer 1 (41.03) Monomer 11 (58.97) | 2.71 (V-601) | 0.00 | 90.5 | 50:50 | 10,600 | 1.7 |
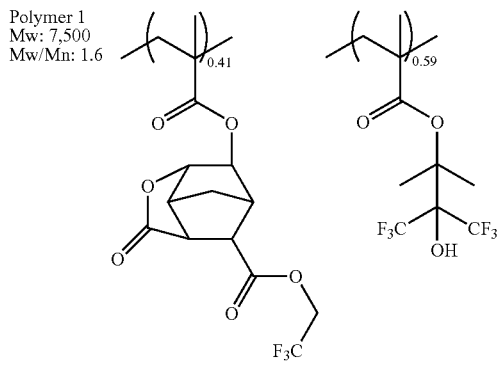
Polymer 1
Mw: 7,500
Mw/Mn: 1.6
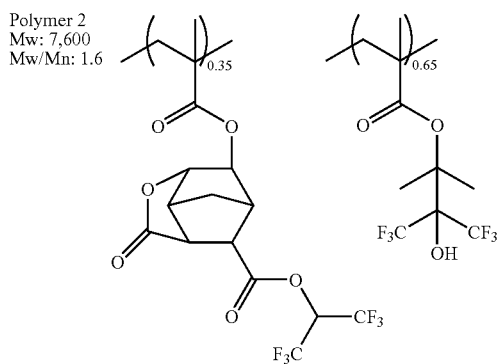
Polymer 2
Mw: 7,600
Mw/Mn: 1.6

TABLE 1-continued

| Polymer | Monomers (charge in gram) | Initiator (g) | 2-mercaptoethanol (g) | Yield (g) | Compositional ratio (mol %) | Mw | Mw/Mn |
|---|---|---|---|---|---|---|---|
| Polymer 3 Mw: 7,700 Mw/Mn: 1.6 | | | | | | | |
| Polymer 4 Mw: 7,500 Mw/Mn: 1.6 | | | | | | | |
| Polymer 5 Mw: 7,700 Mw/Mn: 1.6 | | | | | | | |

TABLE 1-continued

| Polymer | Monomers (charge in gram) | Initiator (g) | 2-mercaptoethanol (g) | Yield (g) | Compositional ratio (mol %) | Mw | Mw/Mn |
|---|---|---|---|---|---|---|---|
| Polymer 6 Mw: 7,800 Mw/Mn: 1.6 | | | | | | | |
| Polymer 7 Mw: 7,600 Mw/Mn: 1.6 | | | | | | | |
| Polymer 8 Mw: 11,800 Mw/Mn: 1.7 | | | | | | | |
| Polymer 9 Mw: 10,600 Mw/Mn: 1.7 | | | | | | | |

Comparative Synthesis Example 1

Copolymerization of Monomers 2 and 9 (80/20)

To a flask in a nitrogen blanket, 79.68 g of Monomer 2, 20.32 g of Monomer 9, 3.90 g of dimethyl 2,2'-azobis(2-methylpropionate), and 100.0 g of isopropyl alcohol were fed to form a monomer solution, which was kept at a temperature of 20-25° C. To another flask in a nitrogen blanket, 50.0 g of isopropyl alcohol was fed. With stirring, it was heated to 80° C., to which the monomer solution was added dropwise over 4 hours. After the completion of dropwise addition, the polymerization solution was continuously stirred for a 2 hours while keeping the temperature at 80° C. After the maturing, the solution was cooled to room temperature. The polymerization solution thus obtained was added dropwise to 4,000 g of a 7/1 solvent mixture of water and methanol, after which the precipitated copolymer was filtered. The copolymer was washed four times with 600 g of a 9/1 solvent mixture of isopropyl ether and hexane, whereupon white solids were isolated. The white solids were vacuum dried at 50° C. for 20 hours, obtaining 94.0 g of the target polymer, Comparative Polymer 1. The resin was analyzed for composition by $^1$H-NMR, finding that the copolymer consisted of Monomers 2 and 9 in a ratio of 79/21 mol %. The copolymer was also analyzed for molecular weight by GPC, finding Mw of 7,900 and Mw/Mn of 1.6.

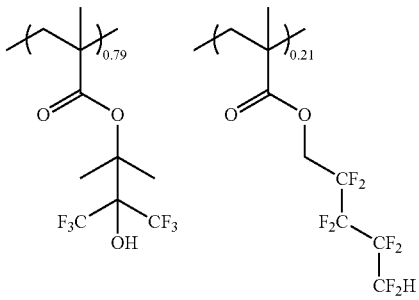

Comparative Polymer 1
Mw: 7,900
Mw/Mn: 1.6

Examples and Comparative Examples

Resist solutions were prepared by using 5 g of Resist Polymer A and/or Resist Polymer B, 0.5 g of the inventive polymer (Polymers 1 to 9), 0.25 g of photoacid generator PAG1, and 0.05 g of Quencher 1, shown below, dissolving them in 75 g of PGMEA, and filtering through a polypropylene filter having a pore size of 0.2 μm. A comparative resist solution was similarly prepared by using 5 g of Resist Polymer A, 0.5 g of Comparative Polymer 1, 0.25 g of PAG1, and 0.05 g of Quencher 1, and dissolving them in 75 g of PGMEA.

A protective coating solution was prepared by dissolving 1 g of Comparative Polymer 1 in 25 g of diisopentyl ether and 2.5 g of 2-methyl-1-butanol and filtering through a polypropylene filter having a pore size of 0.2 μm.

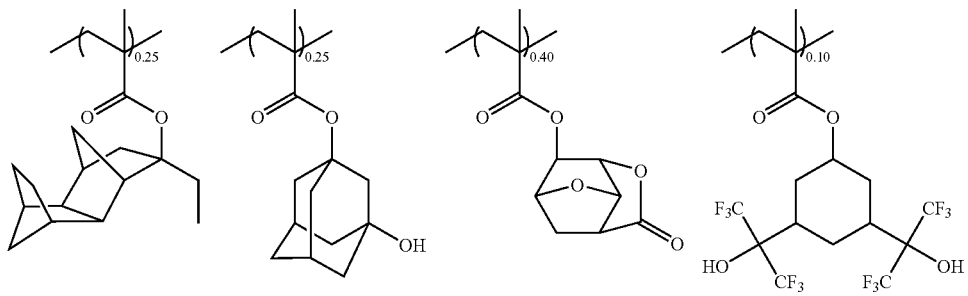

Resist Polymer A
Mw: 7,600
Mw/Mn: 1.76

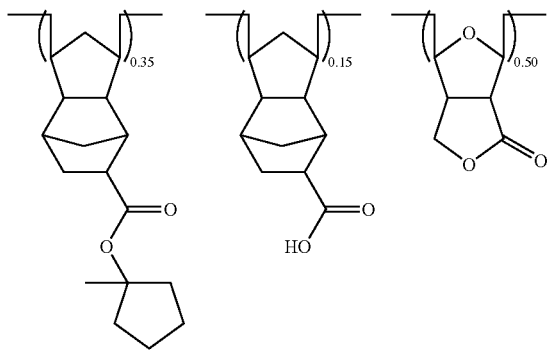

Resist Polymer B
Mw: 7,600
Mw/Mn: 1.76

PAG 1

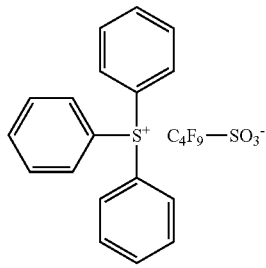

Quencher 1

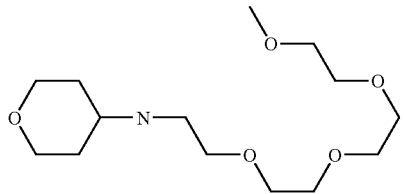

On silicon substrates having an antireflective coating ARC-29A (Nissan Chemicals Industries, Ltd.) formed to a thickness of 87 nm, the resist solutions were coated, then baked at 120° C. for 60 seconds to give resist films having a thickness of 150 nm. In a sample with a resist film of the resist solution having Polymer 7 added thereto, the protective coating solution was applied onto the prebaked resist film and baked at 100° C. for 60 seconds to form a protective coating of 50 nm thick.

Measurement Of Receding Contact Angle and Sliding Angle

An inclination contact angle meter prop Master 500 by Kyowa Interface Science Co., Ltd. was used. On the resist-coated wafers which were kept horizontal, 50 μL of deionized water was dropped to form a droplet. While the wafer was gradually inclined, the angle (sliding angle) at which the droplet started sliding down was determined as well as receding contact angle. The results are shown in Table 2.

TABLE 2

| Resist Polymer A (g) | Resist Polymer B (g) | Additive polymer | Protective coating | Sliding angle (°) | Receding contact angle (°) |
|---|---|---|---|---|---|
| 5 | 0 | Polymer 1 | — | 15 | 68 |
| 5 | 0 | Polymer 2 | — | 16 | 70 |
| 5 | 0 | Polymer 3 | — | 17 | 72 |
| 5 | 0 | Polymer 4 | — | 16 | 66 |
| 5 | 0 | Polymer 5 | — | 16 | 65 |
| 5 | 0 | Polymer 6 | — | 16 | 67 |
| 5 | 0 | Polymer 7 | — | 28 | 39 |
| 5 | 0 | Polymer 8 | — | 12 | 73 |
| 5 | 0 | Polymer 9 | — | 12 | 74 |
| 5 | 0 | Polymer 7 | Protective coating | 14 | 72 |
| 2.5 | 2.5 | Polymer 1 | — | 16 | 70 |
| 2.5 | 2.5 | Polymer 2 | — | 17 | 72 |
| 2.5 | 2.5 | Polymer 3 | — | 16 | 73 |
| 2.5 | 2.5 | Polymer 4 | — | 15 | 68 |
| 2.5 | 2.5 | Polymer 5 | — | 16 | 66 |
| 2.5 | 2.5 | Polymer 6 | — | 16 | 67 |
| 2.5 | 2.5 | Polymer 7 | — | 14 | 72 |
| 2.5 | 2.5 | Polymer 8 | — | 12 | 75 |
| 2.5 | 2.5 | Polymer 9 | — | 13 | 75 |
| 5 | 0 | Comparative Polymer 1 | — | 20 | 68 |
| 5 | 0 | None | — | 28 | 40 |
| 2.5 | 2.5 | None | — | 26 | 53 |
| — | — | — | Protective coating | 14 | 72 |

A smaller sliding angle indicates an easier flow of water on a film or coating. A larger receding contact angle indicates that fewer liquid droplets are left during high-speed scan exposure. As is evident from Table 2, resist solutions having the inventive polymers compounded therein form photoresist films which have a larger receding contact angle and a smaller sliding angle than those photoresist films without the inventive polymer. It is demonstrated that inclusion of the inventive polymer achieves a drastic improvement in the receding contact angle of photoresist film to a level equivalent to that of protective coating without adversely affecting the sliding angle. Although the resist film having Polymer 7 added thereto has a receding contact angle which is degraded by the addition of that polymer, the provision of a protective coating compensates for a loss of receding contact angle.

Measurement of Leach-Outs

Further, the wafer having the resist film formed as above was irradiated through an open frame with radiation at an energy dose of 50 mJ/cm$^2$ using an ArF scanner S305B (Nikon Corp.). Then a true circle ring of Teflon® having an inner diameter of 10 cm was placed on the resist film, 10 mL of deionized water was carefully injected inside the ring, and the resist film was kept in contact with water at room temperature for 60 seconds. Thereafter, the water was recovered, and a concentration of PAG1 anion in the water was measured by an LC-MS analyzer (Agilent). The results are shown in Table 3.

TABLE 3

| Resist Polymer A (g) | Resist Polymer B (g) | Additive polymer | Anion leach-out (ppb) |
|---|---|---|---|
| 5 | 0 | Polymer 1 | 5 |
| 5 | 0 | Polymer 2 | 3 |
| 5 | 0 | Polymer 3 | 2 |
| 5 | 0 | Polymer 4 | 7 |
| 5 | 0 | Polymer 5 | 7 |
| 5 | 0 | Polymer 6 | 5 |
| 5 | 0 | Polymer 7 | <0.1 |
| 5 | 0 | Polymer 8 | 5 |
| 5 | 0 | Polymer 9 | 5 |
| 2.5 | 2.5 | Polymer 1 | 4 |
| 2.5 | 2.5 | Polymer 2 | 3 |
| 2.5 | 2.5 | Polymer 3 | 3 |
| 2.5 | 2.5 | Polymer 4 | 6 |
| 2.5 | 2.5 | Polymer 5 | 6 |
| 2.5 | 2.5 | Polymer 6 | 4 |
| 2.5 | 2.5 | Polymer 7 | <0.1 |
| 2.5 | 2.5 | Polymer 8 | 4 |
| 2.5 | 2.5 | Polymer 9 | 4 |
| 5 | 0 | Comparative Polymer 1 | 5 |
| 5 | 0 | None | 60 |
| 2.5 | 2.5 | None | 50 |

It is seen from Table 3 that the photoresist film formed from the resist solution having the inventive polymer compounded therein is effective for preventing the PAG component from being leached from the photoresist film into water. Note that for the resist using Polymer 7, the measurement is on a sample having a protective coating on the resist film.

In another run, the wafer having the resist film formed as above was exposed by means of an ArF scanner model S307E (Nikon Corp., NA 0.85, σ 0.93, 4/5 annular illumination, 6% halftone phase shift mask), rinsed for 5 minutes by splashing deionized water, post-exposure baked (PEB) at 110° C. for 60 seconds, and developed with a 2.38 wt % TMAH aqueous solution for 60 seconds. The wafer was sectioned, and the profile and sensitivity of a 75-nm line-and-space pattern were determined. The results are shown in Table 4. Note that for the resist using Polymer 7, the measurement is on a sample having a protective coating on the resist film.

TABLE 4

| Resist Polymer A (g) | Resist Polymer B (g) | Additive polymer | Sensitivity (mJ/cm²) | 75-nm pattern profile | Water contact angle after development (°) |
|---|---|---|---|---|---|
| 5 | 0 | Polymer 1 | 30 | Rectangular | 43 |
| 5 | 0 | Polymer 2 | 30 | Rectangular | 44 |
| 5 | 0 | Polymer 3 | 30 | Rectangular | 45 |
| 5 | 0 | Polymer 4 | 30 | Rectangular | 42 |
| 5 | 0 | Polymer 5 | 30 | Rectangular | 42 |
| 5 | 0 | Polymer 6 | 30 | Rectangular | 42 |
| 5 | 0 | Polymer 7 | 30 | Rectangular | 39 |
| 5 | 0 | Polymer 8 | 30 | Rectangular | 45 |
| 5 | 0 | Polymer 9 | 30 | Rectangular | 46 |
| 2.5 | 2.5 | Polymer 1 | 30 | Rectangular | 50 |
| 2.5 | 2.5 | Polymer 2 | 30 | Rectangular | 50 |
| 2.5 | 2.5 | Polymer 3 | 30 | Rectangular | 51 |
| 2.5 | 2.5 | Polymer 4 | 30 | Rectangular | 48 |
| 2.5 | 2.5 | Polymer 5 | 30 | Rectangular | 48 |
| 2.5 | 2.5 | Polymer 6 | 30 | Rectangular | 51 |
| 2.5 | 2.5 | Polymer 7 | 30 | Rectangular | 43 |
| 2.5 | 2.5 | Polymer 8 | 30 | Rectangular | 52 |
| 2.5 | 2.5 | Polymer 9 | 30 | Rectangular | 52 |
| 5 | 0 | Comparative Polymer 1 | — | — | 63 |
| 5 | 0 | None | 31 | T-top | 75 |
| 2.5 | 2.5 | None | 38 | T-top | 80 |

In a further run, the resist solutions used in the patterning test were precision filtered through a high-density polyethylene filter with a pore size of 0.02 μm. The resist solution was applied onto an antireflective coating ARC-29A (Nissan Chemical Co., Ltd.) of 87 nm thick formed on a 8-inch silicon substrate and baked at 120° C. for 60 seconds, forming a resist film of 150 nm thick. Using an ArF scanner model S307E (Nikon Corp., NA 0.85, σ0.93, Cr mask), the entire surface of the wafer was subjected to checkered-flag exposure including alternate exposure of open-frame exposed and unexposed portions having an area of 20 mm square. This was followed by post-exposure baking (PEB) and development with a 2.38 wt % TMAH aqueous solution for 60 seconds.

Using a flaw detector Win-Win 50-1200 (Tokyo Seimitsu Co., Ltd.), the number of defects in the unexposed portion of the checkered-flag was counted at the pixel size of 0.125 μm. The results are shown in Table 5.

TABLE 5

| Resist Polymer A (g) | Resist Polymer B (g) | Additive polymer | Number of defects |
|---|---|---|---|
| 2.5 | 2.5 | Polymer 1 | 10 |
| 2.5 | 2.5 | — | >60,000 |
| 2.5 | 2.5 | Comparative Polymer 1 | −2,000 |

EB Exposure

In an EB exposure test, a positive resist material was prepared by dissolving an EB Polymer synthesized by radical polymerization, and other components, all shown below, in PGMEA and ethyl lactate (EL) according to the recipe shown in Table 6, and filtering through a filter with a pore size of 0.2 μm.

Using Clean Track Mark 5 (Tokyo Electron Ltd.), the positive resist material was spin coated on a silicon substrate with a diameter of 6 inches and prebaked on a hot plate at 110° C. for 60 seconds to form a resist film of 200 nm thick. Using HL-800D (Hitachi, Ltd.) at a HV voltage of 50 keV, imagewise exposure was performed on the resist film in a vacuum chamber. The resist film was then allowed to stand in the vacuum chamber for 20 hours, after which additional imagewise exposure was performed at a different area.

Using Clean Track Mark 5 (Tokyo Electron Ltd.), immediately after the imagewise exposure, the resist film was post-exposure baked (PEB) on a hot plate at 90° C. for 60 seconds and puddle developed in a 2.38 wt % TMAH aqueous solution for 30 seconds to form a positive pattern. The resist pattern was evaluated as follows.

Using a measurement SEM S-7280 (Hitachi, Ltd.), the line width of a 0.12 μm line-and-space pattern at the exposure dose which provided a 1:1 resolution to a 0.12 μm line-and-space pattern was measured in both the area exposed immediately before development and the area exposed 20 hours earlier. A difference therebetween is a line width change during vacuum holding. Positive values of width change indicate that the resist sensitivity varies toward a higher level during vacuum holding whereas negative values indicate that the resist sensitivity varies toward a lower level.

TABLE 6

| Base resin pbw) | PAG (pbw) | Basic compound (pbw) | Organic solvent (pbw) | Additive polymer (pbw) | Width change (nm) |
|---|---|---|---|---|---|
| EB Polymer (100) | PAG 2 (10) | Quencher 2 (0.4) | PGMEA (700) EL (300) | Polymer 1 (5) | −1 |
| EB Polymer (100) | PAG 2 (10) | Quencher 2 (0.4) | PGMEA (700) EL (300) | Polymer 2 (5) | 0 |
| EB Polymer (100) | PAG 2 (10) | Quencher 2 (0.4) | PGMEA (700) EL (300) | Polymer 3 (5) | −1 |
| EB Polymer (100) | PAG 2 (10) | Quencher 2 (0.4) | PGMEA (700) EL (300) | Polymer 4 (5) | −1 |
| EB Polymer (100) | PAG 2 (10) | Quencher 2 (0.4) | PGMEA (700) EL (300) | Polymer 5 (5) | 0 |
| EB Polymer (100) | PAG 2 (10) | Quencher 2 (0.4) | PGMEA (700) EL (300) | Polymer 6 (5) | −1 |
| EB Polymer (100) | PAG 2 (10) | Quencher 2 (0.4) | PGMEA (700) EL (300) | Polymer 7 (5) | −1 |
| EB Polymer (100) | PAG 2 (10) | Quencher 2 (0.4) | PGMEA (700) EL (300) | Polymer 8 (5) | 0 |
| EB Polymer (100) | PAG 2 (10) | Quencher 2 (0.4) | PGMEA (700) EL (300) | Polymer 9 (5) | −1 |
| EB Polymer (100) | PAG 2 (10) | Quencher 2 (0.4) | PGMEA (700) EL (300) | — | −9 |

EB Polymer
Mw: 13,600
Mw/Mn: 1.86

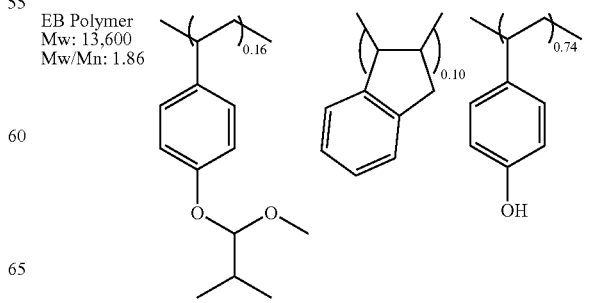

TABLE 6-continued

| Base resin (pbw) | PAG (pbw) | Basic compound (pbw) | Organic solvent (pbw) | Additive polymer (pbw) | Width change (nm) |
|---|---|---|---|---|---|

PAG 2
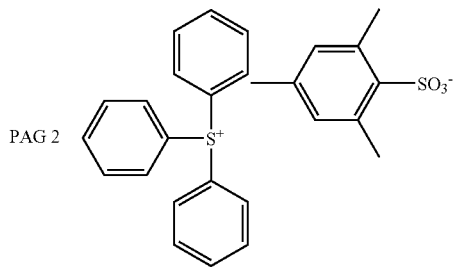

Quencher 2
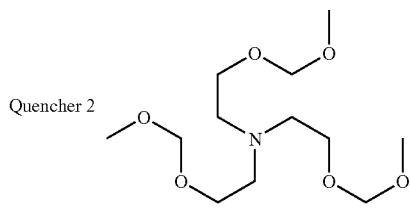

It is seen from Table 4 that when exposure was followed by pure water rinsing, the resist films without the inventive polymer became patterns of T-top profile. In contrast, the resist films having the inventive polymer compounded therein formed patterns of rectangular profile. As is evident from Table 6, when a polymer of the invention is added to an EB lithography resist, it improves the stability of a resist film during vacuum holding after exposure.

Japanese Patent Application No. 2006-272681 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A polymer comprising recurring units having the general formulae (1a), (1b), and (1c):

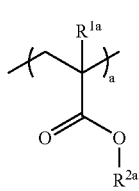 (1a)

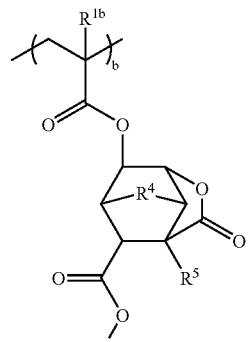 (1b)

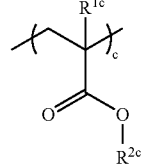 (1c)

wherein $R^{1a}$, $R^{1b}$ and $R^{1c}$ are each independently hydrogen, fluorine or a straight or branched $C_1$-$C_4$ alkyl or fluoroalkyl group, $R^{2a}$ is hydrogen, —$R^3$—$CO_2R^7$, or —$R^3$—$OR^7$, $R^{2c}$ is a straight, branched or cyclic $C_2$-$C_{20}$ fluoroalkyl group, $R^3$ is a divalent organic group which may contain fluorine, $R^4$ is a methylene group or oxygen atom, $R^5$ is hydrogen, methyl or trifluoromethyl, $R^6$ is a straight, branched or cyclic $C_2$-$C_{20}$ fluoroalkyl group, $R^7$ is hydrogen, a straight, branched or cyclic $C_1$-$C_{20}$ alkyl or fluoroalkyl group, acid labile group or adhesive group, the subscripts "a," "b" and "c" are numbers satisfying $0 \leq a < 1$, $0 < b < 1$, $0 \leq c < 1$, and $0 < a+b+c \leq 1$, said polymer having a weight average molecular weight of 1,000 to 500,000.

2. The polymer of claim 1 comprising recurring units having the general formulae (1a), (1b), and (1c):

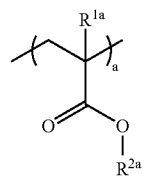 (1a)

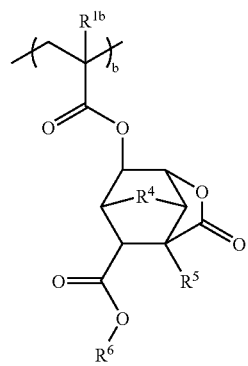 (1b)

-continued

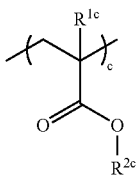

(1c)

wherein $R^{1a}$, $R^{1b}$ and $R^{1c}$ are each independently hydrogen, fluorine or a straight or branched $C_1$-$C_4$ alkyl or fluoroalkyl group, $R^{2a}$ is hydrogen, —$R^3$—$CO_2H$, or —$R^3$—OH, $R^{2c}$ is a straight, branched or cyclic $C_2$-$C_{20}$ fluoroalkyl group, $R^3$ is a divalent organic group which may contain fluorine, $R^4$ is a methylene group or oxygen atom, $R^5$ is hydrogen, methyl or trifluoromethyl, $R^6$ is a straight, branched or cyclic $C_2$-$C_{20}$ fluoroalkyl group, the subscripts "a," "b" and "c" are numbers satisfying $0 \leq a < 1$, $0 < b < 1$, $0 \leq c < 1$, and $0 < a+b+c \leq 1$, said polymer having a weight average molecular weight of 1,000 to 500,000.

3. A resist composition comprising the polymer of claim 1.
4. The resist composition of claim 3, comprising
  (A) a polymer which becomes soluble in an alkaline developer under the action of an acid,
  (B) a compound which generates an acid upon exposure to high-energy radiation, and
  (C) an organic solvent,
  said resist composition being of chemically amplified positive type.

5. The resist composition of claim 4, further comprising (D) a basic compound.
6. The resist composition of claim 4, further comprising (E) a dissolution inhibitor.
7. A pattern forming process comprising the steps of:
  (1) applying the resist composition of claim 3 onto a substrate to form a coating,
  (2) heat treating the coating and exposing it to high-energy radiation through a photomask, and
  (3) developing the exposed coating with a developer.
8. A pattern forming process comprising the steps of:
  (1) applying the resist composition of claim 3 onto a substrate to form a photoresist film,
  (2) forming a protective coating on the photoresist film,
  (3) heat treating the coated substrate, and exposing it to high-energy radiation through a photomask while keeping water between a projection lens and the coated substrate, and
  (4) stripping the protective coating and developing the resist film simultaneously using a developer.
9. The process of claim 7, wherein an exposure light source emits high-energy radiation having a wavelength of 180 to 250 nm.
10. A pattern forming process comprising the steps of:
  (1) applying the resist composition of claim 3 onto a mask blank substrate to form a coating,
  (2) heat treating the coating and irradiating it in vacuum with an electron beam, and
  (3) developing the coating with a developer.

* * * * *